United States Patent
Khosravan et al.

(10) Patent No.: US 11,842,464 B2
(45) Date of Patent: Dec. 12, 2023

(54) AUTOMATED EXCHANGE AND USE OF ATTRIBUTE INFORMATION BETWEEN BUILDING IMAGES OF MULTIPLE TYPES

(71) Applicant: MFTB Holdco, Inc., Seattle, WA (US)

(72) Inventors: Naji Khosravan, Seattle, WA (US);
Sing Bing Kang, Redmond, WA (US);
Ivaylo Boyadzhiev, Seattle, WA (US)

(73) Assignee: MFTB Holdco, Inc., Seattle, WA (US)

( * ) Notice: Subject to any disclaimer, the term of this patent is extended or adjusted under 35 U.S.C. 154(b) by 337 days.

(21) Appl. No.: 17/482,325

(22) Filed: Sep. 22, 2021

(65) Prior Publication Data

US 2023/0095173 A1 Mar. 30, 2023

(51) Int. Cl.
*G06T 5/00* (2006.01)
*G06F 30/13* (2020.01)
(Continued)

(52) U.S. Cl.
CPC .............. *G06T 5/003* (2013.01); *G06F 30/13* (2020.01); *G06T 5/009* (2013.01); *G06T 5/50* (2013.01);
(Continued)

(58) Field of Classification Search
CPC ........... G06T 5/003; G06T 5/009; G06T 5/50; G06T 2207/20172; G06T 7/55; G06F 30/13; H04N 23/698
See application file for complete search history.

(56) References Cited

U.S. PATENT DOCUMENTS

| 5,140,352 A | 8/1992 | Moore et al. |
| 6,031,540 A | 2/2000 | Golin et al. |

(Continued)

FOREIGN PATENT DOCUMENTS

| EP | 2413097 A2 | 2/2012 |
| EP | 2505961 A2 | 10/2012 |

(Continued)

OTHER PUBLICATIONS

CubiCasa | From video to floor plan in under 5 minutes, retrieved on Mar. 26, 2019, from https://www.cubi.casa/, 6 pages.

(Continued)

*Primary Examiner* — Ping Y Hsieh
(74) *Attorney, Agent, or Firm* — VLP Law Group LLP; James A. D. White

(57) ABSTRACT

Techniques are described for using computing devices to perform automated operations to generate mapping information of a defined area via analysis of visual data of images, including by using attribute information exchanged between paired or otherwise grouped images of multiple types to generate enhanced images, and for using the generated mapping information in further automated manners, including to use the generated mapping information for automated navigation and/or to display or otherwise present the generated mapping information. In some situations, the defined area includes an interior of a multi-room building, and the generated information includes at least one or more enhanced images and/or a partial floor plan and/or other modeled representation of the building, with the generating performed in some cases without having measured depth information about distances from the images' acquisition locations to walls or other objects in the surrounding building.

35 Claims, 17 Drawing Sheets
(2 of 17 Drawing Sheet(s) Filed in Color)

(51) Int. Cl.
*H04N 23/698* (2023.01)
*G06T 5/50* (2006.01)

(52) U.S. Cl.
CPC . *H04N 23/698* (2023.01); *G06T 2207/20172* (2013.01)

(56) References Cited

U.S. PATENT DOCUMENTS

| | | | |
|---|---|---|---|
| 6,141,034 A | 10/2000 | McCutchen |
| 6,317,166 B1 | 11/2001 | McCutchen |
| 6,320,584 B1 | 11/2001 | Golin et al. |
| 6,323,858 B1 | 11/2001 | Gilbert et al. |
| 6,337,683 B1 | 1/2002 | Gilbert et al. |
| 6,654,019 B2 | 11/2003 | Gilbert et al. |
| 6,683,608 B2 | 1/2004 | Golin et al. |
| 6,690,374 B2 | 2/2004 | Park et al. |
| 6,731,305 B1 | 5/2004 | Park et al. |
| 6,738,073 B2 | 5/2004 | Park et al. |
| 7,050,085 B1 | 5/2006 | Park et al. |
| 7,129,971 B2 | 10/2006 | McCutchen |
| 7,196,722 B2 | 3/2007 | White et al. |
| 7,525,567 B2 | 4/2009 | McCutchen |
| 7,620,909 B2 | 11/2009 | Park et al. |
| 7,627,235 B2 | 12/2009 | McCutchen et al. |
| 7,782,319 B2 | 8/2010 | Ghosh et al. |
| 7,791,638 B2 | 9/2010 | McCutchen |
| 7,909,241 B2 | 3/2011 | Stone et al. |
| 7,973,838 B2 | 7/2011 | McCutchen |
| 8,072,455 B2 | 12/2011 | Temesvari et al. |
| 8,094,182 B2 | 1/2012 | Park et al. |
| RE43,786 E | 11/2012 | Cooper |
| 8,463,020 B1 | 6/2013 | Schuckmann et al. |
| 8,517,256 B2 | 8/2013 | Stone et al. |
| 8,520,060 B2 | 8/2013 | Zomet et al. |
| 8,523,066 B2 | 9/2013 | Stone et al. |
| 8,523,067 B2 | 9/2013 | Stone et al. |
| 8,528,816 B2 | 9/2013 | Stone et al. |
| 8,540,153 B2 | 9/2013 | Stone et al. |
| 8,594,428 B2 | 11/2013 | Aharoni et al. |
| 8,654,180 B2 | 2/2014 | Zomet et al. |
| 8,666,815 B1 | 3/2014 | Chau |
| 8,699,005 B2 | 4/2014 | Likholyot |
| 8,705,892 B2 | 4/2014 | Aguilera et al. |
| RE44,924 E | 6/2014 | Cooper et al. |
| 8,854,684 B2 | 10/2014 | Zomet |
| 8,861,840 B2 | 10/2014 | Bell et al. |
| 8,861,841 B2 | 10/2014 | Bell et al. |
| 8,879,828 B2 | 11/2014 | Bell et al. |
| 8,953,871 B2 | 2/2015 | Zomet |
| 8,989,440 B2 | 3/2015 | Klusza et al. |
| 8,996,336 B2 | 3/2015 | Malka et al. |
| 9,021,947 B2 | 5/2015 | Landa |
| 9,026,947 B2 | 5/2015 | Lee et al. |
| 9,035,968 B2 | 5/2015 | Zomet |
| 9,041,796 B2 | 5/2015 | Malka et al. |
| 9,071,714 B2 | 6/2015 | Zomet |
| 9,129,438 B2 | 9/2015 | Aarts et al. |
| 9,151,608 B2 | 10/2015 | Malka et al. |
| 9,165,410 B1 | 10/2015 | Bell et al. |
| 9,171,405 B1 | 10/2015 | Bell et al. |
| 9,324,190 B2 | 4/2016 | Bell et al. |
| 9,361,717 B2 | 6/2016 | Zomet |
| 9,396,586 B2 | 7/2016 | Bell et al. |
| 9,438,759 B2 | 9/2016 | Zomet |
| 9,438,775 B2 | 9/2016 | Powers et al. |
| 9,489,775 B1 | 11/2016 | Bell et al. |
| 9,495,783 B1 | 11/2016 | Samarasekera et al. |
| 9,576,401 B2 | 2/2017 | Zomet |
| 9,619,933 B2 | 4/2017 | Spinella-Marno et al. |
| 9,635,252 B2 | 4/2017 | Accardo et al. |
| 9,641,702 B2 | 5/2017 | Bin-Nun et al. |
| 9,760,994 B1 | 9/2017 | Bell et al. |
| 9,786,097 B2 | 10/2017 | Bell et al. |
| 9,787,904 B2 | 10/2017 | Birkler et al. |
| 9,836,885 B1 | 12/2017 | Eraker et al. |
| 9,852,351 B2 | 12/2017 | Aguilera Perez et al. |
| 9,953,111 B2 | 4/2018 | Bell et al. |
| 9,953,430 B1 | 4/2018 | Zakhor |
| 9,990,760 B2 | 6/2018 | Aguilera Perez et al. |
| 9,990,767 B1 | 6/2018 | Sheffield et al. |
| 10,026,224 B2 | 7/2018 | Bell et al. |
| 10,030,979 B2 | 7/2018 | Bjorke et al. |
| 10,055,876 B2 | 8/2018 | Ford et al. |
| 10,068,344 B2 | 9/2018 | Jovanovic et al. |
| 10,083,522 B2 * | 9/2018 | Jovanovic ............ G06V 10/245 |
| 10,102,639 B2 | 10/2018 | Bell et al. |
| 10,102,673 B2 | 10/2018 | Eraker et al. |
| 10,120,397 B1 | 11/2018 | Zakhor et al. |
| 10,122,997 B1 | 11/2018 | Sheffield et al. |
| 10,127,718 B2 | 11/2018 | Zakhor et al. |
| 10,127,722 B2 | 11/2018 | Shakib et al. |
| 10,139,985 B2 | 11/2018 | Mildrew et al. |
| 10,163,261 B2 | 12/2018 | Bell et al. |
| 10,163,271 B1 | 12/2018 | Powers et al. |
| 10,181,215 B2 * | 1/2019 | Sedeffow ............ G06T 3/0062 |
| 10,192,115 B1 | 1/2019 | Sheffield et al. |
| 10,204,185 B2 | 2/2019 | Mrowca et al. |
| 10,210,285 B2 | 2/2019 | Wong et al. |
| 10,235,797 B1 | 3/2019 | Sheffield et al. |
| 10,242,400 B1 | 3/2019 | Eraker et al. |
| 10,339,716 B1 | 7/2019 | Powers et al. |
| 10,366,531 B2 | 7/2019 | Sheffield |
| 10,375,306 B2 | 8/2019 | Shan et al. |
| 10,395,435 B2 * | 8/2019 | Powers ............ G06Q 30/0643 |
| 10,530,997 B2 | 1/2020 | Shan et al. |
| 10,643,386 B2 | 5/2020 | Li et al. |
| 10,708,507 B1 | 7/2020 | Dawson et al. |
| 10,809,066 B2 | 10/2020 | Colburn et al. |
| 10,825,247 B1 | 11/2020 | Vincent et al. |
| 10,834,317 B2 | 11/2020 | Shan et al. |
| 11,057,561 B2 | 7/2021 | Shan et al. |
| 11,164,361 B2 | 11/2021 | Moulon et al. |
| 11,164,368 B2 | 11/2021 | Vincent et al. |
| 11,165,959 B2 | 11/2021 | Shan et al. |
| 11,217,019 B2 | 1/2022 | Li et al. |
| 11,238,652 B2 | 2/2022 | Impas et al. |
| 11,243,656 B2 | 2/2022 | Li et al. |
| 11,252,329 B1 | 2/2022 | Cier et al. |
| 11,284,006 B2 | 3/2022 | Dawson et al. |
| 11,405,549 B2 | 8/2022 | Cier et al. |
| 11,405,558 B2 | 8/2022 | Dawson et al. |
| 11,408,738 B2 | 8/2022 | Colburn et al. |
| 11,480,433 B2 | 10/2022 | Colburn et al. |
| 11,481,925 B1 | 10/2022 | Li et al. |
| 11,494,973 B2 | 11/2022 | Boyadzhiev et al. |
| 11,501,492 B1 | 11/2022 | Li et al. |
| 11,514,674 B2 | 11/2022 | Moulon et al. |
| 11,592,969 B2 | 2/2023 | Li et al. |
| 11,790,648 B2 * | 10/2023 | Stoeva .................... G06N 3/08 |
| | | | 382/154 |
| 2006/0256109 A1 * | 11/2006 | Acker .................... G06T 15/20 |
| | | | 345/419 |
| 2010/0232709 A1 | 9/2010 | Zhang et al. |
| 2012/0075414 A1 | 3/2012 | Park et al. |
| 2012/0293613 A1 | 11/2012 | Powers et al. |
| 2013/0004060 A1 * | 1/2013 | Bell .................... H04N 13/257 |
| | | | 382/154 |
| 2013/0050407 A1 | 2/2013 | Brinda et al. |
| 2013/0342533 A1 | 12/2013 | Bell et al. |
| 2014/0043436 A1 | 2/2014 | Bell et al. |
| 2014/0044343 A1 | 2/2014 | Bell et al. |
| 2014/0044344 A1 | 2/2014 | Bell et al. |
| 2014/0125658 A1 | 5/2014 | Bell et al. |
| 2014/0125767 A1 | 5/2014 | Bell et al. |
| 2014/0125768 A1 | 5/2014 | Bell et al. |
| 2014/0125769 A1 | 5/2014 | Bell et al. |
| 2014/0125770 A1 | 5/2014 | Bell et al. |
| 2014/0236482 A1 | 8/2014 | Dorum et al. |
| 2014/0267631 A1 | 9/2014 | Powers et al. |
| 2014/0307100 A1 | 10/2014 | Myllykoski et al. |
| 2014/0320674 A1 | 10/2014 | Kuang |
| 2015/0116691 A1 | 4/2015 | Likholyot |
| 2015/0189165 A1 | 7/2015 | Milosevski et al. |
| 2015/0262421 A1 | 9/2015 | Bell et al. |

(56) References Cited

U.S. PATENT DOCUMENTS

| | | |
|---|---|---|
| 2015/0269785 A1 | 9/2015 | Bell et al. |
| 2015/0302636 A1 | 10/2015 | Arnoldus et al. |
| 2015/0310596 A1 | 10/2015 | Sheridan et al. |
| 2015/0332464 A1 | 11/2015 | O'Keefe et al. |
| 2016/0055268 A1 | 2/2016 | Bell et al. |
| 2016/0134860 A1 | 5/2016 | Jovanovic et al. |
| 2016/0140676 A1 | 5/2016 | Fritze et al. |
| 2016/0217225 A1 | 7/2016 | Bell et al. |
| 2016/0260250 A1 | 9/2016 | Jovanovic et al. |
| 2016/0286119 A1 | 9/2016 | Rondinelli |
| 2016/0300385 A1 | 10/2016 | Bell et al. |
| 2017/0034430 A1 | 2/2017 | Fu et al. |
| 2017/0067739 A1 | 3/2017 | Siercks et al. |
| 2017/0194768 A1 | 7/2017 | Powers et al. |
| 2017/0195654 A1 | 7/2017 | Powers et al. |
| 2017/0263050 A1 | 9/2017 | Ha et al. |
| 2017/0324941 A1 | 11/2017 | Birkler |
| 2017/0330273 A1 | 11/2017 | Holt et al. |
| 2017/0337737 A1 | 11/2017 | Edwards et al. |
| 2018/0007340 A1 | 1/2018 | Stachowski |
| 2018/0025536 A1 | 1/2018 | Bell et al. |
| 2018/0075168 A1 | 3/2018 | Tiwari et al. |
| 2018/0139431 A1 | 5/2018 | Simek et al. |
| 2018/0143023 A1 | 5/2018 | Bjorke et al. |
| 2018/0143756 A1 | 5/2018 | Mildrew et al. |
| 2018/0144487 A1 | 5/2018 | Bell et al. |
| 2018/0144535 A1 | 5/2018 | Ford et al. |
| 2018/0144547 A1 | 5/2018 | Shakib et al. |
| 2018/0144555 A1 | 5/2018 | Ford et al. |
| 2018/0146121 A1 | 5/2018 | Hensler et al. |
| 2018/0146193 A1 | 5/2018 | Safreed et al. |
| 2018/0146212 A1 | 5/2018 | Hensler et al. |
| 2018/0165871 A1 | 6/2018 | Mrowca |
| 2018/0203955 A1 | 7/2018 | Bell et al. |
| 2018/0241985 A1 | 8/2018 | O'Keefe et al. |
| 2018/0293793 A1 | 10/2018 | Bell et al. |
| 2018/0300936 A1 | 10/2018 | Ford et al. |
| 2018/0306588 A1 | 10/2018 | Bjorke et al. |
| 2018/0348854 A1 | 12/2018 | Powers et al. |
| 2018/0365496 A1 | 12/2018 | Hovden et al. |
| 2019/0012833 A1 | 1/2019 | Eraker et al. |
| 2019/0026956 A1 | 1/2019 | Gausebeck et al. |
| 2019/0026957 A1 | 1/2019 | Gausebeck |
| 2019/0026958 A1 | 1/2019 | Gausebeck et al. |
| 2019/0035165 A1 | 1/2019 | Gausebeck |
| 2019/0041972 A1 | 2/2019 | Bae |
| 2019/0050137 A1 | 2/2019 | Mildrew et al. |
| 2019/0051050 A1 | 2/2019 | Bell et al. |
| 2019/0051054 A1 | 2/2019 | Jovanovic et al. |
| 2019/0087067 A1 | 3/2019 | Hovden et al. |
| 2019/0122422 A1 | 4/2019 | Sheffield et al. |
| 2019/0164335 A1 | 5/2019 | Sheffield et al. |
| 2019/0180104 A1 | 6/2019 | Sheffield et al. |
| 2019/0251645 A1 | 8/2019 | Winans |
| 2019/0287164 A1 | 9/2019 | Eraker et al. |
| 2020/0336675 A1 | 10/2020 | Dawson et al. |
| 2020/0389602 A1 | 12/2020 | Dawson et al. |
| 2020/0408532 A1 | 12/2020 | Colburn et al. |
| 2021/0044760 A1 | 2/2021 | Dawson et al. |
| 2021/0063578 A1 | 3/2021 | Wekel et al. |
| 2021/0377442 A1 | 12/2021 | Boyadzhiev et al. |
| 2021/0385378 A1 | 12/2021 | Cier et al. |
| 2022/0003555 A1 | 1/2022 | Colburn et al. |
| 2022/0028156 A1 | 1/2022 | Boyadzhiev et al. |
| 2022/0028159 A1 | 1/2022 | Vincent et al. |
| 2022/0076019 A1 | 3/2022 | Moulon et al. |
| 2022/0092227 A1 | 3/2022 | Yin et al. |
| 2022/0114291 A1 | 4/2022 | Li et al. |
| 2022/0164493 A1 | 5/2022 | Li et al. |
| 2022/0189122 A1 | 6/2022 | Li et al. |
| 2022/0269885 A1* | 8/2022 | Wixson .................. G06N 3/08 |

FOREIGN PATENT DOCUMENTS

| | | |
|---|---|---|
| EP | 2506170 A2 | 10/2012 |
| KR | 101770648 B1 | 8/2017 |
| KR | 101930796 B1 | 12/2018 |
| WO | 2005091894 A2 | 10/2005 |
| WO | 2016154306 A1 | 9/2016 |
| WO | 2018204279 A1 | 11/2018 |
| WO | 2019083832 A1 | 5/2019 |
| WO | 2019104049 A1 | 5/2019 |
| WO | 2019118599 A2 | 6/2019 |

OTHER PUBLICATIONS

CubiCasa FAQ & Manual, retrieved on Mar. 26, 2019, from https://www.cubi.casa/faq/, 5 pages.

Cupix Home, retrieved on Mar. 26, 2019, from https://www.cupix.com/, 1 page.

Cupix—FAQ, retrieved on Mar. 26, 2019, from https://www.cupix.com/faq.html, 3 pages.

IGuide: 3D Virtual Tours, retrieved on Mar. 26, 2019, from https://goiguide.com/, 6 pages.

immoviewer.com | Automated Video Creation & Simple Affordable 3D 360 Tours, retrieved on Mar. 26, 2019, from https://www.immoviewer.com/, 5 pages.

MagicPlan | #1 Floor Plan App, Construction & Surveying Samples, retrieved on Mar. 26, 2019, from https://www.magicplan.app/, 9 pages.

EyeSpy360 Virtual Tours | Virtual Tour with any 360 camera, retrieved on Mar. 27, 2019, from https://www.eyespy360.com/en-us/, 15 pages.

Indoor Reality, retrieved on Mar. 27, 2019, from https://www.indoorreality.com/, 9 pages.

InsideMaps, retrieved on Mar. 27, 2019, from https://www.insidemaps.com/, 7 pages.

IStaging | Augmented & Virtual Reality Platform For Business, retrieved on Mar. 27, 2019, from https://www.istaging.com/en/, 7 pages.

Metareal, retrieved on Mar. 27, 2019, from https://www.metareal.com/, 4 pages.

PLNAR—The Ar 3D Measuring / Modeling Platform, retrieved on Mar. 27, 2019, from https://www.plnar.co, 6 pages.

YouVR Global, retrieved on Mar. 27, 2019, from https://global.youvr.io/, 9 pages.

GeoCV, retrieved on Mar. 28, 2019, from https://geocv.com/, 4 pages.

Biersdorfer, J.D., "How To Make A 3-D Model Of Your Home Renovation Vision," in The New York Times, Feb. 13, 2019, retrieved Mar. 28, 2019, 6 pages.

Chen et al. "Rise of the indoor crowd: Reconstruction of building interior view via mobile crowdsourcing." In: Proceedings of the 13th ACM Conference on Embedded Networked Sensor Systems. Nov. 4, 2015, 13 pages.

Immersive 3D for the Real World, retrieved from https://matterport.com/, on Mar. 27, 2017, 5 pages.

Learn About Our Complete 3D System, retrieved from https://matterport.com/how-it-works/, on Mar. 27, 2017, 6 pages.

Surefield FAQ, retrieved from https://surefield.com/faq, on Mar. 27, 2017, 1 page.

Why Surefield, retrieved from https://surefield.com/why-surefield, on Mar. 27, 2017, 7 pages.

Schneider, V., "Create immersive photo experiences with Google Photo Sphere," retrieved from http://geojournalism.org/2015/02/create-immersive-photo-experiences-with-google-photo-sphere/, on Mar. 27, 2017, 7 pages.

Tango (platform), Wikipedia, retrieved from https://en.wikipedia.org/wiki/Tango_(platform), on Jun. 12, 2018, 5 pages.

Zou et al. "LayoutNet: Reconstructing the 3D Room Layout from a Single RGB Image" in arXiv:1803.08999, submitted Mar. 23, 2018, 9 pages.

Lee et al. "RoomNet: End-to-End Room Layout Estimation" in arXiv:1703.00241v2, submitted Aug. 7, 2017, 10 pages.

(56) References Cited

OTHER PUBLICATIONS

Time-of-flight camera, Wikipedia, retrieved from https://en.wikipedia.org/wiki/Time-of-flight_camera, on Aug. 30, 2018, 8 pages.
Magicplan—Android Apps on Go . . . , retrieved from https://play.google.com/store/apps/details?id=com.sensopia.magicplan, on Feb. 21, 2018, 5 pages.
Pintore et al., "AtlantaNet: Inferring the 3D Indoor Layout from a Single 360 Image beyond the Manhattan World Assumption", ECCV 2020, 16 pages.
Cowles, Jeremy, "Differentiable Rendering", Aug. 19, 2018, accessed Dec. 7, 2020 at https://towardsdatascience.com/differentiable-rendering-d00a4b0f14be, 3 pages.
Yang et al., "DuLa-Net: A Dual-Projection Network for Estimating Room Layouts from a Single RGB Panorama", in arXiv:1811.11977[cs.v2], submitted Apr. 2, 2019, 14 pages.
Sun et al., "HoHoNet: 360 Indoor Holistic Understanding with Latent Horizontal Features", in arXiv:2011.11498[cs.v2], submitted Nov. 24, 2020, 15 pages.
Nguyen-Phuoc et al., "RenderNet: A deep convolutional network for differentiable rendering from 3D shapes", in arXiv:1806.06575[cs.v3], submitted Apr. 1, 2019, 17 pages.
Convolutional neural network, Wikipedia, retrieved from https://en.wikipedia.org/wiki/Convolutional_neural_network, on Dec. 7, 2020, 25 pages.
Hamilton et al., "Inductive Representation Learning on Large Graphs", in 31st Conference on Neural Information Processing Systems (NIPS 2017), 2017, 19 pages.
Kipf et al., "Variational Graph Auto-Encoders", in arXiv:1611.07308v1 [stat.ML], submitted Nov. 21, 2016, 3 pages.
Cao et al., "MolGAN: An Implicit Generative Model For Small Molecular Graphs", in arXiv:1805.11973v1 [stat.ML], submitted May 30, 2018, 11 pages.
Chen et al., "Intelligent Home 3D: Automatic 3D-House Design from Linguistic Descriptions Only", in arXiv:2003.00397v1 [cs.CV], submitted Mar. 1, 2020, 14 pages.
Cucurull et al., "Context-Aware Visual Compatibility Prediction", in arXiv: 1902.03646v2 [cs.CV], submitted Feb. 12, 2019, 10 pages.
Fan et al., "Labeled Graph Generative Adversarial Networks", in arXiv:1906.03220v1 [cs.LG], submitted Jun. 7, 2019, 14 pages.
Gong et al., "Exploiting Edge Features in Graph Neural Networks", in arXiv:1809.02709v2 [cs.LG], submitted Jan. 28, 2019, 10 pages.
Genghis Goodman, "A Machine Learning Approach to Artificial Floorplan Generation", University of Kentucky Theses and Dissertations—Computer Science, 2019, accessible at https://uknowledge.uky.edu/cs_etds/89, 40 pages.
Grover et al., "node2vec: Scalable Feature Learning for Networks", in arXiv:1607.00653v1 [cs.SI], submitted Jul. 3, 2016, 10 pages.
Nauata et al., "House-GAN: Relational Generative Adversarial Networks for Graph-constrained House Layout Generation", in arXiv:2003.06988v1 [cs.CV], submitted Mar. 16, 2020, 17 pages.
Kang et al., "A Review of Techniques for 3D Reconstruction of Indoor Environments", in ISPRS International Journal Of Geo-Information 2020, May 19, 2020, 31 pages.
Kipf et al., "Semi-Supervised Classification With Graph Convolutional Networks", in arXiv:1609.02907v4 [cs.LG], submitted Feb. 22, 2017, 14 pages.
Li et al., "Graph Matching Networks for Learning the Similarity of Graph Structured Objects", in Proceedings of the 36th International Conference on Machine Learning (PMLR 97), 2019, 18 pages.
Liu et al., "Hyperbolic Graph Neural Networks", in 33rd Conference on Neural Information Processing Systems (NeurIPS 2019), 2019, 12 pages.
Merrell et al., "Computer-Generated Residential Building Layouts", in ACM Transactions on Graphics, Dec. 2010, 13 pages.
I-Chan Lo et al., "Photometric Consistency For Dual Fisheye Cameras", 2020 IEEE International Conference on Image Processing (ICIP), Oct. 25-28, 2020, 5 pages.
Takashi Machida et al., "Deep Photo Relighting by Integrating Both 2D and 3D Lighting Information", 2020 25th International Conference on Pattern Recognition (ICPR), Jan. 10-15, 2021, 7 pages.
Rahul Rajendran, "A pixel-based color transfer system to recolor nighttime imagery", Defense + Commercial Sensing May 13, 2019, 10 pages.
Vinicuis F. Arruda et al., "Cross-Domain Car Detection Using Unsupervised Image-to-Image Translation: From Day to Night", Jul. 19, 2019, available at arXiv:1907.08719, 8 pages.
Camera Jabber, "How a 360 degree camera works", Jul. 3, 2018, available at https://camerajabber.com/how-a-360-camera-works/, 17 pages.
Patil et al., "LayoutGMN: Neural Graph Matching for Structural Layout Similarity", in Proceedings of the IEEE/CVF Conference on Computer Vision and Pattern Recognition (CVPR 2021), Jun. 2021, 10 pages (pp. 11048-11057).
Pintore et al., "State-of-the-art in Automatic 3D Reconstruction of Structured Indoor Environments", in Computer Graphics Forum / Eurographics 2020 vol. 39 No. 2, 2020, 33 pages.
Schlichtkrull et al., "Modeling Relational Data with Graph Convolutional Networks", in arXiv:1703.06103v4 [stat.ML], submitted Oct. 26, 2017, 9 pages.
Simonovsky et al., "GraphVAE: Towards Generation of Small Graphs Using Variational Autoencoders", in arXiv:1802.03480v1 [cs.LG], submitted Feb. 9, 2018, 10 pages.
Velickovic et al., "Graph Attention Networks", in arXiv:1710.10903v3 [stat.ML], submitted Feb. 4, 2018, 12 pages.
Wang et al., "GraphGAN: Graph Representation Learning with Generative Adversarial Nets", in arXiv:1711.08267v1 [cs.LG], submitted Nov. 22, 2017, 8 pages.
Xu et al., "How Powerful Are Graph Neural Networks?", in arXiv:1810.00826v3 [cs.LG], submitted Feb. 22, 2019, 17 pages.
Zeng et al., "Deep Floor Plan Recognition Using a Multi-Task Network with Room-Boundary-Guided Attention", in arXiv:1908.11025v1 [cs.CV], submitted Aug. 29, 2019, 9 pages.
Zhang et al., "Link Prediction Based on Graph Neural Networks", in 32nd Conference on Neural Information Processing Systems (NIPS 2018), 2018, 17 pages.
Park et al., "Symmetric Graph Convolutional Autoencoder for Unsupervised Graph Representation Learning", in Proceedings of the 2019 IEEE/CVF International Conference on Computer Vision (ICCV 2019), 2019, 10 pages.
Euclidian Distance, Wikipedia, retrieved from https://en.wikipedia.org/wiki/Euclidian_distance on Apr. 7, 2020, 3 pages.
Graph Edit Distance, Wikipedia, retrieved from https://en.wikipedia.org/wiki/Graph_edit_distance on Apr. 7, 2020, 3 pages.

* cited by examiner

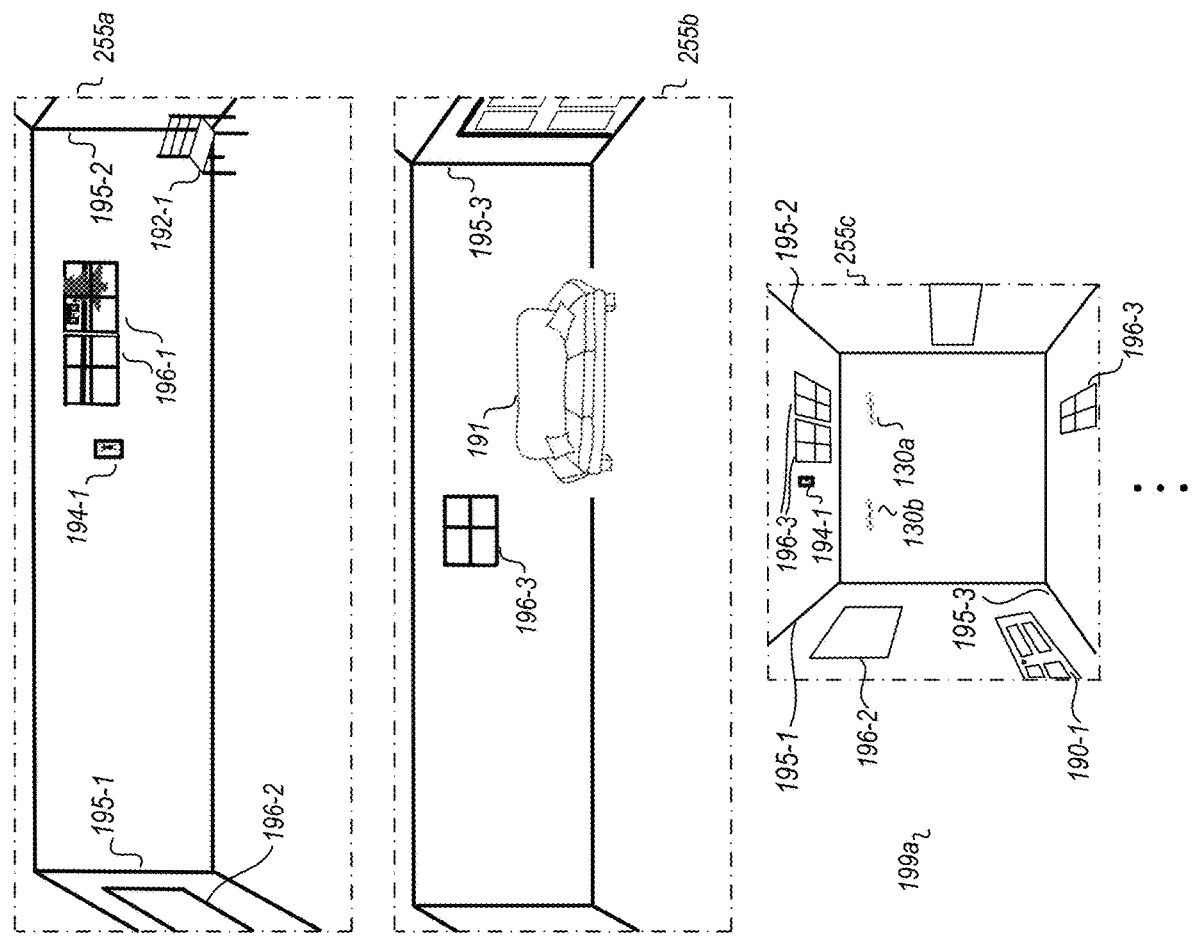

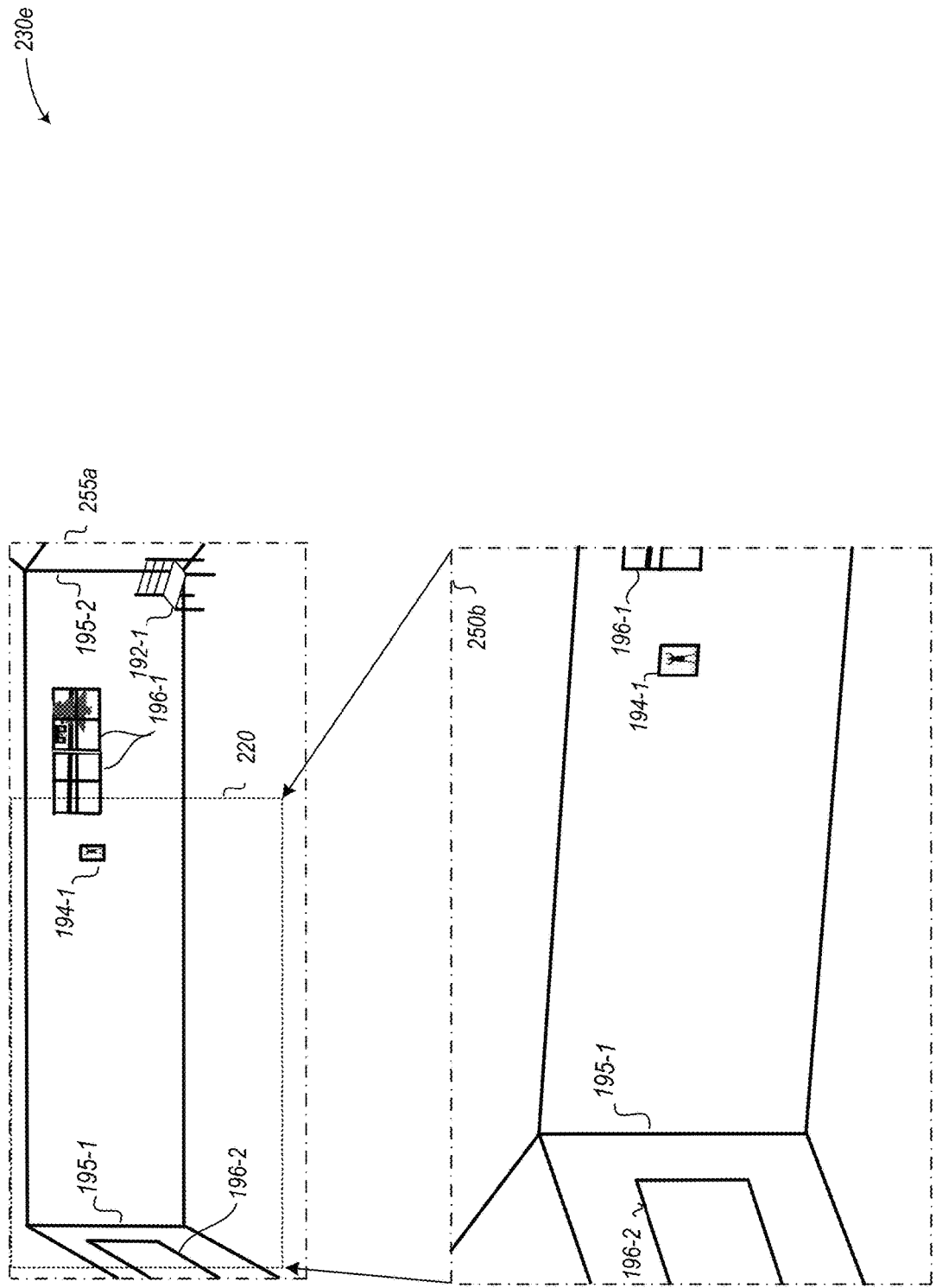

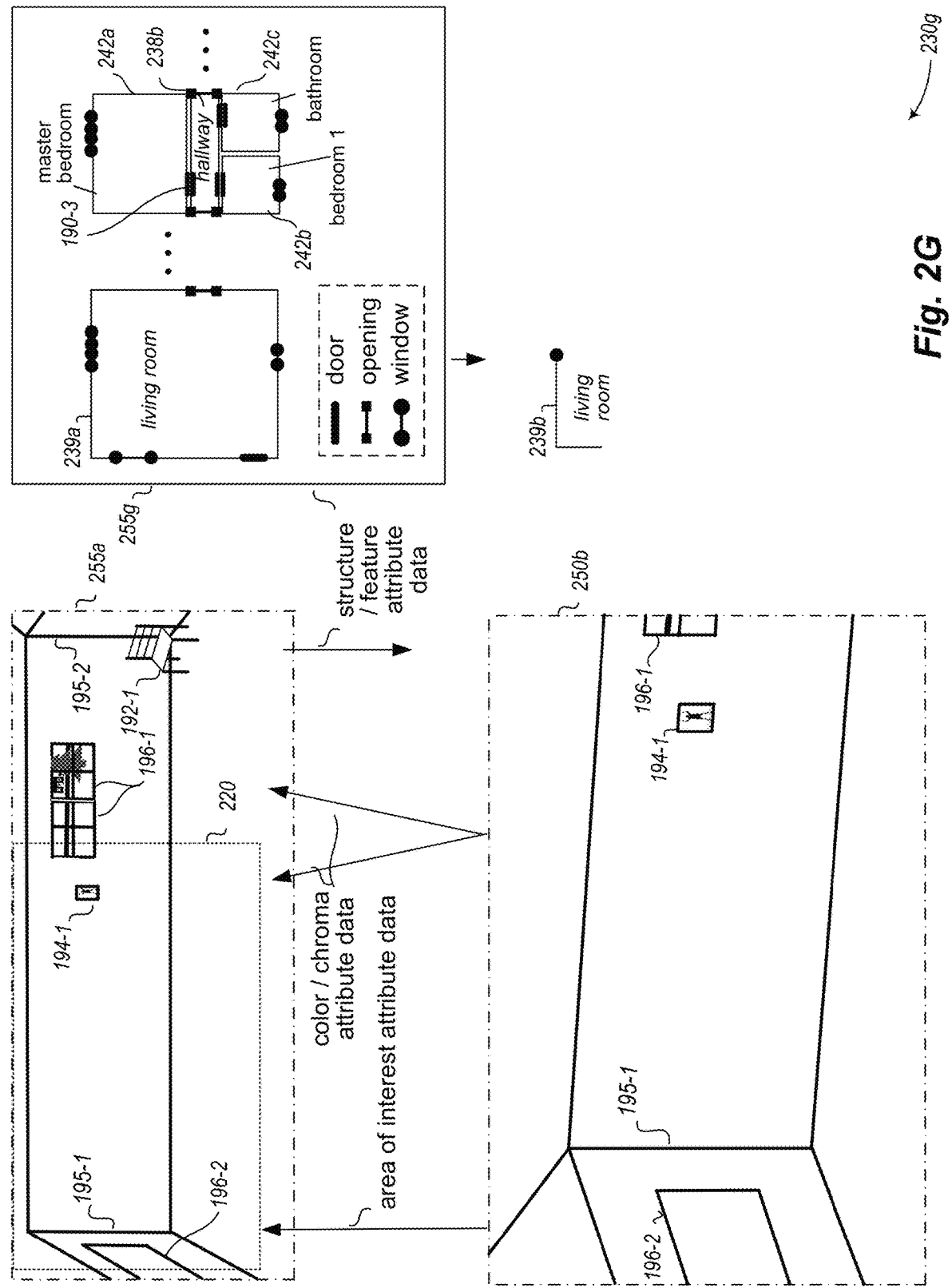

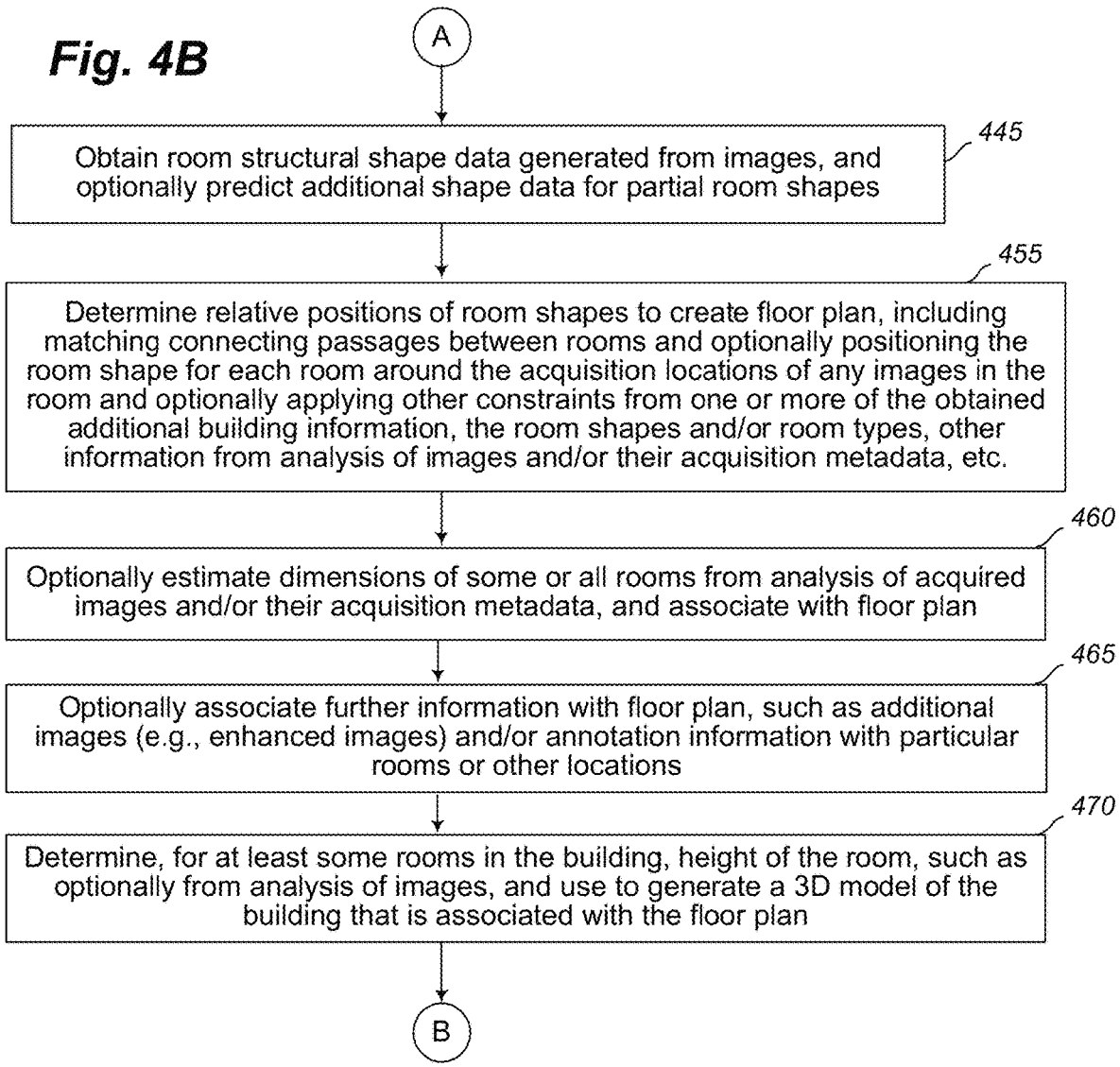

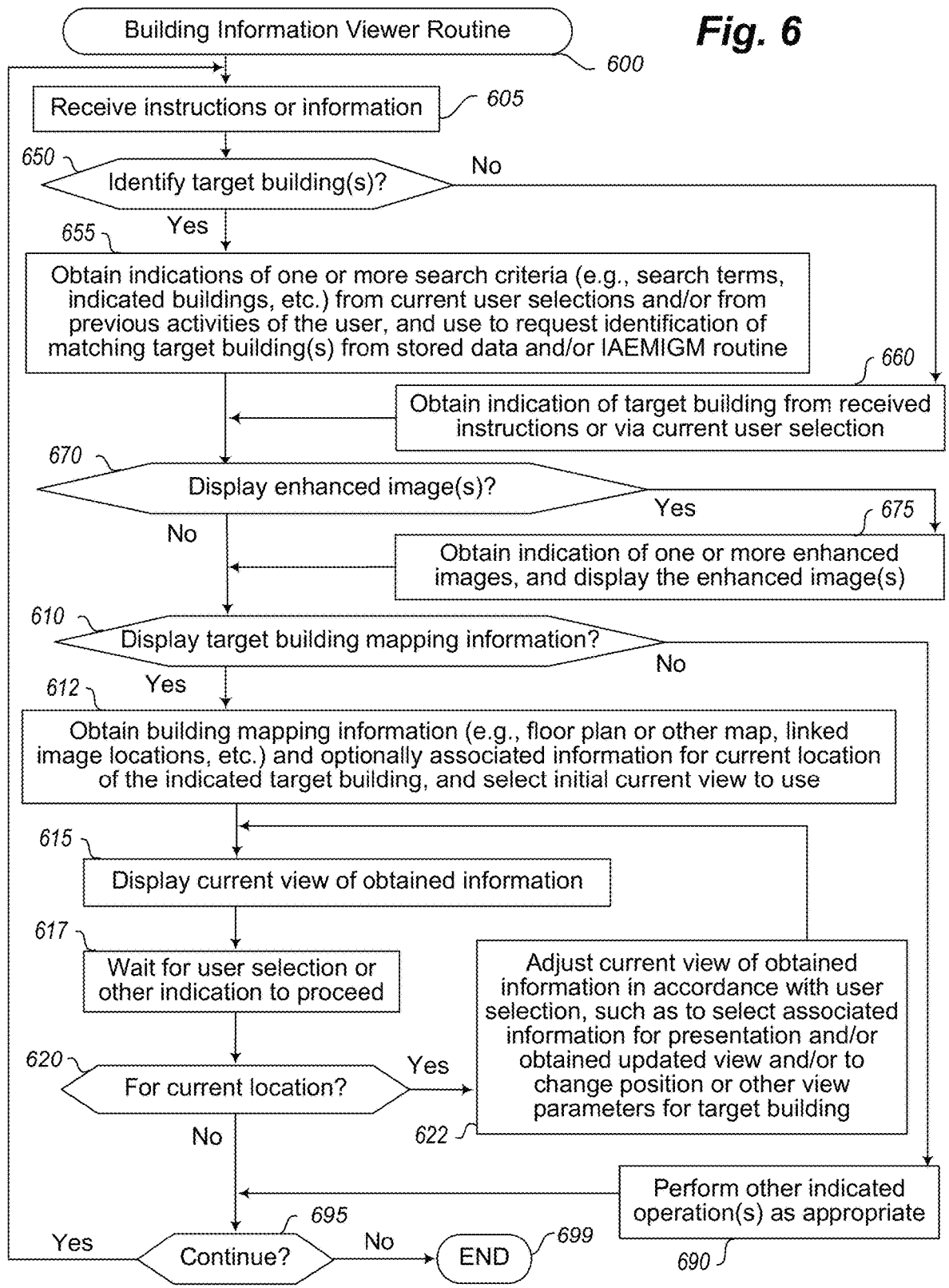

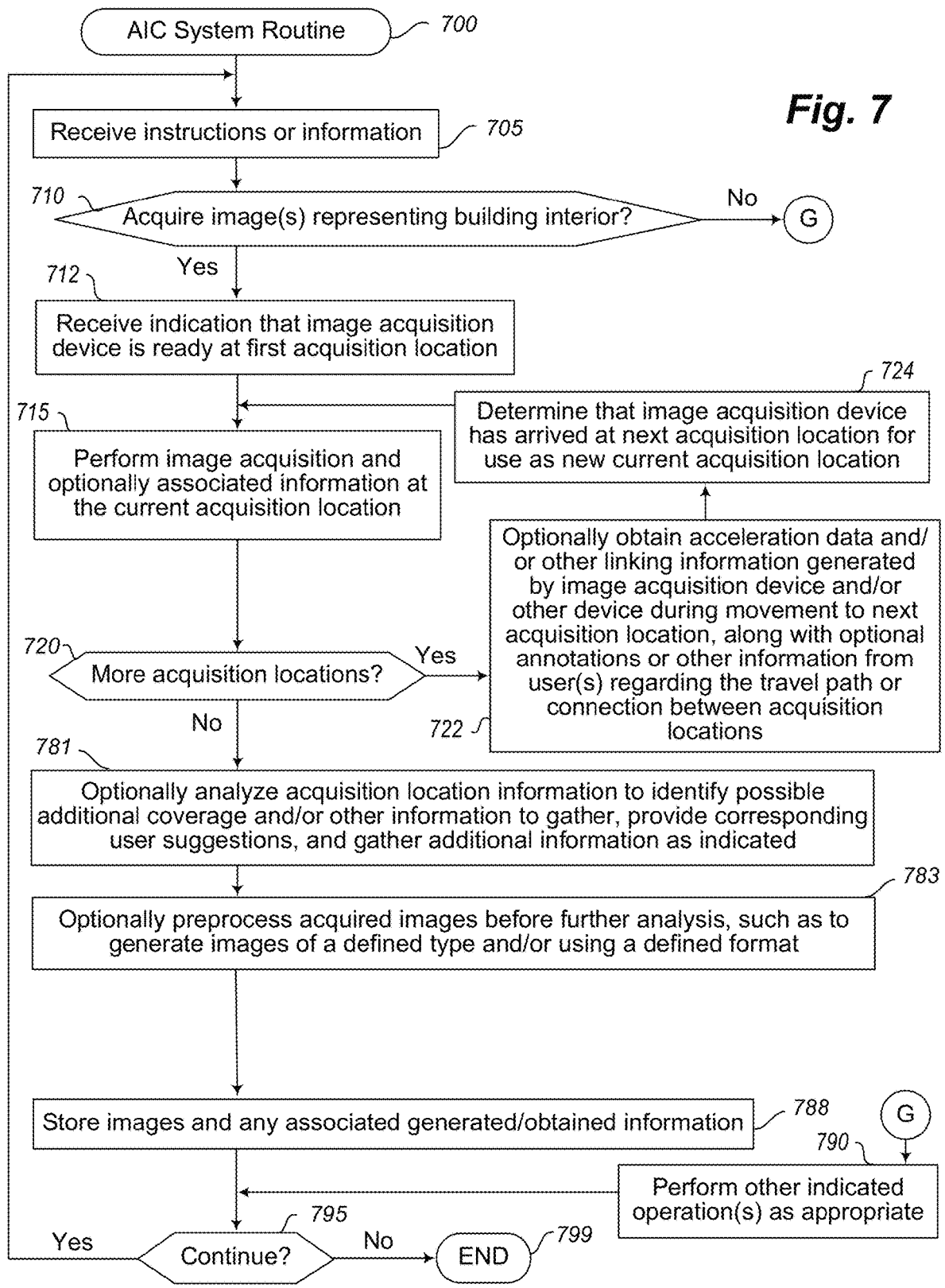

US 11,842,464 B2

AUTOMATED EXCHANGE AND USE OF ATTRIBUTE INFORMATION BETWEEN BUILDING IMAGES OF MULTIPLE TYPES

TECHNICAL FIELD

The following disclosure relates generally to techniques for automatically generating mapping information for a defined area via analysis of visual data of images of the area, such as by using attribute information exchanged between images of multiple types, and for subsequently using the generated mapping information in one or more manners, such as to automatically generate and use a floor plan and/or other modeled representation of a building using images from the building's interior.

BACKGROUND

In various fields and circumstances, such as architectural analysis, property inspection, real estate acquisition and development, remodeling and improvement services, general contracting and other circumstances, it may be desirable to view information about the interior of a house, office, or other building without having to physically travel to and enter the building, including to determine actual as-built information about the building rather than design information from before the building is constructed. However, it can be difficult to effectively capture, represent and use such building interior information, including to display visual information captured within building interiors to users at remote locations (e.g., to enable a user to fully understand the layout and other details of the interior, including to control the display in a user-selected manner). In addition, while a floor plan of a building may provide some information about layout and other details of a building interior, such use of floor plans has some drawbacks in certain situations, including that floor plans can be difficult to construct and maintain, to accurately scale and populate with information about room interiors, to visualize and otherwise use, etc.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 2A-2J illustrate examples of acquiring images of multiple types at acquisition locations for a building, of automated operations to analyze visual data of the images to determine images between which to exchange attribute information to generate enhanced images, and of subsequently generating and using the enhanced images in one or more automated manners.

FIGS. 4A-4B illustrate an example embodiment of a flow diagram for an Image Attribute Exchange and Mapping Information Generation Manager (IAEMIGM) system routine in accordance with an embodiment of the present disclosure.

FIG. 6 illustrates an example embodiment of a flow diagram for a Building Information Viewer system routine in accordance with an embodiment of the present disclosure.

FIG. 7 illustrates an example embodiment of a flow diagram for an Automated Image Capture (AIC) system routine in accordance with an embodiment of the present disclosure.

DETAILED DESCRIPTION

Figure 1A:
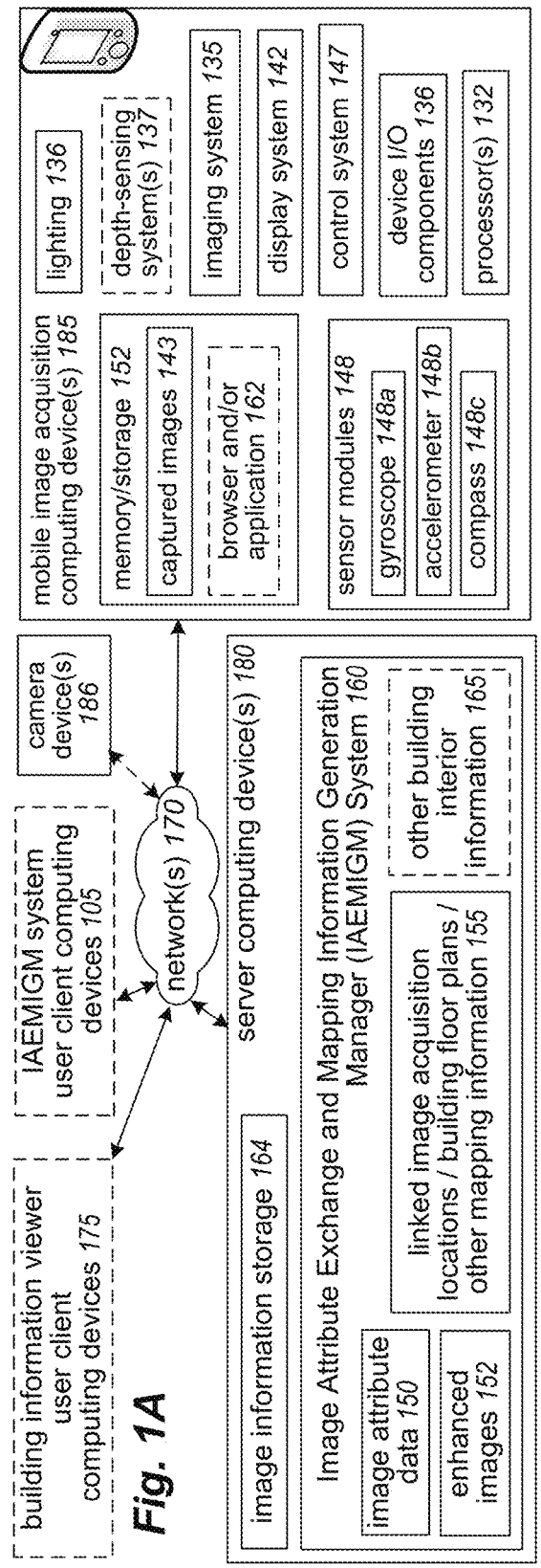
FIGS. 1A-1B are diagrams depicting an exemplary building interior environment and computing system(s) for use in embodiments of the present disclosure, including to automatically analyze visual data of images of multiple types acquired at acquisition locations in a building to determine images between which to exchange attribute information to generate enhanced images, and to further present or otherwise use the enhanced images as part of mapping information for the building.

The present disclosure describes techniques for using computing devices to perform automated operations related to generating mapping information for a defined area using images of the area, including by using attribute information exchanged between images of multiple types, and for subsequently using the generated mapping information in one or more further automated manners. In at least some embodiments, the defined area includes an interior of a multi-room building (e.g., a house, office, etc.), and the generated information includes at least a partial floor plan of the building and/or other modeled representation of the building interior, such as from an automated analysis of multiple images of multiple types acquired at various acquisition locations within the building and optionally other data acquired related to the building—in at least some such embodiments, the generating is further performed without having or using measured depth information about distances from the images' acquisition locations to walls or other objects in the surrounding building. The generated floor plan and/or other generated mapping-related information may be further used in various manners in various embodiments, including for controlling navigation of mobile devices (e.g., autonomous vehicles), for display on one or more client devices in corresponding GUIs (graphical user interfaces) using one or more types of visualizations, etc. Additional details are included below regarding the automated generation, visualization and use of such mapping information, and some or all of the techniques described herein may, in at least some embodiments, be performed via automated operations of an Image Attribute Exchange and Mapping Information Generation Manager ("IAEMIGM") system, as discussed further below.

In at least some embodiments and situations, the multiple types of images acquired at acquisition locations associated with a building may include perspective photo images (e.g., photos in a perspective format and with a limited angle-of-view, such as acquired without use of a wide-angle lens and having an angle-of-view of less than or equal to 60° or 90°, or acquired using a wide-angle lens and having an angle-of-view of less than or equal to 135°) and panorama images (e.g., images with a wider angle-of-view, such as greater than or equal to 180° or 360°, such as by using one or more fisheye lenses and/or other lens and optionally including rotation around a vertical axis or other axis, and optionally in an equirectangular format or other non-perspective format), and such images of different types may have different associated benefits in different situations. As one non-exclusive example, perspective photos acquired for a building may have preferable information of one or more types relative to other panorama images acquired for the building, such as to have better chroma (or 'color') characteristics (e.g., due to better lenses and/or lighting, due to being captured by professional photographers, etc.), to have higher resolution, to include more details of particular areas of interest, to reflect areas of a building of particular interest and/or utility, etc. As another non-exclusive example, panorama images acquired for a building may have preferable information of one or more other types relative to other perspective photos acquired for the building, such as to have more extensive visual coverage of a surrounding room or other surrounding area (e.g., to show all walls and some or all of the floor and/or ceiling of a surrounding room if the panorama image has 360° of visual coverage around a vertical axis), and consequently to have better associated structural information that is determined from analysis of the visual data of the panorama image (e.g., structural shapes or other structural element details, such as for walls, floor, ceiling, windows, doors and other wall openings, etc., including positions of such structural information relative to each other and/or to an acquisition location at which the panorama image is acquired).

In some embodiments and situations, the multiple types of images acquired at acquisition locations associated with a building may include other types of images, whether in addition to or instead of having both perspective photos and panorama images, with non-exclusive examples of additional types of images including one or more of the following: daytime and nighttime images (e.g., images of multiple such types for one or more particular areas associated with the building, such as to capture a visual representation of the same subject matter during both daytime and nighttime), and with the images being perspective photos and/or panorama images; images having multiple other types of illumination, such as natural lighting and artificial lighting, and/or natural lighting at different times-of-day and/or times-of-year (e.g., images of multiple such types for one or more particular areas associated with the building, such as to capture a visual representation of the same subject matter during two or more such types of illumination), and with the images being perspective photos and/or panorama images; images acquired at different times (e.g., images of multiple such types for one or more particular areas associated with the building, such as to capture a visual representation of the same subject matter at each of multiple different times), such as before and after an event or occurrence (e.g., a remodel, a renovation, an accident or other destructive occurrence, construction, etc.), and with the images being perspective photos and/or panorama images; different types of images that respectively include non-visual data (e.g., information not visible to a human, such as for infrared light, ultraviolet light, radio waves and other radiation, audio, etc.) or visual data (e.g., images of multiple such types for one or more particular areas associated with the building, such as to capture a representation of the same subject matter using both visual data and one or more types of non-visual data), and with the images being perspective photos and/or panorama images; etc.

As noted above, the described techniques may include exchanging attribute information of one or more types between images of multiple types. For example, given a pair of associated images of multiple types (e.g., a perspective photo and a panorama image having overlapping visual coverage), non-exclusive examples of an exchange of attribute information between images of the pair may include one or more of the following: generating an enhanced image (e.g., an enhanced panorama image) by modifying the panorama image of the pair to use data for one or more types of attributes from the perspective photo of the pair, such as one or more of chroma data without luminance data, chroma data and luminance data, luminance data without chroma data, light balance data, saturation data, sharpness data, style data, etc.; generating an enhanced image (e.g., an enhanced perspective photo) by modifying the perspective photo of the pair to use or associate data for one or more types of attributes from the panorama image of the pair, such as one or more types of structural shapes or other structural elements, optionally with associated relative position information to each other (e.g., to enable the enhanced image to have associated structural information for structural elements that are not visible in the original perspective photo); etc. In addition, other types of attribute data may be exchanged between two or more images of two or more other types in an analogous manner, whether instead of or in addition to the example attribute types noted above, such as to generate one or more enhanced images that include a combination of visual data from the two or more images and/or that use a combination of attribute data for the two or more images, with non-exclusive examples including combining information from daytime and nighttime images (e.g., to illustrate changes between the different times or to otherwise provide a comparison of the different lighting for the same area) and/or combining information from images with other types of differing illumination (e.g., to illustrate changes between the different illuminations or to otherwise provide a comparison of the different illumination for the same area) and/or combining information from images captured at different times (e.g., to illustrate changes between the different times or to otherwise provide a comparison between the different times) and/or combining information from images having captured visual and non-visual data or otherwise having different types of data (e.g., to illustrate changes between the different types of data or to otherwise provide a comparison between the different types of data), etc.

In addition, data associated with one or more images of a first type may further be used to generate one or more enhanced images of a second type in additional manners in some embodiments, with non-exclusive examples including one or more of the following: for a pair of a perspective photo and panorama image, using visual data of the image in the pair with higher resolution and one or more corresponding trained machine learning models to generate an enhanced image for the other image in the pair that has higher apparent resolution for some or all of the visual data of the enhanced image; for a pair of a perspective photo and panorama image, combining visual data of the perspective photo and panorama image to generate a new enhanced 'fused' image that has visual data from both images and/or has additional visual data relative to either of the perspective photo and panorama image; for a pair of images of different types, using a noise profile for one of the images to augment one or more portions of a generated enhanced image based on the other image; for a pair of images of different types, generating an enhanced image based on one of the images by associating information from the other image with one or more parts of the enhanced image (e.g., as a point of interest in the enhanced image, such as at a position in the enhanced image at which the other image was acquired, and optionally being user-selectable when the enhanced image is displayed to a user, such as to cause the other image to be displayed or to otherwise provide additional details to the user related to the other image when selected by the user); as part of generating a partial or complete floor plan or other modeled representation of at least some of a building based at least in part on a pair of images of different types, associating one or more positions within the floor plan or other modeled representation with one or both of the images of the pair (e.g., as one or more points of interest for the floor plan or other modeled representation, such as at one or more positions in the floor plan or other modeled representation at which one or both images were acquired, and optionally being user-selectable when the floor plan or other modeled representation is displayed to a user, such as to cause the respective image(s) to be displayed or to otherwise provide additional details to the user related to the image(s) when selected by the user); updating, with respect to a group of images of multiple types acquired at multiple acquisition locations for a building that are used to generate one or more initial enhanced images, the group of images at a later time to include one or more additional images (e.g., at one or more additional acquisition locations, of one or more additional types, etc.), and using the additional images to generate one or more additional enhanced images (e.g., based on one or more new pairs of images that each includes one preexisting image and one additional image having overlapping visual coverage; based on one or more new pairs of images that each includes two additional images having overlapping visual coverage, etc.) and optionally updating other mapping information for the building based on the additional images; analyzing multiple images of a first type (e.g., images with smaller amounts of visual coverage, such as perspective photos) to train one or more machine learning models to identify visual characteristics included in those perspective photos (e.g., to identify characteristics of areas of a building for which having additional detail is of interest for further automated processing and/or to a viewer, such as a kitchen or bathroom of a house, and optionally to enable valuation determinations corresponding to the current house or related to a remodel based on those additional details; to identify characteristics of areas of a building that otherwise provide useful information for further automated processing and/or to a viewer, such as to provide information related to traffic flow areas between rooms or to otherwise provide structural or layout information for the building; to identify characteristics of areas of a building that are visually pleasing to a viewer, such as to provide one or more introductory or overview images for a building; etc.), and using the trained machine learning models to generate one or more enhanced images from images of a second type (e.g., images with larger amounts of visual coverage, such as panorama images) by selecting a subset of each of one or more images of the second type to be the one or more enhanced images and to correspond to parts of the images of the second types having the identified visual characteristics; etc. In addition, in at least some embodiments and situations, rather than having a pair of two images with overlapping visual coverage, the described techniques may be expanded to having a group of three or more images with overlapping visual coverage (e.g., a panorama image and two or more perspective photos, such as with visual data corresponding to different subsets of the panorama image; one or more perspective photos and two or more panorama images, such as with the visual data of the two or more panorama images overlapping with each other, and each perspective photo having overlap with at least part of at least one of the panorama images; etc.), with corresponding attribute information exchanged between images of the group in a manner analogous to that discussed with respect to a pair of images (e.g., to combine the chroma attribute data of two or more perspective photos in the group, such as via weighted or non-weighted averaging, and using the combined chroma attribute data as part of an enhanced panorama image for a panorama image in the group).

In addition, in at least some embodiments and situations, the described techniques include matching images of two or more types to be associated together in particular manners. For example, with respect to a pair of associated images that includes a perspective photo and a panorama image, the matching of those images may be based at least in part on identifying overlapping visual coverage between those two images. As one example embodiment, if one or more panorama images are available for a building, each such panorama image that is in a non-perspective and/or non-planar format (e.g., equirectangular, spherical, etc.) may first be analyzed to generate multiple sub-images that each includes a distinct subset of the visual data of that panorama image and is in a perspective and/or planar format (e.g., to generate six sub-images for a 360° panorama image to correspond to X, Y and Z axes). For each such panorama sub-image (and optionally for each panorama that is already in a perspective format), further automated processing may be performed to generate one or more first global features that describe visual data of that sub-image (or perspective-format panorama image) as a whole, and to generate multiple first local features that describe individual portions of the visual data of that sub-image (or perspective-format panorama image). Various techniques to generate such global and local features may be used, with one example technique discussed in "An End-to-End Local-Global-Fusion Feature Extraction Network for Remote Sensing Image Scene Classification" by Yafei Lv et al., Remote Sens. 2019, 11(24):3006, which is incorporated herein by reference. The automated processing may similarly include, if one or more perspective photos are available for the building, generating one or more second global features that describe visual data of each such perspective photo as a whole, and generating multiple second local features that describe individual portions of the visual data of each such perspective photo. For each such perspective photo, a group of one or more candidate panorama images may then be determined by comparing the one or more second global features of the perspective photo to the first global features generated for the panorama images and their sub-images, such as to rank the candidate panorama images according to a degree of match to those panorama images and/or their sub-images, and to optionally select a subset of the candidate panorama images that satisfy a defined threshold (e.g., top 1 or 5 or 10, above a defined level of matching, etc.). If multiple candidate panorama images are selected, the automated processing may further compare the multiple second local features of the perspective photo to the multiple first local features of the candidate panorama images (and their sub-images), and select one or more of the candidate panorama images with the highest degree of match between first and second local features. That perspective photo and those selected one or more panorama images may then be matched in a pair or other group for further analysis, including with respect to exchange of attribute data between images of the pair or other group. In addition, multiple perspective photos matched in different pairs to the same panorama image may further be joined into a larger group in at least some embodiments and situations. Furthermore, while the two or more images of a pair or other group may be selected based at least in part on having overlapping visual coverage in at least some embodiments and situations, two or more such images to be paired or otherwise grouped may be selected in other manners in other embodiments, such as based on proximity (e.g., having acquisition locations in the same room or other area) and/or acquisition time (e.g., being captured during the same session and/or at a similar time-of-day) and/or one or more other indicated criteria.

Additional details are included below related to exchanging attribute data between two or more paired or otherwise grouped images of multiple types, and of using corresponding enhanced images in various manners, including with respect to automated operations of embodiments of the IAEMIGM system, and with some such details discussed with respect to the examples in FIGS. 2A-2J and their associated descriptions.

In addition, in some embodiments, supplemental visual data for the building may be further captured and used, such as one or more videos, although in other embodiments no such supplemental visual data may be used. Furthermore, supplemental acquisition metadata regarding the capture of images may be obtained and used in various manners in some embodiments, such as data acquired from IMU (inertial measurement unit) sensors or other sensors of a mobile device as images are acquired at acquisition locations and/or as the mobile device is carried by a user or otherwise moved between acquisition locations, although in other embodiments no such acquisition metadata may be used. As one non-exclusive example, supplemental location-related data may be obtained and use as part of the described techniques, such as for determining images' acquisition locations and/or capture orientations (e.g., image pose) and using such information as part of matching pairs of images—such location-related data may, for example, be based on sensors that directly provide location data (e.g., a GPS sensor) and/or based on combining information of multiple types, such as by combining acquired visual data and IMU data, including by using visual-inertial odometry techniques in a manner similar to that of ARKit and/or ARCore, and/or using one or more of simultaneous localization and mapping (SLAM), visual SLAM (V-SLAM), visual-inertial SLAM (VI-SLAM), Structure from Motion (SfM), etc.). As another non-exclusive example, supplemental depth-related data may be obtained and used as part of the described techniques, such as to assist in determining images' poses and using such information as part of matching pairs of images —such depth-related data may, for example, be based on one or more types of sensors and/or acquired data, such as using one or more of lidar, time-of-flight, passive stereo, active stereo, structured lighting, etc. Various other types of supplemental information may also be gathered and used in some embodiments, and additional details are included below related to the acquisition and usage of images and optionally other related information for a building, with some or all of the related activities being, in at least some embodiments, performed via automated operations of an Automated Image Capture ("AIC") system, as discussed further below.

As noted above, various types of mapping information for a building may be generated in various embodiments based at least in part on visual data of multiple images acquired for the building, including multiple images of multiple types. For example, after multiple images and optionally other supplemental information are acquired for a building interior (and optionally an exterior of the building), the generation of mapping information for the building (e.g., at least a partial floor plan, linked groups of images at determined relative positions, enhanced images, etc.) may include automatically determining relative positions of some or all of the images' acquisition locations to each other in a common local coordinate system or other common local frame of reference, and optionally attempting to predict or otherwise determine relative global positions of all the acquisition locations to each other in a common global coordinate system or other common global frame of reference. Once such relative positions are determined, directions and relative distances between some or all pairs of acquisition locations may be determined. With respect to such relative distances, the determination may, for example, include identifying that first and second acquisition locations are twice as far from each other as third and fourth acquisition locations, but without knowing the actual distances between those acquisition locations. Similarly, with respect to such relative directions, the determination may, for example, include identifying that a first acquisition location is to the right of a second acquisition location in a 60° direction (e.g., using the orientation of an estimated pose, or both acquisition location and capture orientation, of an image acquired at the second acquisition location as a starting direction) and that a third acquisition location is to the left of the second acquisition location in a 45° direction, but without knowing the actual geographical positions of any of those acquisition locations. The determination of the relative positions of some or all of the images' acquisition locations may be performed in various manners in various embodiments, including to analyze visual data from the images in order to inter-connect some pairs of images and/or the corresponding pairs of those images' acquisition location (e.g., by identifying common matching features in two different images to use in determining their relative positions to each other, such as based in part on estimated pose information to identify the locations and orientations from which those images are captured), and to optionally use other supplemental information if available (e.g., from metadata about acquisition of the images; from other visual data; from other information about the building, such as an overview image of the building or other information about the building such as shape and/or dimensions; etc.).

In addition, the generation of at least a partial floor plan for the building, if performed in a particular embodiment, may further include automatically determining, for each room in the building and using one or more images whose visual data includes some of an interior of that room, partial or complete structural shapes that are visible in those images for that rooms, such as to correspond to structural elements such as one or more walls, floors, ceilings, inter-room passages (e.g., doorways and other inter-wall openings), windows, fireplaces, islands, countertops, etc., and optionally to correspond to at least some non-structural elements (e.g., appliances, furniture, etc.). The generation may further determine relative spacing between multiple structural shapes for a room, such as based at least in part on determined relative positions of the acquisition locations of those images and estimated relative distances and directions of those structural shapes from those acquisition locations— in some cases, the determination of the relative spacing may be further performed between structural shapes of multiple rooms, such as based at least in part on the positions of any connecting passages between the rooms and/or using one or more images each having visual data that includes parts of multiple rooms. Such connecting inter-room passages may include one or more of doorways, windows, stairways, non-room hallways, etc., and the automated analysis of the images' visual data may identify such features based at least in part on identifying the outlines of the passages, identifying different content within the passages than outside them (e.g., different colors, shading, light intensities, heights, etc.), etc. The generation of at least a partial floor plan for the building may also in some embodiments include applying constraints of one or more types, including based on connecting passages between rooms (e.g., to co-locate or otherwise match connecting passage information in two or more rooms that the passage connects), and optionally constraints of other types (e.g., locations of the building exterior where rooms should not be located, shapes of adjacent rooms, overall dimensions of the building and/or of particular rooms in the building, an exterior shape of some or all of the building, etc.). In some embodiments and in situations with a building having multiple stories or otherwise having multiple levels, the connecting passage information may further be used to associate corresponding portions on different sub-floor plans of different floors or levels. It will be appreciated that if sufficient images are captured to, in the aggregate, have visual data of all indoor structural surfaces of a building, the generated floor plan may be a complete floor plan—in other situations, a predicted complete floor plan may be generated by predicting missing parts from one or more partial floor plans. In addition, in at least some embodiments, the automated analysis of the images may further identify some or all such information and/or additional information (e.g., an estimated room type) by using machine learning (e.g., via a corresponding trained machine learning model), such as to estimate a room type by identifying features or characteristics corresponding to different room types, and to associate corresponding semantic labels with such rooms—in other embodiments, at least some such information may be obtained in other manners, such as to receive corresponding information from one or more users (e.g., based on user annotations of one or more images in the room and/or other descriptions of particular rooms or other locations, such as to identify borders between walls, ceiling and floor; based on other user input, such as adjustments to automatically determined information; etc.). In some embodiments, the automated analysis of the images' visual data may further identify additional information in one or more images, such as dimensions of objects (e.g., objects of known size) and/or of some or all of the rooms, as well as estimated actual distances of images' acquisition locations from walls or other features in their rooms. For example, estimated size information for one or more rooms may be associated with a floor plan and/or enhanced image, stored and optionally displayed—if height information is estimated for one or more rooms, a 3D (three-dimensional) model of some or all of the 2D (two-dimensional) floor plan may be created, associated with the floor plan, stored and optionally displayed, and if the size information is generated for all rooms within a sufficient degree of accuracy, a more detailed floor plan of the building may further be generated, such as with sufficient detail to allow blueprints or other architectural plans to be generated. The various determined or otherwise obtained information may further be associated with enhanced images, floor plans and/or other generated building mapping information, and such enhanced images, floor plans and/or other generated building mapping information (optionally including the associated information) may be displayed or otherwise presented or otherwise provided to users and optionally other recipients in various manners in various embodiments. Additional details are included below regarding determining mapping information for a building, and regarding presenting or otherwise using such determined mapping information.

The described techniques provide various benefits in various embodiments, including to allow enhanced images and/or floor plans and/or other modeled representations of multi-room buildings and other structures to be automatically generated from images acquired in the buildings or other structures, including in at least some such embodiments without having or using measured depth information from depth sensors or other distance-measuring devices about distances from images' acquisition locations to walls or other objects in a surrounding building or other structure, and for such enhanced images and/or floor plans and/or other modeled representations to be presented and/or otherwise used—such described techniques may further provide more complete and accurate room shape information and in greater varieties of environmental conditions (e.g., in situations in which objects in a room occlude a single image's view of at least some of the walls and/or floor and/or ceiling but in which the combination of the views from multiple images eliminates or reduces that problem, etc.). Non-exclusive examples of additional such benefits of the described techniques include the following: the ability to analyze the visual data of a target image to detect objects of interest in the enclosing room (e.g., structural wall elements, such as windows, doorways and other wall openings, etc.) and to determine locations of those detected objects in a determined room shape for the enclosing room; the ability to analyze additional captured data (e.g., movement data from one or more IMU sensors, visual data from one or more image sensors, etc.) to determine a travel path of an image acquisition device in multiple rooms, to identify wall openings (e.g., doorways, staircases, etc.) based at least in part on that additional data (and optionally on visual data of one or more target images acquired in the one or more rooms), and to optionally further use such information about identified wall openings to position together determined 3D room shapes of the multiple rooms; the ability to inter-connect multiple target images and/or their acquisition locations and to display at least one of the target images with one or more visual indicators in one or more directions of one or more other images at one or more other linked acquisition locations (e.g., user-selectable visual indicators that when selected cause the display of a respective other one of the images and/or associated information for that other image); etc. Furthermore, such automated techniques allow such a floor plan and/or other modeled representation to be generated much more quickly than previously existing techniques, and in at least some embodiments with greater accuracy, based at least in part on using information acquired from the actual building environment (rather than from plans on how the building should theoretically be constructed), as well as enabling the capture of changes to structural elements that occur after a building is initially constructed (e.g., remodels and other renovations). Such described techniques further provide benefits in allowing improved automated navigation of a building by mobile devices (e.g., semi-autonomous or fully-autonomous vehicles), including to significantly reduce their computing power used and time used to attempt to otherwise learn a building's layout. In addition, in some embodiments the described techniques may be used to provide an improved GUI in which a user may more accurately and quickly obtain information about a building's interior and surrounding environment (e.g., for use in navigating that interior and/or surrounding environment), including in response to search requests, as part of providing personalized information to the user, as part of providing value estimates and/or other information about a building to a user, etc. Various other benefits are also provided by the described techniques, some of which are further described elsewhere herein.

For illustrative purposes, some embodiments are described below in which specific types of information are acquired, used and/or presented in specific ways for specific types of structures and by using specific types of devices—however, it will be understood that the described techniques may be used in other manners in other embodiments, and that the invention is thus not limited to the exemplary details provided. As one non-exclusive example, while specific types of images are acquired and used to generate specific types of data structures (e.g., enhanced images, graphs of inter-connected images and/or images' acquisition locations, 2D floor plans, 2.5D or 3D computer models, queues, caches, databases, etc.) that are further used in specific manners in some embodiments, it will be appreciated that other types of information to describe buildings and their acquisition locations may be similarly generated and used in other embodiments, including for buildings (or other structures or layouts) separate from houses, and that images and other building information may be used in other manners in other embodiments. As another non-exclusive example, while enhanced images and/or floor plans for houses or other buildings may be used for display to assist viewers in navigating the buildings, generated mapping information may be used in other manners in other embodiments. As yet another non-exclusive example, while some embodiments discuss obtaining and using data from one or more types of image acquisition devices (e.g., a mobile computing device and/or a separate camera device), in other embodiments the one or more devices used may have other forms, such as to use a mobile device that acquires some or all of the additional data but does not provide its own computing capabilities (e.g., an additional 'non-computing' mobile device), multiple separate mobile devices that each acquire some of the additional data (whether mobile computing devices and/or non-computing mobile devices), etc. In addition, the term "building" refers herein to any partially or fully enclosed structure, typically but not necessarily encompassing one or more rooms that visually or otherwise divide the interior space of the structure—non-limiting examples of such buildings include houses, apartment buildings or individual apartments therein, condominiums, office buildings, commercial buildings or other wholesale and retail structures (e.g., shopping malls, department stores, warehouses, etc.), supplemental structures on a property with another main building (e.g., a detached garage or shed on a property with a house), etc. The term "acquire" or "capture" as used herein with reference to a building interior, acquisition location, or other location (unless context clearly indicates otherwise) may refer to any recording, storage, or logging of media, sensor data, and/or other information related to spatial characteristics and/or visual characteristics and/or otherwise perceivable characteristics of the building interior or subsets thereof, such as by a recording device or by another device that receives information from the recording device. As used herein, the term "panoramic photo" or "panorama image") may refer to a visual representation that is based on, includes or is separable into multiple discrete component images originating from a substantially similar physical location in different directions and that depicts a larger field of view than any of the discrete component images depict individually, including images with a sufficiently wide-angle view from a physical location to include angles beyond that perceivable from a person's gaze in a single direction (e.g., greater than 120° or 150° or 180°, etc.). The term "sequence" of acquisition locations, as used herein, refers generally to two or more acquisition locations that are each visited at least once in a corresponding order, whether or not other non-acquisition locations are visited between them, and whether or not the visits to the acquisition locations occur during a single continuous period of time or at multiple different times, or by a single user and/or device or by multiple different users and/or devices. In addition, various details are provided in the drawings and text for exemplary purposes, but are not intended to limit the scope of the invention. For example, sizes and relative positions of elements in the drawings are not necessarily drawn to scale, with some details omitted and/or provided with greater prominence (e.g., via size and positioning) to enhance legibility and/or clarity. Furthermore, identical reference numbers may be used in the drawings to identify the same or similar elements or acts.

Figure 2A:
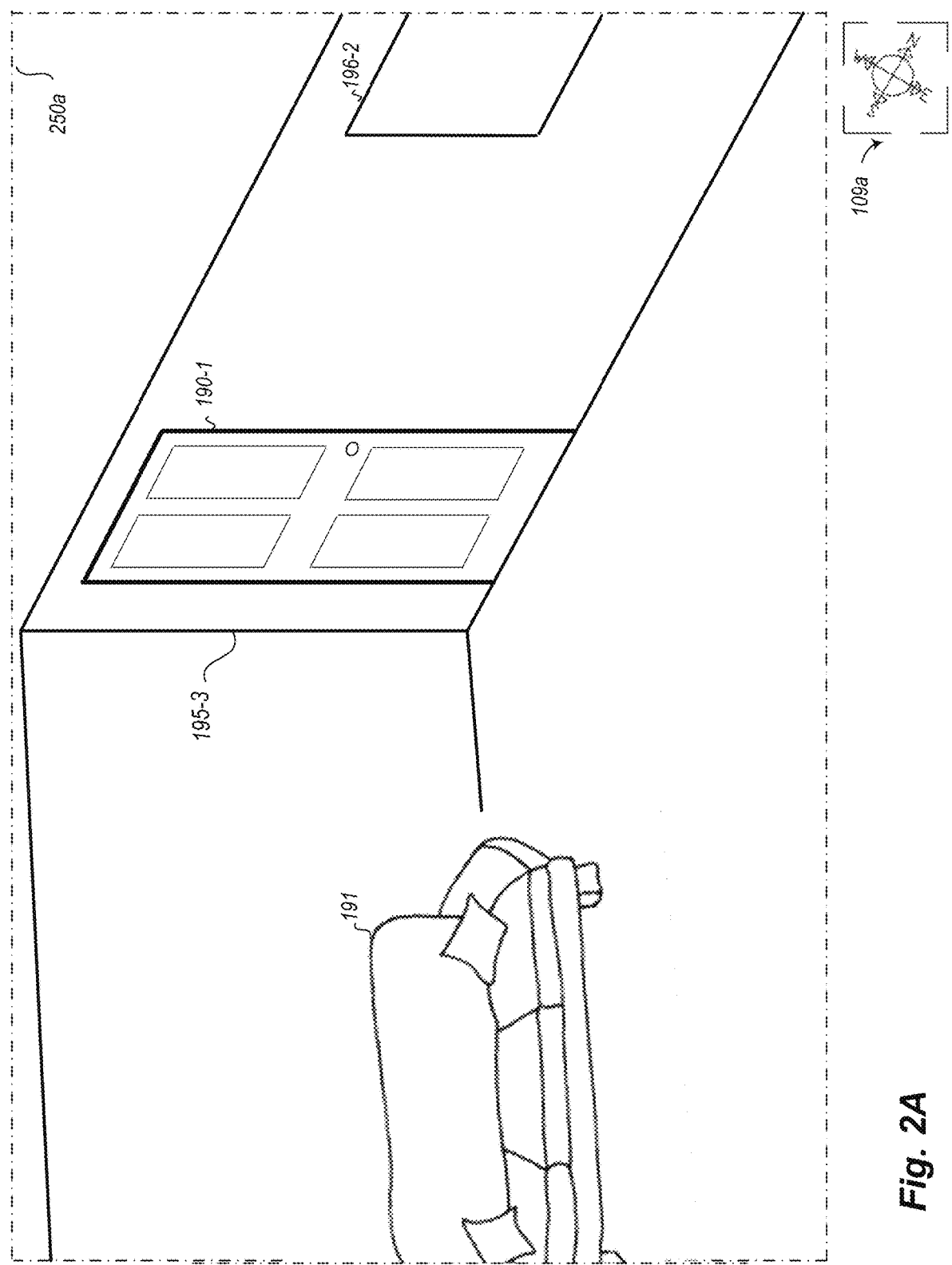
Figure 2B:
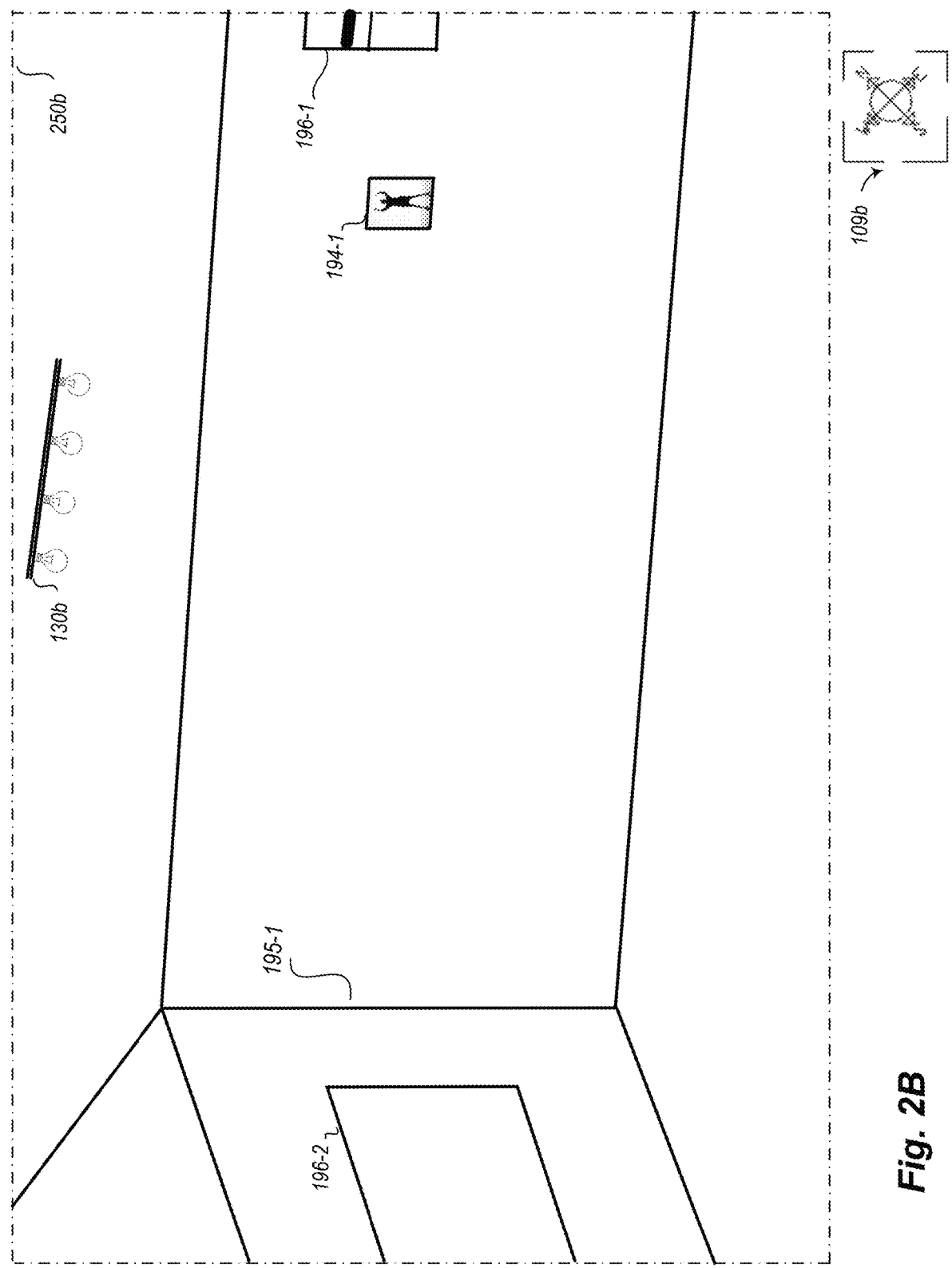
Figure 2C:
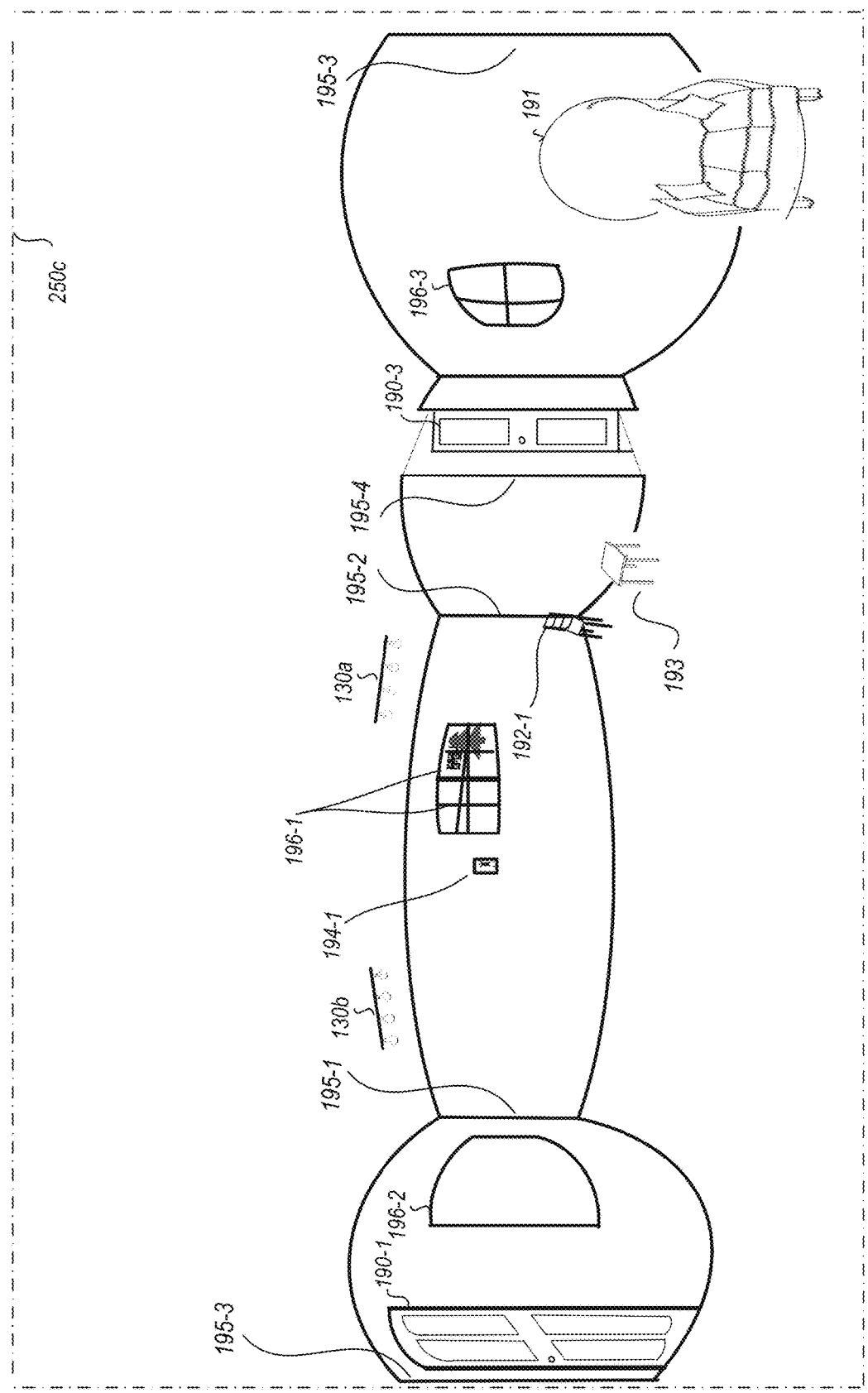

FIG. 1A is an example block diagram of various computing devices and systems that may participate in the described techniques in some embodiments. In particular, after images of mobile types are captured, such as by one or more mobile image acquisition computing devices 185 and/or one or more camera devices 186, the images and associated information for them (e.g., annotations, metadata, inter-connection linking information, etc.) may be stored with information 164 on one or more server computing systems 180 for later use. Such information 164 may further be included as part of captured building interior information 165 that is subsequently used by an IAEMIGM (Image Attribute Exchange and Mapping Information Generation Manager) system 160 executing on one or more server computing systems 180 (whether on the same or different server computing systems on which the information 164 is stored) to generate corresponding enhanced images 152 for the building (e.g., based at least in part on image attribute data 150 from the images) and optionally other building mapping information 155 (e.g., sub-graphs of linked acquisition locations, floor plans, etc.). FIG. 2J shows one example of such a floor plan, as discussed further below, and additional details related to the automated operation of the IAEMIGM system are included elsewhere herein, including with respect to FIGS. 4A-4B and 5. The captured building interior information 165 may further include other types of information acquired from a building environment, such as additional visual data and/or other types of data captured in or around a building, as discussed in greater detail elsewhere herein.

The capture of some or all the images may be performed in the illustrated embodiment of FIG. 1A by an AIC (Automated Image Capture) system executing on an image acquisition and analysis mobile device 185, such as an application 162 located on memory and/or storage 152 of that device—in other embodiments, all of the images may be captured without use of such an AIC system, whether by mobile image acquisition computing devices and/or other camera devices 186 that lack some or all such computing capabilities. If a copy of the AIC system is used on a device 185 to assist in the image capture, one or more hardware processors 132 of the mobile device may execute the AIC system to acquire various images 143 and optionally associated additional information using one or more imaging systems 135 of the mobile device, which are subsequently transferred over one or more computer networks 170 to the storage 164 on the server computing system(s) 180. Similarly, if a camera device 186 is used as part of the image capture, resulting images may be stored on storage (not shown) of the camera device and transferred over one or more computer networks 170 to the storage 164 on the server computing system(s) 180, such as directly by the camera device if it includes corresponding transmission capabilities (not shown) or after the images are transferred to another device (not shown) that does include such transmission capabilities.

Figure 1B:
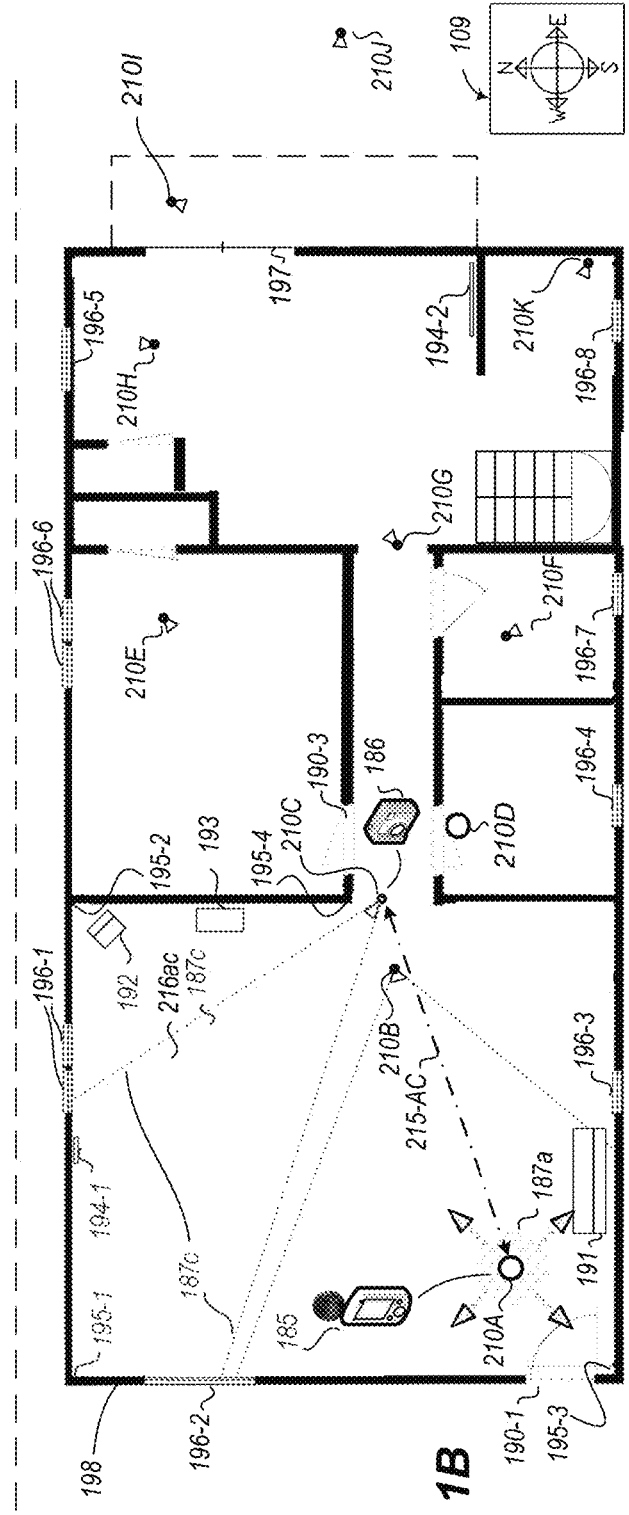

As part of the operations of the AIC system, various other hardware components of the mobile device 185 may be further used, such as the display system 142 (e.g., to display instructions and/or constituent image information), device I/O components 136 (e.g., to receive instructions from and present information to the user), sensor modules 148 that include an IMU gyroscope 148a and an IMU accelerometer 148b and an IMU compass 148c (e.g., to acquire and associate sensor data with the acquisition of particular corresponding constituent images), one or more lighting components 136, etc. —similarly, a camera device 186 may include some or all such components in some embodiments and situations. FIG. 1B shows one example of such acquisition of images for a particular house 198, and FIGS. 2A-2C show examples of such images.

One or more users (not shown) of one or more client computing devices 105 may further optionally interact over the computer networks 170 with the IAEMIGM system 160, such as to assist in creating or modifying building mapping information and/or in subsequently using the generated mapping information in one or more further automated manners—such interactions by the user(s) may include, for example, providing instructions for generated building mapping information, providing information to include with generated building mapping information, obtaining and optionally interacting with particular generated mapping information and/or with additional associated information, etc. In addition, one or more users (not shown) of one or more client computing devices 175 may further optionally interact over the computer networks 170 with the server computing systems 180, such as to retrieve and use generated enhanced images and/or other generated building mapping information and/or individual images and/or other information associated with such generated building mapping information —such interactions by the user(s) may include, for example, obtaining and optionally interacting with one or more types of visualizations of generated mapping information for one or more buildings, optionally as part of a GUI displayed on such a client computing device. In addition, generated mapping information (or a portion of it) may be linked to or otherwise associated with one or more other types of information, including for a floor plan or other generated mapping information for a multi-story or otherwise multi-level building to have multiple associated sub-floor plans or other subgroups of associated building mapping information for different stories or levels that are interlinked (e.g., via connecting stairway passages), for a two-dimensional ("2D") floor plan of a building to be linked to or otherwise associated with a three-dimensional ("3D") rendering of the building, for an enhanced image to be linked to or otherwise associated with a 2D floor plan and/or a 3D model and/or one or more constituent images used to generate the enhanced image, etc. Also, while not illustrated in FIG. 1A, in some embodiments the client computing devices 175 (or other devices, not shown), may receive and use information about generated mapping-related information in additional manners, such as to control or assist automated navigation activities by those devices (e.g., by autonomous vehicles or other devices), whether instead of or in addition to display of a visualization of the identified information.

In addition, in the depicted computing environment of FIG. 1A, the network 170 may be one or more publicly accessible linked networks, possibly operated by various distinct parties, such as the Internet. In other implementations, the network 170 may have other forms. For example, the network 170 may instead be a private network, such as a corporate or university network that is wholly or partially inaccessible to non-privileged users. In still other implementations, the network 170 may include both private and public networks, with one or more of the private networks having access to and/or from one or more of the public networks. Furthermore, the network 170 may include various types of wired and/or wireless networks in various situations. In addition, the client computing devices 175 and server computing systems 180 may include various hardware components and stored information, as discussed in greater detail below with respect to FIG. 3.

Additional details related to embodiments of a system providing related functionality are included in U.S. Non-Provisional patent application Ser. No. 17/064,601, filed Oct. 7, 2020 and entitled "Connecting And Using Building Data Acquired From Mobile Devices" (which includes disclosure of an example BICA system that is generally directed to obtaining and using panorama images from within one or more buildings or other structures); in U.S. Non-Provisional patent application Ser. No. 17/082,044, filed Oct. 28, 2020 and entitled "Automated Control Of Image Acquisition Via Acquisition Location Determination" (which includes disclosure of an example ICA system that is generally directed to obtaining and using panorama images from within one or more buildings or other structures); in U.S. Non-Provisional patent application Ser. No. 17/019,247, filed Sep. 12, 2020 and entitled "Automated Mapping Information Generation From Inter-Connected Images"; in U.S. Non-Provisional patent application Ser. No. 17/080,604, filed Oct. 26, 2020 and entitled "Generating Floor Maps For Buildings From Automated Analysis Of Visual Data Of The Buildings' Interiors"; in U.S. Provisional Patent Application No. 63/035,619, filed Jun. 5, 2020 and entitled "Automated Generation On Mobile Devices Of Panorama Images For Buildings Locations And Subsequent Use"; and in U.S. Non-Provisional patent application Ser. No. 17/459,820, filed Aug. 27, 2021 and entitled "Automated Mapping Information Generation From Analysis Of Building Photos"; each of which is incorporated herein by reference in its entirety.

FIG. 1B depicts a block diagram of an exemplary building interior environment in which images of multiple types have been captured and are ready for use (e.g., to generate and provide corresponding enhanced images and optionally other mapping information for the building, and optionally further for its exterior and associated buildings, not shown, such as a garage, shed, accessory dwelling unit, etc.), as well as for use in presenting the images and/or associated information to users. In particular, FIG. 1B includes a building 198 with an interior that was captured at least in part via multiple images of multiple types, such as by one or more users (not shown) carrying one or more devices with image acquisition capabilities through the building interior to multiple acquisition locations 210. In this example, a mobile computing device 185 may be used by a first user to capture a first group of one or more panorama images at a first time, a camera device 186 may be used by a second user to capture a second group of one or more perspective photos at a separate second time, and one or more other devices (not shown) with visual data acquisition capabilities may be used by one or more third users (not shown) to capture a third group of one or more groups of additional visual data (e.g., one or more videos, additional panorama images, additional perspective photo images, etc.) at one or more separate third times—as discussed elsewhere herein, mapping information may be initially generated for the building using a first set of images and optionally additional information, and may later be updated to incorporate one or more additional images and optionally further additional information that are captured after the initial generation of the mapping information. An embodiment of the AIC system (e.g., application 162 executing on a user's mobile device 185) may in some embodiments automatically perform or assist in the capturing of the data representing the building interior. While the mobile device 185 may include various hardware components, such as one or more cameras or other imaging systems 135, one or more sensors 148 (e.g., a gyroscope 148a, an accelerometer 148b, a compass 148c, etc., such as part of one or more IMUs, or inertial measurement units, of the mobile device; an altimeter; light detector; etc.), a GPS receiver, one or more hardware processors 132, memory and/or storage 152, a display 142, a microphone, etc., the mobile device may not in at least some embodiments have access to or use equipment to measure the depth of objects in the building relative to a location of the mobile device, such that relationships between different images and their acquisition locations may be determined in part or in whole based on matching visual elements in different images and/or by using information from other of the listed hardware components, but without using any data from any such depth sensors —similarly, the camera device 186 may not have access to or use equipment to measure the depth of objects in the building relative to a location of the mobile device. In other embodiments, the mobile device 185 and/or camera device 186 may optionally include and use one or more types of sensors and/or related components to obtain depth data related to structures (e.g., walls) and/or other objects in an environment around an image being captured, such as corresponding to one or more depth-sensing components 137 of the mobile device 185 (e.g., using one or more of techniques including lidar, structured light, time-of-flight, passive stereo, active stereo, etc.) that provide such data (optionally in combination with other components of the mobile device 185)—in at least some such embodiments, such depth data may be used by the IAEMIGM system as part of generating enhanced images, as discussed in greater detail elsewhere herein. Also, in some embodiments the mobile device 185 and/or camera device 186 may optionally include and use one or more types of sensors and/or related components to obtain location-related data for acquired images and their surrounding environments, such as using the sensors 148 and/or imaging system 135 (e.g., using ARKit and/or ARCore or similar techniques), using other location-related components (e.g., a GPS receiver, not shown), etc. —in at least some such embodiments, such location-related data may be used by the IAEMIGM system as part of generating enhanced images, as discussed in greater detail elsewhere herein. In addition, while directional indicator 109 is provided for reference of the viewer, the device(s) 185 and/or 186 and/or the AIC system may not use such absolute directional information in at least some embodiments, such as to instead determine relative directions and distances between images acquired at acquisition locations 210 without regard to actual geographical positions or directions.

In operation, a user associated with a device 185 arrives at a first acquisition location 210A within a first room of the building interior (in this example, an entryway from an external door 190-1 to the most westward room, which in this example is a living room), and captures a view of a portion of the building interior that is visible from that acquisition location 210A—in this example, the captured image is a 360° panorama image that includes visual coverage 187a of all or substantially all of the living room (and of a small amount of the hallway to the east of the living room). The actions of the user and/or the mobile device may be controlled or facilitated via use of one or more programs executing on the mobile device, such as AIC application 162, and the capture may include visual information depicting objects or other elements (e.g., structural details) that may be visible from the acquisition location in those directions. In the example of FIG. 1B, such objects or other elements in the building 198 include various elements that are structurally part of the walls (or "wall elements"), such as the doorways 190 and 197 and their doors (e.g., with swinging and/or sliding doors), windows 196, inter-wall borders (e.g., corners or edges) 195 (including corner 195-1 in the northwest corner of the building 198, corner 195-2 in the northeast corner of the living room, and corner 195-3 in the southwest corner of the living room)—in addition, such objects or other elements in the example of FIG. 1B may further include other elements within rooms, such as furniture 191-193 (e.g., a couch 191; chair 192; table 193; etc.), pictures or paintings or televisions or other objects 194 (such as 194-1 and 194-2) hung on walls, light fixtures, etc. The user may also optionally provide a textual or auditory identifier to be associated with an acquisition location, such as "entry" or "living room" for acquisition location 210A, while in other embodiments the IAEMIGM system may later automatically generate such identifiers (e.g., by automatically analyzing visual data and/or other recorded information for a building to perform a corresponding automated determination, such as by using machine learning) or the identifiers may not be used.

After an image for the first acquisition location 210A has been captured, the user may proceed to another acquisition location (such as acquisition location 210D), optionally capturing movement data during travel between the acquisition locations, such as visual data and/or other data from the hardware components (e.g., from one or more IMUs, from the camera, etc.). At the next acquisition location, the user may similarly use the mobile device to capture one or more images from that acquisition location. This process may repeat for some or all rooms of the building and optionally external to the building, as illustrated for other acquisition locations 210B-210K. In addition, in this example, a user (whether the same or different) uses camera device 186 to capture one or more perspective photo images at one or more acquisition locations at one or more times (whether the same or different than the capture by computing device 185), including acquisition location 210C in this example, and optionally one or more other acquisition locations 210B and 210E-210K—in this example, the angle of view of the resulting perspective photo is the northwest portion of the living room, as shown by sight lines 187c. These example images from acquisition locations 210A and 210C have an area of overlap 216ac in this example, which may be later used by the IAEMIGM system to inter-connect (or 'link') together these images and/or their acquisition locations (with corresponding line 215-AC between them being shown for the sake of illustration), such as to determine relative positional information between these two acquisition locations, as discussed in greater detail with respect to FIG. 2F and elsewhere herein, and/or to group these images together for use in generating one or more corresponding enhanced images, as discussed in greater detail with respect to FIGS. 2D-2H. Such automated operations of the IAEMIGM system may further generate and store corresponding inter-connections for other pairs of acquisition locations and/or their captured images, and/or generate and store corresponding enhanced images, including in some embodiments and situations to further connect at least some acquisition locations whose images do not have overlapping visual coverage and/or that are not visible to each other (e.g., a connection, not shown, between acquisition locations 210E and 210K).

Additional details related to embodiments of generating and using linking information between panorama images, including using travel path information and/or elements or other features visible in multiple images, are included in U.S. Non-Provisional patent application Ser. No. 17/064,601, filed Oct. 7, 2020 and entitled "Connecting And Using Building Data Acquired From Mobile Devices" (which includes disclosure of an example BICA system that is generally directed to obtaining and using linking information to inter-connect multiple panorama images captured within one or more buildings or other structures); in U.S. Non-Provisional patent application Ser. No. 17/080,604, filed Oct. 26, 2020 and entitled "Generating Floor Maps For Buildings From Automated Analysis Of Visual Data Of The Buildings' Interiors"; and in U.S. Provisional Patent Application No. 63/035,619, filed Jun. 5, 2020 and entitled "Automated Generation On Mobile Devices Of Panorama Images For Buildings Locations And Subsequent Use"; each of which is incorporated herein by reference in its entirety.

Various details are provided with respect to FIGS. 1A-1B, but it will be appreciated that the provided details are non-exclusive examples included for illustrative purposes, and other embodiments may be performed in other manners without some or all such details.

FIGS. 2A-2J illustrate examples of automatically generating mapping information for a building using multiple types of images acquired by one or more devices from one or more acquisition locations at one or more times, including generating corresponding enhanced images, such as for the building 198 discussed in FIG. 1B, as well as subsequently using the generated mapping information in one or more automated manners.

In particular, FIG. 2A illustrates an example perspective photo image 250a taken in a southwesterly direction from acquisition location 210B in the living room of house 198 of FIG. 1B—the directional indicator 109a is further displayed in this example to illustrate the southwesterly direction in which the image is taken. In this example, a portion of window 196-2 is visible, as is a couch 191 and visual horizontal and vertical room borders (including horizontal borders between a visible portion of the south wall of the living room and the living room's ceiling and floor, horizontal borders between a visible portion of the west wall of the living room and the living room's ceiling and floor, and the inter-wall vertical border 195-3 between the south and west walls). This example image 250a further illustrates an inter-room passage for the living room, which in this example is a door 190-1 to enter and leave the living room (which FIG. 1B identifies as a door to the west exterior of the house).

FIG. 2B continues the examples of FIG. 2A, and illustrates an additional perspective photo image 250b taken in a northwesterly direction in the living room of house 198 of FIG. 1B, such as from acquisition location 210C—the directional indicator 109b is further displayed to illustrate the northwesterly direction in which the image is taken. In the illustrated example, the displayed image includes built-in elements (e.g., light fixture 130b), parts of windows 196-1 and 196-2, and a picture 194-1 hanging on the north wall of the living room. No inter-room passages into or out of the living room (e.g., doors or other wall openings) are visible in this image. However, multiple room borders are visible in the image 250a in a manner similar to that of FIG. 2A, including the inter-wall vertical border 195-1 between the north and west walls.

FIG. 2C continues the examples of FIGS. 2A-2B, and illustrates a panorama image 250c with 360° of visual coverage of the living room, such as from acquisition location 210A, and with the visual data shown in an equirectangular format in which horizontal straight lines in the living room (e.g., borders between walls and the floor or ceiling) are shown with increasing curvature as their distance from the vertical center of the image increases, and in which vertical straight lines in the living room (e.g., inter-wall borders) are shown without such curvature—a directional indicator is not displayed in this example, since the visual coverage of this panorama image includes all horizontal directions. In the illustrated example, the image shows the same visual elements as in perspective photos 250a and 250b, as well as additional visual data not shown in those perspective photos (e.g., all of windows 196-2 and 196-1, window 196-3, part of the hallway (including part of door 190-3) and the corresponding wall opening on the east side of the living room, table 193, chair 192-1, ceiling light 130a, inter-wall border 195-2, etc. It will be appreciated that a variety of other types of structures and/or elements may be present in other embodiments.

FIG. 2D continues the examples of FIGS. 2A-2C, and illustrates information 230d that corresponds to the initial steps for determining to match perspective photo image 250b with panorama image 250c based at least in part on overlapping visual coverage of those two images. In particular, in this example, panorama image 250c is used to generate multiple sub-images 255a-255c that correspond to different subsets of the panorama image and that are converted to a perspective planar format, such as perspective photo 255c that corresponds to an upward vertical direction (e.g., a positive Z direction) from the panorama image's acquisition location, and perspective photos 255a and 255c that correspond to different horizontal directions (e.g., X or Y directions) from the panorama image's acquisition location (in this example, in the northward and southward directions)—while not illustrated in this example, additional such sub-images may similarly be generated, such as an additional perspective photo in a downward vertical direction, and additional perspective photos in other horizontal directions (e.g., in the eastward and westward directions). As will be appreciated, eat such sub-image perspective photo shows only a subset of the visual data of the panorama image 250c.

Figure 2F:
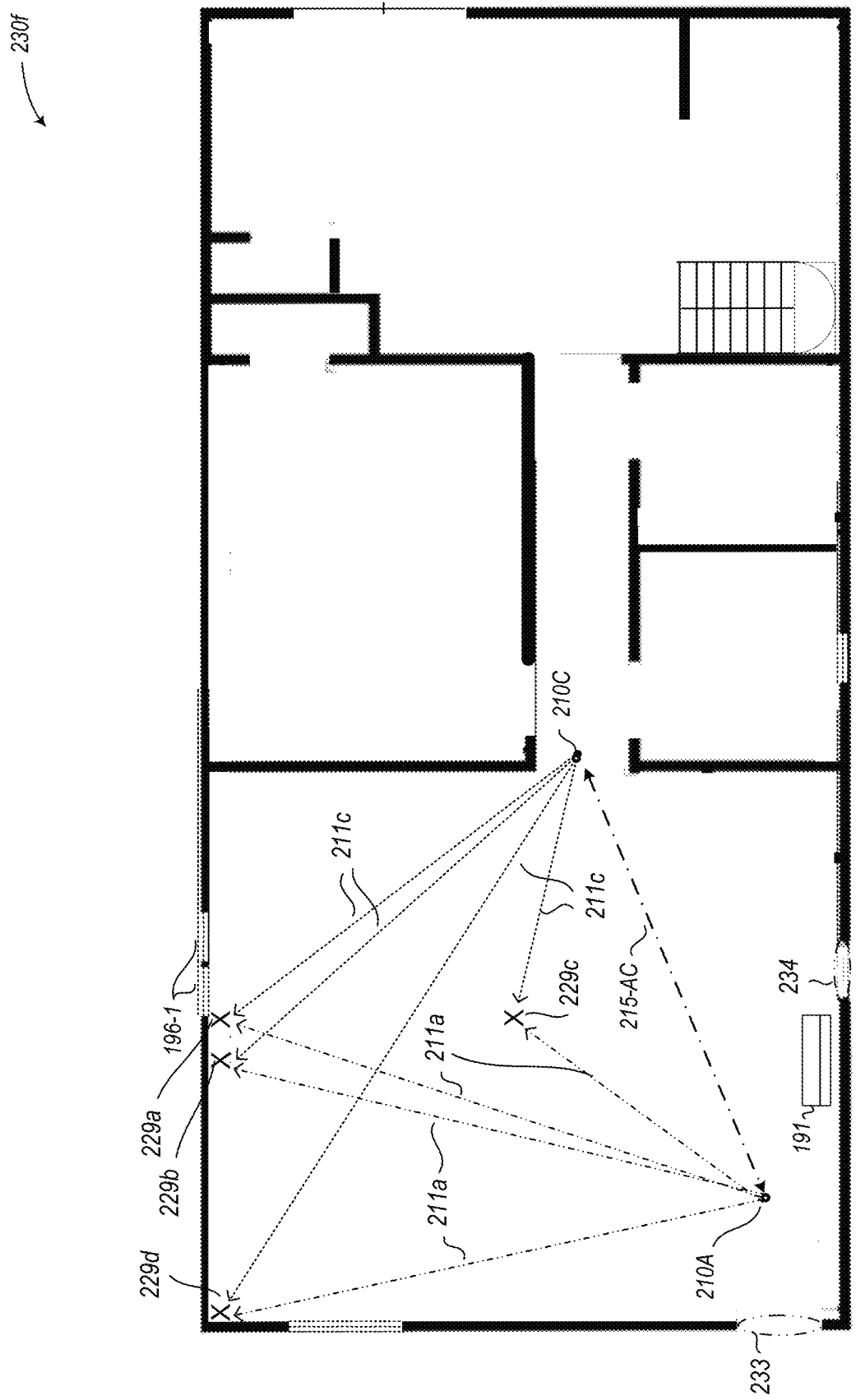

FIGS. 2E and 2F continue the examples of FIGS. 2A-2D, with FIG. 2E illustrating information 230e to provide a visual example of matching perspective photo 250b to a subset of sub-image perspective photo 255a for panorama image 250c, as illustrated by outline 220 superimposed on the perspective photo 255a. FIG. 2F illustrates additional information 230f regarding identifying matching visual features between perspective photo 250b and the sub-image perspective photo 255a. In particular, FIG. 2F illustrates a variety of types of matching features that may be visible in the visual data of both images (e.g., in the overlap area of 216ac shown in FIG. 1B), including showing sightlines 211a from acquisition location 210A and sightlines 211c from acquisition location 210C to determine relative placement of those features from those acquisition locations (e.g., using determined view angle orientation from each acquisition location to the matching features in order to determine a relative rotation and translation between acquisition locations 210A and 210C, assuming that sufficient overlap in the two images' visual data is available). In the example of FIG. 2F, the matching features may include elements 229a, 229b, 229c and 229d illustrated in FIG. 2F, such as the western edge or corner of window 196-1 for feature 229a, some or all of the picture 194-1 for feature 229b, one or more points in the center of the room for feature 229c (e.g., one or more points on the floor that are visible and distinguishable from other points on the floor), and one or more points for feature 229d corresponding to inter-wall border 195-1. It will be appreciated that numerous other features may be visible in the two images, including points on structural elements such as the walls, floor, ceiling, windows, corners, borders, etc. and points on non-structural elements such as furnishings. Some features may be visible from only one acquisition location, such as for the northeast corner 195-2, and thus may not be used for the comparison and analysis of the images' visual data from these two acquisition locations (although it may be used for the generation of structural shapes from the image captured at acquisition location 210A).

After analyzing multiple such features in the living room between the images from the acquisition locations 210A and 210C, various information may be determined regarding the positions of the acquisition locations 210A and 210C in the room. Note that in this example the acquisition location 210C is near the border between the living room and hallway, and includes visual coverage of the living room (and such that a different orientation from that acquisition location may include visual data from multiple rooms, and thus may provide information for and be associated with one or both of those rooms)—similarly, the panorama image acquired from acquisition location 210A may include visual data from the living room and a portion of the hallway. While the hallway may be modeled as a separate room in this example, in other embodiments such hallways may instead be treated as part of one or more rooms connecting to the hallway, or instead the hallway may be treated as a connecting passage between rooms rather than as a separate room—similarly, small areas such as closets and/or alcoves/nooks may not be analyzed as a separate room and instead be treated as part of the larger containing room (optionally as unmapped space within the room), although in other embodiments such small areas could instead be separately represented (including to optionally have one or more acquisition locations located within them). While illustrated only with respect to the living room and two acquisition locations, it will be appreciated that similar analysis may be performed for each of the acquisition locations, and with respect to some or all of the rooms in the building, including to optionally form a larger group of images that includes perspective photo 250a (e.g., based at least in part on matching visual features between perspective photo 250a and sub-image 255b generated from panorama image 250c). In addition, analysis of information in the images may further be used to determine additional position information in the room for one or more such acquisition locations, such as to further determine specific dimensions of distances from an acquisition location to one or more nearby walls or other structural features of the room—information for such dimension determination may be determined in some embodiments by using sizes of known objects (e.g., door frames, door handles, lightbulbs, etc.), and extrapolating to corresponding sizes of other features and distances between locations. In this manner, such an analysis may provide the position of each acquisition location in a room, of connecting passage locations for the room, and optionally an estimate of a partial or complete room shape using structural information determined from one or more images whose visual data includes at least part of that room.

In some embodiments, an automated determination of a position within a room of an acquisition location and/or of an estimated full or partial room shape may be further performed using machine learning, such as via a deep convolution neural network that estimates a 2D or 3D layout of a room from one or more images (e.g., a rectangular, or "box" shape; non-rectangular shapes; etc.). Such determination may include analyzing the image(s) to align the image(s)' visual data so that the floor is level and the walls are vertical (e.g., by analyzing vanishing points in the images) and to identify and predict corners and boundaries, with the resulting information fit to a 2D and/or 3D form (e.g., using layout parameters, such as for an outline of floor, ceiling and walls to which image information is fitted). In addition, in some embodiments humans may provide manual indications of estimated room shapes for rooms from images, which may be used in generation of a corresponding floor plan, as well as later used to train models for use in corresponding subsequent automated generation of room shapes for other rooms from their images. In some embodiments, certain assumptions may be employed for automated analysis of image(s) of at least some rooms, such as one or more of the following: the room shape should be predominantly rectangular/cuboid; if the room shape is not predominantly rectangular/cuboid, multiple acquisition locations should be used within the room; the room should be at least a minimum number of visible corners and/or walls (e.g., 3, 4, etc.); the room should have a level floor and walls perpendicular to the floor; the walls should be flat rather than curved; the image is acquired from a camera at a specified level above the floor (e.g., 5 feet, approximately midway between floor and ceiling, etc.); the image is acquired from a camera at a specified distance from one or more walls (e.g., 4 feet, 5 feet, 6 feet, 7 feet, 8 feet, 9 feet, 10 feet, etc.); etc. In addition, if multiple room shape estimates are available for a room (e.g., from multiple acquisition locations within the room), one may be selected for further use (e.g., based on positions of the acquisition locations within the room, such as a most central), or instead the multiple shapes estimates may be combined, optionally in a weighted manner. Such automated estimation of a room shape may further be performed in at least some embodiments by using one or more techniques such as SfM (structure from motion), Visual SLAM (simultaneous localization and mapping), sensor fusion, etc. if corresponding data is available.

Figure 2H:
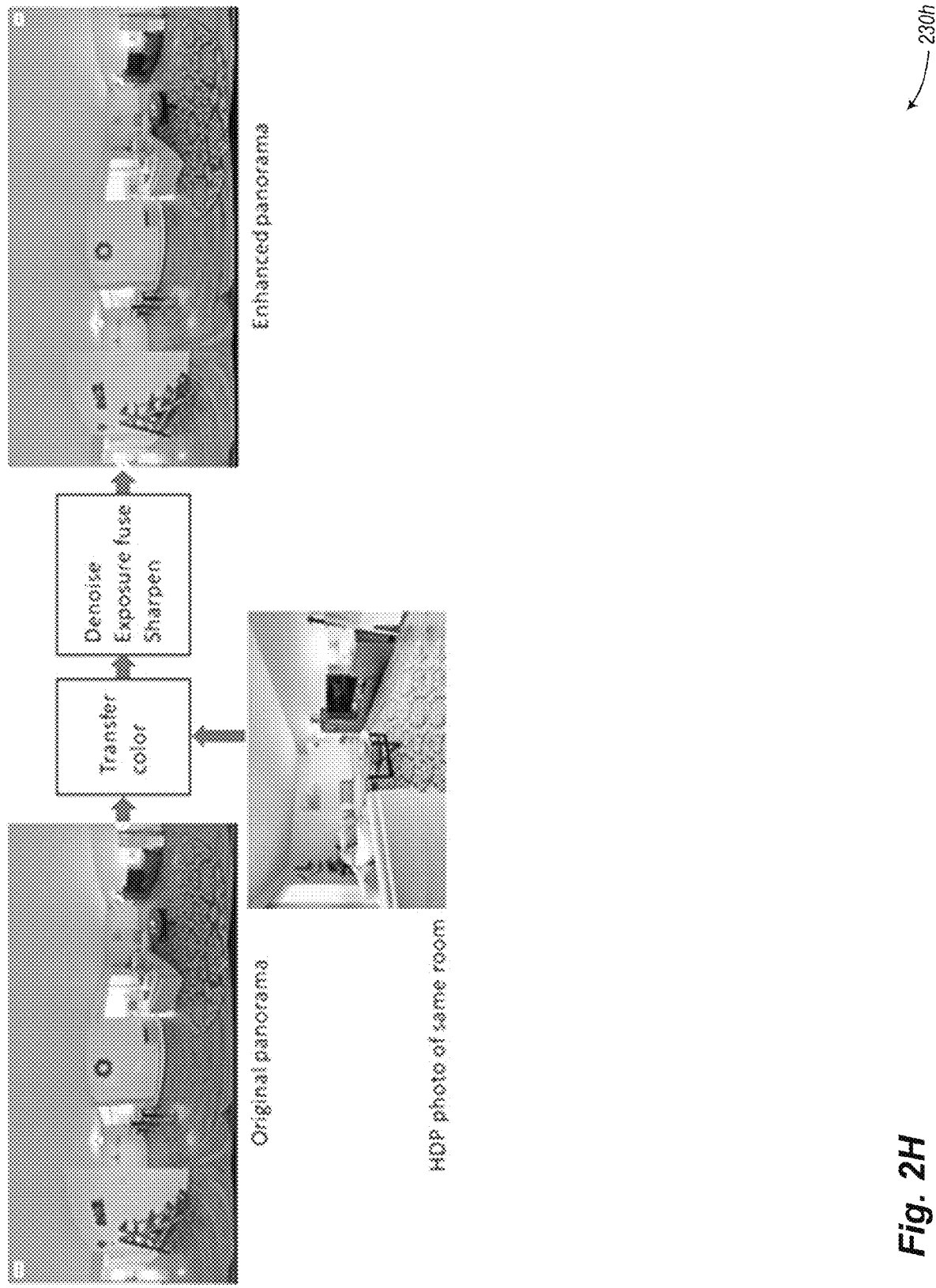

FIGS. 2G and 2H continue the examples of FIGS. 2A-2F, and illustrates example information 230g regarding possible types of attribute data exchange between the mapped pair of perspective photo 250b and panorama image 250c—in this example, the sub-image 255a of panorama image 250c is shown rather than the entire panorama image 250c, but the exchange of attribute information may take place between the entire panorama image 250c rather than the illustrated sub-image 255a. In this example, various chroma (or color) attribute data that is associated with the perspective photo 250b is identified, and one example of an enhanced image that may be generated includes an enhanced panorama image (not shown) in which the original panorama image 250c is modified to use such chroma attribute data (e.g., for only the portion 220 of the panorama image 250c, for all of the portion of the panorama image 250c corresponding to sub-image 255a, for all of the panorama image 250c, etc.). FIG. 2H illustrates additional information 230h to illustrate an example of generation of a different enhanced panorama image by using color data of a perspective photo with overlapping visual coverage.

In addition, various structural information 255g of FIG. 2G may be determined from the panorama image 250c in a manner discussed in greater detail elsewhere, including in this example to generate a 2D room shape 239a for the living room that includes relative position information for the walls and for additional structural elements such as doors, windows, and inter-wall openings—the illustrated information 255g further illustrates that other structural information may similarly be determined for other rooms using additional images having visual coverage of those rooms, such as a 2D structural shape 242b for a first bedroom adjacent to the southeast wall of the living room, a 2D structural shape 242a for another bedroom adjacent to the northeast wall of the living room, and a 2D structural shape 238b corresponding to the hallway, with the various structural shapes optionally positioned relative to each other—while not illustrated here, such structural shapes may further be represented in a 3D manner in some embodiments and situations. Given such structural information 239a associated with the panorama image 250c, another example of an enhanced image that may be generated from this pair of mapped images includes an enhanced perspective photo (not shown) in which the original perspective photo 250b is modified to have associated structural information data for some or all of the structural information 239a—in this example, a subset 239b of the structural information 239a that corresponds to the visual data of perspective photo 250b is determined and is associated with the enhanced perspective photo, although in other embodiments all of the structural information 239a may instead be associated with the enhanced perspective photo.

In addition, other information may be determined based at least in part on the perspective photo 250b, optionally in combination with that of other perspective photos, such as to learn characteristics of areas of the house 198 that are of particular interest. Accordingly, as another example of one or more enhanced images that may be generated from this pair of mapped images, such learned characteristics data may be used to analyze panorama image 250c and to select one or more subsets of the panorama image that match the learned characteristics, with those selected subsets than used to generate one or more enhanced images (not shown, and whether generated as enhanced perspective photos or enhanced panorama images) that each includes the visual data of one of those selected subsets. As discussed in greater detail elsewhere herein, a variety of additional types of enhanced images may be generated in other manners in other embodiments.

In some non-exclusive example embodiments, the types of processing discussed with respect to FIGS. 2D-2H may further include particular processing steps, as follows.

A first step in this example involves matching each perspective photo to one of multiple panorama images each having 360° of visual coverage in an equirectangular format, such as to find a most visually similar panorama image (including finding the most similar region of the panorama image to the perspective photo)—in this example, the matching involves equirectangular-to-perspective transformation, local and global feature extraction, and retrieval and pairing. First, each such panorama image is separated into 6 non-overlapping perspective 'crops' (or sub-images), to provide useful data for feature extraction and retrieval, as well as to facilitate finding the most similar crop to a given panorama image. Next, deep features are extracted from each panorama image crop as well as from each perspective photo, for both global features (with a single feature vector describing the entire respective crop sub-image or perspective photo) to assist in efficiently narrowing down candidates for the most similar panorama image, and local features (corresponding to subsets of the respective crop sub-image or perspective photo, and with extracted descriptors along with their corresponding 2D locations in the respective crop sub-image or perspective photo) to use in selection of the most similar panorama image from the candidates, including to do geometry verification of that panorama image and the perspective photo. A next step in this example involves using the global and local features to pair each perspective photo with its most similar panorama image. In particular, for each perspective photo, its global feature is used to find the most similar panorama images to that given perspective photo. The local features are then used to geometrically verify the, for example, top 10 retrieved panorama images and re-rank them based on degree of match (i.e., degree of visual similarity). The 'best' panorama image crop for each perspective photo (i.e., the crop sub-image with the highest ranking for local feature match) is then associated with the perspective photo, based on the number of inliers in the geometric verification step.

To perform a transfer exchange of chroma attribute data and/or other photometric attribute data (e.g., color profile, exposure, etc.) between two images of a pair, one of the images of the pair (e.g., the panorama image) is modified to use such photometric attribute data from the other image of the pair (e.g., the perspective photo). Such photometric attribute data exchange may be performed in various manners in various embodiments, with color profile data exchanged in some embodiments using an algorithm described in Reinhard et al., "Color Transfer Between Images," IEEE Computer Graphics and Applications, 2001, and optionally with that or a similar algorithm being modified to allow the amount of transfer in the luminance channel to be customizable (e.g., set to zero, so as to transfer only the chroma, or ab, values). With respect to color profile transfer from perspective photos to enhance panoramas, perspective photos are often captured and edited professionally to be visually aesthetic, with such chroma/color profile attribute data exchange used to produce an enhanced panorama image with a higher quality of visual data (and correspondingly higher quality of resulting generated mapping information).

To perform a transfer exchange of structural attribute data (e.g., structural shapes, locations of structural elements, relative layouts of multiple structural pieces, etc.) between two images of a pair, one of the images of the pair (e.g., the perspective photo) is modified to use such structural attribute data from the other image of the pair (e.g., the panorama image). In some embodiments, doing so involves matching coordinate data between the two images, such as to start with structural attribute data in a local coordinate system used by the panorama image, with a separate global coordinate system (or different local coordinate system used by the perspective photo), with information to indicate or for use in determining the location of the panorama image in the global coordinate system (or in the different local coordinate system of the perspective photo), and optionally with information to indicate or for use in determining the location of the perspective photo in the global coordinate system—if such a location of the perspective photo is also available, it can be used to position the structural data from the panorama image into the coordinate system used by the perspective photo. The process includes the following:

each group of structural data is generated or otherwise obtained with respect to a corresponding panorama image, with the center of that panorama image represented as the center of the local coordinate system for that particular room shape.

convert the room shape from the panorama image's local coordinate system to the global coordinate system and then back to the perspective photo's local coordinate system (or alternatively directly to the perspective photo's local coordinate system in other embodiments). If the location of the perspective photo is not provided, it can be estimated using an algorithm such as SfM or any other pose estimation method to localize a perspective photo with respect to the panorama and then position the panorama image's structural data for the perspective photo based on that location.

To perform a transfer exchange of attribute data corresponding to characteristics of a house or other building of interest using two images of a pair, one of the images of the pair (e.g., the panorama image) is modified in accordance with the identified characteristics based at least in part on the other image of the pair (e.g., the perspective photo). For example, perspective photos often are captured to reflect a 'best' or otherwise preferred view point and/or angle for a particular room and/or particular building, and corresponding characteristics may be identified from perspective photos and used to select corresponding subsets of one or more panorama images, so as to learn to create crop sub-images of panorama images with corresponding 'best' or otherwise preferred view point and/or angle for a particular room and/or particular building. In some embodiments, for groups of perspective photos and panorama images corresponding to multiple other buildings, the one or more subset portions of a panorama image that match one or more perspective photos are used as positive samples for training a corresponding machine learning model, and the other areas of the panorama images that are matched are used as negative samples for such training. Given the positive and negative samples, the machine learning model can be trained to automatically select corresponding subset views within other panorama images and to create corresponding enhanced images based on cropped sub-images for those views. In addition, additions from Generative Adversarial Networks (GANs) and/or similar techniques can be used to match the style of the selected panorama image views to the perspective photo views (e.g., to that of a perspective photo in a matched pair with that panorama image) to enhance the quality of the resulting generated enhanced image. In some cases, such techniques may enable the same types of mapping information to be generated for some buildings based only on a set of panorama images for those buildings, without any perspective photos for those buildings.

Figure 2I:
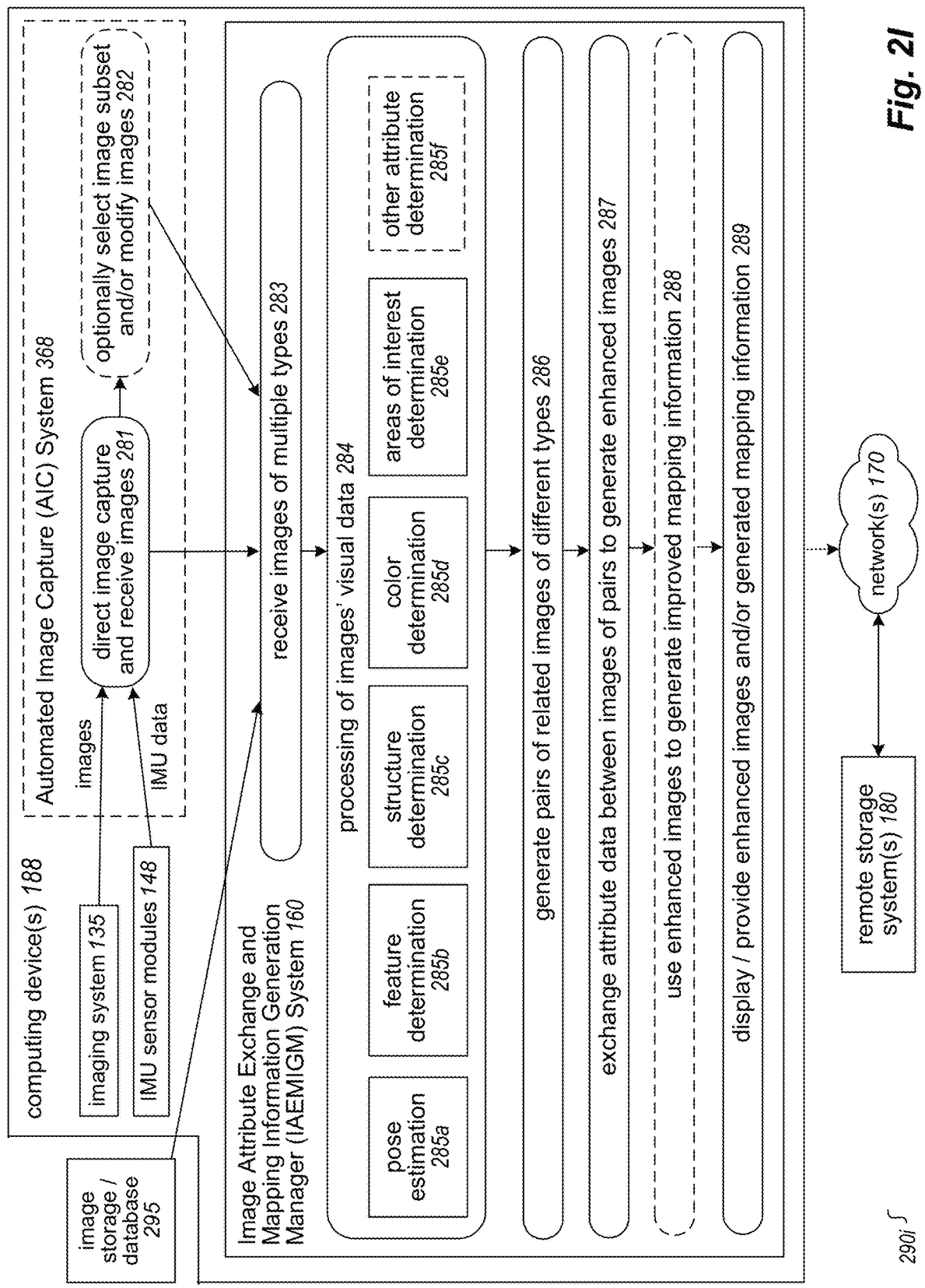
Figure 2J:
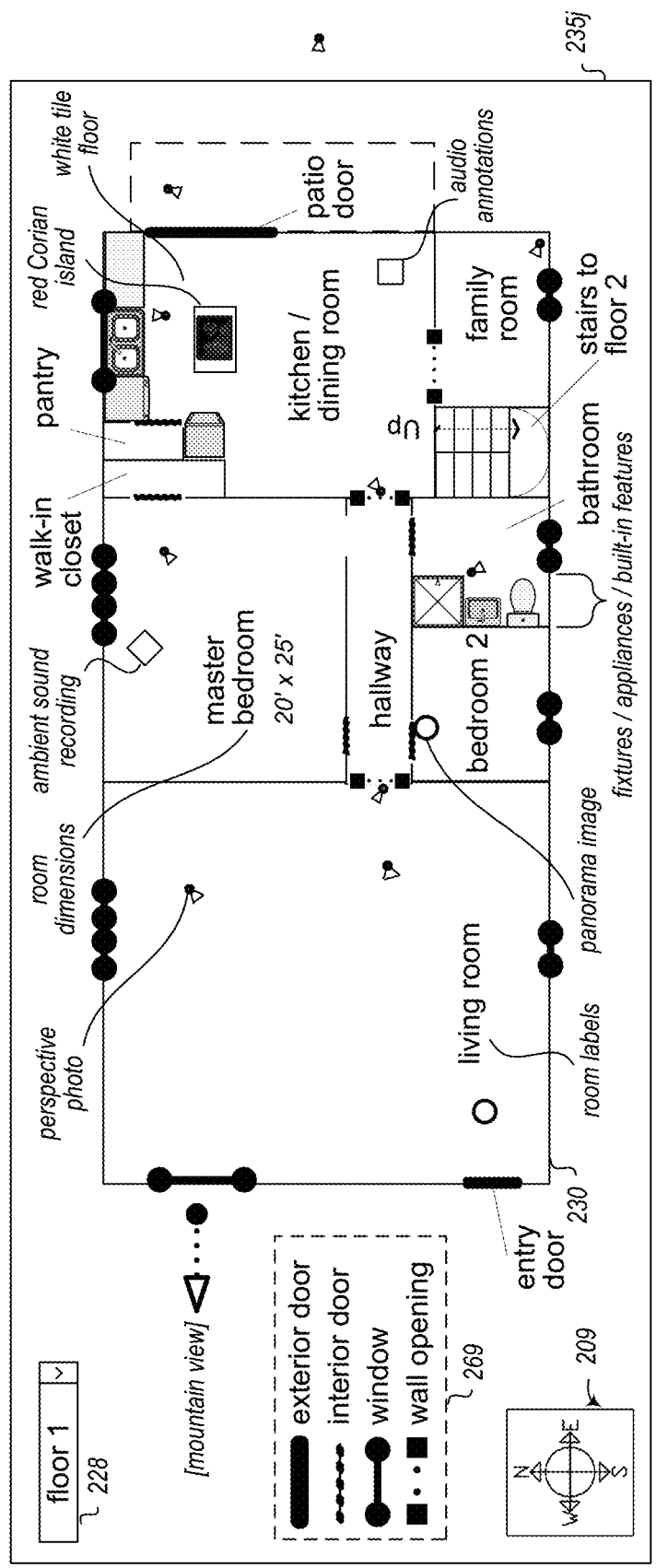

FIG. 2I further illustrates information 290i to show an example architecture and information processing flow to perform some or all of the described techniques. In this example, one or more computing devices 188 execute an embodiment of the IAEMIGM system 160 of FIG. 1A and optionally an embodiment of an AIC system 162 of FIG. 1A (and/or AIC system 368 of FIG. 3), such as to correspond to computing devices 180 and optionally 185 of FIG. 1A. The embodiment of the IAEMIGM system 160 of FIG. 2I operates to receive images 283 of multiple types for one or more related buildings, perform various processing 284 of the visual data of the images, generate pairs 286 of related images of different types, exchange attribute data 287 between images of the pairs to generate enhanced images, optionally use the enhanced images 288 to generate improved mapping information, and display or otherwise provide enhanced images and/or other resulting generated mapping information for the building(s). The images received in step 283 may come from, for example, an image storage location 295 (e.g., a database) and/or from execution of the AIC system—if the AIC system provides some or all of the images, it may do so by capturing and receiving 281 images using one or more imaging systems 135 and optionally receiving additional information from IMU sensor modules 148, and optionally performing processing 282 to select a subset of the images for use (e.g., based on attributes of those images, such as clarity or other indications of sufficient detail in the visual data of those images for further analysis) and/or to modify the images in one or more manners (e.g., to change the format of the images, to crop or resize or otherwise modify the images, etc.). As part of step 284 to process the images' visual data, the IAEMIGM system 160 may perform automated operations to estimate pose 285a of the images and to determine features 285b visible in the visual data of the images, such as in a manner discussed in greater detail elsewhere herein. The processing 284 may further include one or more additional steps related to determining attribute information associated with particular images, such as to determine structural information 285c from the visual data of the images, to determine color information 285d from the visual data of the images, and/or to identify 285e areas of interest in images and learn corresponding characteristics for those areas, such as in a manner discussed in greater detail elsewhere herein. The processing 284 may further optionally perform additional activities, such as to determine 285f one or more other types of attribute information from the visual data and/or other information associated with the images. Pairs of related images of different types may then be determined in various manners, such as based at least in part on overlapping visual coverages of those images and/or using other criteria, using information from one or more of processing 285a and/or 285b, and such as in a manner discussed in greater detail elsewhere herein. Similarly, one or more types of attribute data may be exchanged between images of a pair to generate one or more enhanced images, using information from one or more of processing 285c and/or 285d and/or 285e and/or 285f, and such as in a manner discussed in greater detail elsewhere herein. In the illustrated embodiment, the one or more computing devices 188 may further interact with one or more other systems over one or more computer networks 170, including one or more remote storage systems 180 on which information generated by the IAEMIGM system may be stored for later use.

FIG. 2J continues the examples of FIGS. 2A-2H, and illustrates one example 235j of a 2D floor plan for the house 198, such as may be presented to an end-user in a GUI, with the living room being the most westward room of the house (as reflected by directional indicator 209)—it will be appreciated that a 3D or 2.5D computer model with wall height information may be similarly generated and displayed in some embodiments, whether in addition to or instead of such a 2D floor plan. Various types of information are illustrated on the 2D floor plan 235j in this example. For example, such types of information may include one or more of the following: room labels added to some or all rooms (e.g., "living room" for the living room); room dimensions added for some or all rooms; visual indications of fixtures or appliances or other built-in features added for some or all rooms; visual indications added for some or all rooms of positions of additional types of associated and linked information (e.g., of panorama images and/or perspective photos and/or videos and/or other visual data that an end-user may select for further display, of audio annotations and/or sound recordings that an end-user may select for further presentation, etc.); visual indications added for some or all rooms of doors and windows; visual indications of built-in features (e.g., a kitchen island); visual indications of installed fixtures and/or appliances (e.g., kitchen appliances, bathroom items, etc.); visual indications of appearance and other surface information (e.g., color and/or material type and/or texture for installed items such as floor coverings or wall coverings or surface coverings); visual indications of views from particular windows or other building locations and/or of other information external to the building (e.g., a type of an external space; items present in an external space; other associated buildings or structures, such as sheds, garages, pools, decks, patios, walkways, gardens, etc.); a key or legend 269 identifying visual indicators used for one or more types of information; etc. When displayed as part of a GUI, some or all such illustrated information may be user-selectable controls (or be associated with such controls) that allows an end-user to select and display some or all of the associated information (e.g., to select the 360° panorama image indicator for acquisition location 210A or perspective photo indicator for acquisition locations 210B or 210C to view some or all of the respective panorama image or perspective photos (e.g., in a manner similar to that of FIGS. 2A-2C). In addition, in this example a user-selectable control 228 is added to indicate a current floor that is displayed for the floor plan, and to allow the end-user to select a different floor to be displayed—in some embodiments, a change in floors or other levels may also be made directly from the floor plan, such as via selection of a corresponding connecting passage in the illustrated floor plan (e.g., the stairs to floor 2). It will be appreciated that a variety of other types of information may be added in some embodiments, that some of the illustrated types of information may not be provided in some embodiments, and that visual indications of and user selections of linked and associated information may be displayed and selected in other manners in other embodiments.

In addition, as noted elsewhere herein, in some embodiments one or more corresponding GUIs may be provided to enable user input to be provided to supplement information automatically determined by the IAEMIGM system, such as for connecting disjoint subgraphs, to edit/remove connections that the user finds incorrect, to adjust relative positions or other automatically determined information, etc. Furthermore, in at least some embodiments, a user's experience may be enhanced by personalization of visualizations for a user based on user-specific information (e.g., the user's history, user-specified preferences, etc.) and/or machine-learned predictions. In addition, crowd-sourced improvement of the overall system for other users may be used in some embodiments, such as by obtaining and incorporating additional images and/or other visual data (e.g., after initial automated determinations are performed by the IAEMIGM system using an initial set of images and optionally additional information), based on each individual user's edits, etc. It will be appreciated that additional types of user-selectable controls may be used.

Additional details related to embodiments of a system providing at least some such functionality of an IAEMIGM system or related system for generating floor plans and associated information and/or presenting floor plans and associated information are included in U.S. Non-Provisional patent application Ser. No. 16/190,162, filed Nov. 14, 2018 and entitled "Automated Mapping Information Generation From Inter-Connected Images" (which includes disclosure of an example Floor Map Generation Manager, or FMGM, system that is generally directed to automated operations for generating and displaying a floor plan or other floor plan of a building using images acquired in and around the building); in U.S. Non-Provisional patent application Ser. No. 16/681,787, filed Nov. 12, 2019 and entitled "Presenting Integrated Building Information Using Three-Dimensional Building Models" (which includes disclosure of an example FMGM system that is generally directed to automated operations for displaying a floor plan or other floor plan of a building and associated information); in U.S. Non-Provisional patent application Ser. No. 16/841,581, filed Apr. 6, 2020 and entitled "Providing Simulated Lighting Information For Three-Dimensional Building Models" (which includes disclosure of an example FMGM system that is generally directed to automated operations for displaying a floor plan or other floor plan of a building and associated information); in U.S. Non-Provisional patent application Ser. No. 17/080,604, filed Oct. 26, 2020 and entitled "Generating floor plans For Buildings From Automated Analysis Of Visual Data Of The Buildings' Interiors" (which includes disclosure of an example VTFM system that is generally directed to automated operations for generating a floor plan or other floor plan of a building using visual data acquired in and around the building); and in U.S. Non-Provisional patent application Ser. No. 16/807,135, filed Mar. 2, 2020 and entitled "Automated Tools For Generating Mapping Information For Buildings" (which includes disclosure of an example MIGM system that is generally directed to automated operations for generating a floor plan or other floor plan of a building using images acquired in and around the building); in U.S. Non-Provisional patent application Ser. No. 17/069,800, filed Oct. 13, 2020 and entitled "Automated Tools For Generating Building Mapping Information" (which includes disclosure of an example MIGM system that is generally directed to automated operations for generating mapping information for a building using images acquired in and around the building); and in U.S. Non-Provisional patent application Ser. No. 17/013,323, filed Sep. 4, 2020 and entitled "Automated Analysis Of Image Contents To Determine The Acquisition Location Of The Image" (which includes disclosure of an example MIGM system that is generally directed to automated operations for generating mapping information for a building based at least in part on images acquired in and around the building); each of which is incorporated herein by reference in its entirety. In addition, further details related to embodiments of a system providing at least some such functionality of a system for using acquired images and/or generated floor plans are included in U.S. Non-Provisional patent application Ser. No. 17/185,793, filed Feb. 25, 2021 and entitled "Automated Usability Assessment Of Buildings Using Visual Data Of Captured In-Room Images" (which includes disclosure of an example Building Usability Assessment Manager, or BUAM, system that is generally directed to automated operations for analyzing visual data from images captured in rooms of a building to assess room layout and other usability information for the building's rooms and optionally for the overall building, and to subsequently using the assessed usability information in one or more further automated manners); each of which is incorporated herein by reference in its entirety.

Various details have been provided with respect to FIGS. 2A-2J, but it will be appreciated that the provided details are non-exclusive examples included for illustrative purposes, and other embodiments may be performed in other manners without some or all such details.

Figure 3:
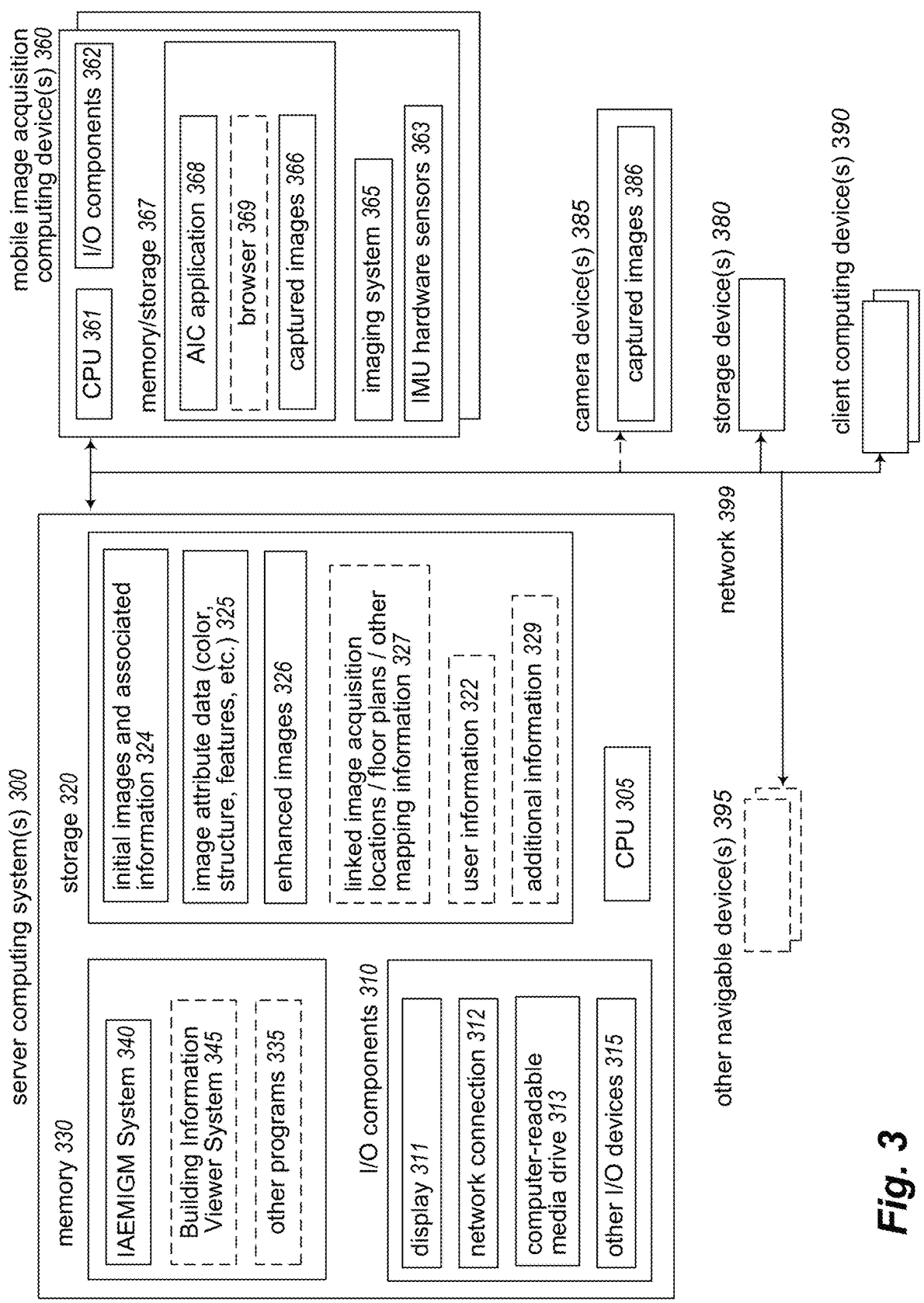
FIG. 3 is a block diagram illustrating a computing system suitable for executing an embodiment of a system that performs at least some of the techniques described in the present disclosure.

FIG. 3 is a block diagram illustrating an embodiment of one or more server computing systems 300 executing an implementation of an IAEMIGM system 340—the server computing system(s) and IAEMIGM system may be implemented using a plurality of hardware components that form electronic circuits suitable for and configured to, when in combined operation, perform at least some of the techniques described herein. In the illustrated embodiment, each server computing system 300 includes one or more hardware central processing units ("CPU") or other hardware processors 305, various input/output ("I/O") components 310, storage 320, and memory 330, with the illustrated I/O components including a display 311, a network connection 312, a computer-readable media drive 313, and other I/O devices 315 (e.g., keyboards, mice or other pointing devices, microphones, speakers, GPS receivers, etc.).

The server computing system(s) 300 and executing IAEMIGM system 340 may communicate with other computing systems and devices via one or more networks 399 (e.g., the Internet, one or more cellular telephone networks, etc.), such as user client computing devices 390 (e.g., used to display or otherwise use generated enhanced images and/or other mapping-related information and optionally associated images or other visual data), mobile image acquisition computing devices 360 (e.g., on which an AIC system application 368 may optionally execute to perform the acquisition of captured images 366), optionally one or more camera devices 385 that perform the acquisition of captured images 386 if the camera devices include networking capabilities or other data transmission capabilities, optionally other storage devices 380 (e.g., used to store and provide additional information related to buildings; used to store and provide captured images, such as instead of or in addition to devices 360 and/or 385; used to store and provide generated enhanced images and/or other generated building mapping information; etc.), and optionally other navigable devices 395 that receive and use generated mapping-related information for navigation purposes (e.g., for use by semi-autonomous or fully autonomous vehicles or other devices).

In the illustrated embodiment, an embodiment of the IAEMIGM system 340 executes in memory 330 in order to perform at least some of the described techniques, such as by using the processor(s) 305 to execute software instructions of the system 340 in a manner that configures the processor(s) 305 and computing system 300 to perform automated operations that implement those described techniques. The illustrated embodiment of the IAEMIGM system may include one or more components, not shown, to each perform portions of the functionality of the IAEMIGM system, and the memory may further optionally execute one or more other programs 335—as one specific example, a copy of the AIC system may execute as one of the other programs 335 in at least some embodiments, such as instead of or in addition to the AIC system 368 on the computing device(s) 360, and as another specific example, a copy of a Building Mapping Information Viewer system 345 may execute to provide visual representations of generated enhanced images and/or other generated building mapping information to end users (e.g., users of client computing devices 390), although in other embodiments such a Mapping Information Viewer system may instead execute on one or more such client computing devices 390. The IAEMIGM system 340 may further, during its operation, store and/or retrieve various types of data on storage 320 (e.g., in one or more databases or other data structures), such as various types of user information 322, acquired image and other associated information 324 (e.g., image acquisition IMU data and/or other metadata, and such as for analysis to generate enhanced images and/or other building mapping-related information; to provide to users of client computing devices 390 for display; etc.), image attribute data 325 of one or more types for the acquired images, generated enhanced images 326, optionally other generated mapping-related information 327 (e.g., generated and sub-graphs of linked acquisition locations, floor plans and/or constituent structural shapes, building and room dimensions for use with associated floor plans, etc.) and/or various types of optional additional information 329 (e.g., additional images and/or videos and/or other visual data, non-visual data captured in a building, annotation information, various analytical information related to presentation or other use of one or more building interiors or other environments captured by an AIC system, etc.).

Some or all of the user client computing devices 390 (e.g., mobile devices), computing devices 360, camera devices 385, storage devices 380, and other navigable devices 395 may similarly include some or all of the same types of components illustrated for server computing system 300. As one non-limiting example, the computing devices 360 are each shown to include one or more hardware CPU(s) 361, I/O components 362, memory and/or storage 367, as well as an imaging system 365 and IMU hardware sensors 363, and with an embodiment of the AIC system 368 on memory/storage 367 and captured images 366 that are generated by the AIC system, as well as optionally other programs such as a browser 369. While particular components are not illustrated for the other navigable devices 395 or other devices/systems 380 and 385 and 390, it will be appreciated that they may include similar and/or additional components.

It will also be appreciated that computing system 300 and the other systems and devices included within FIG. 3 are merely illustrative and are not intended to limit the scope of the present invention. The systems and/or devices may instead each include multiple interacting computing systems or devices, and may be connected to other devices that are not specifically illustrated, including via Bluetooth communication or other direct communication, through one or more networks such as the Internet, via the Web, or via one or more private networks (e.g., mobile communication networks, etc.). More generally, a device or other computing system may comprise any combination of hardware that may interact and perform the described types of functionality, optionally when programmed or otherwise configured with particular software instructions and/or data structures, including without limitation desktop or other computers (e.g., tablets, slates, etc.), database servers, network storage devices and other network devices, smart phones and other cell phones, consumer electronics, wearable devices, digital music player devices, handheld gaming devices, PDAs, wireless phones, Internet appliances, and various other consumer products that include appropriate communication capabilities. In addition, the functionality provided by the illustrated IAEMIGM system 340 may in some embodiments be distributed in various components, some of the described functionality of the IAEMIGM system 340 may not be provided, and/or other additional functionality may be provided.

It will also be appreciated that, while various items are illustrated as being stored in memory or on storage while being used, these items or portions of them may be transferred between memory and other storage devices for purposes of memory management and data integrity. Alternatively, in other embodiments some or all of the software components and/or systems may execute in memory on another device and communicate with the illustrated computing systems via inter-computer communication. Thus, in some embodiments, some or all of the described techniques may be performed by hardware means that include one or more processors and/or memory and/or storage when configured by one or more software programs (e.g., by the IAEMIGM system 340 and/or AIC software 368 executing on server computing systems 300 and/or computing devices 360) and/or data structures, such as by execution of software instructions of the one or more software programs and/or by storage of such software instructions and/or data structures, and such as to perform algorithms as described in the flow charts and other disclosure herein. Furthermore, in some embodiments, some or all of the systems and/or components may be implemented or provided in other manners, such as by consisting of one or more means that are implemented partially or fully in firmware and/or hardware (e.g., rather than as a means implemented in whole or in part by software instructions that configure a particular CPU or other processor), including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the components, systems and data structures may also be stored (e.g., as software instructions or structured data) on a non-transitory computer-readable storage mediums, such as a hard disk or flash drive or other non-volatile storage device, volatile or non-volatile memory (e.g., RAM or flash RAM), a network storage device, or a portable media article (e.g., a DVD disk, a CD disk, an optical disk, a flash memory device, etc.) to be read by an appropriate drive or via an appropriate connection. The systems, components and data structures may also in some embodiments be transmitted via generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). Such computer program products may also take other forms in other embodiments. Accordingly, embodiments of the present disclosure may be practiced with other computer system configurations.

Figure 4A:
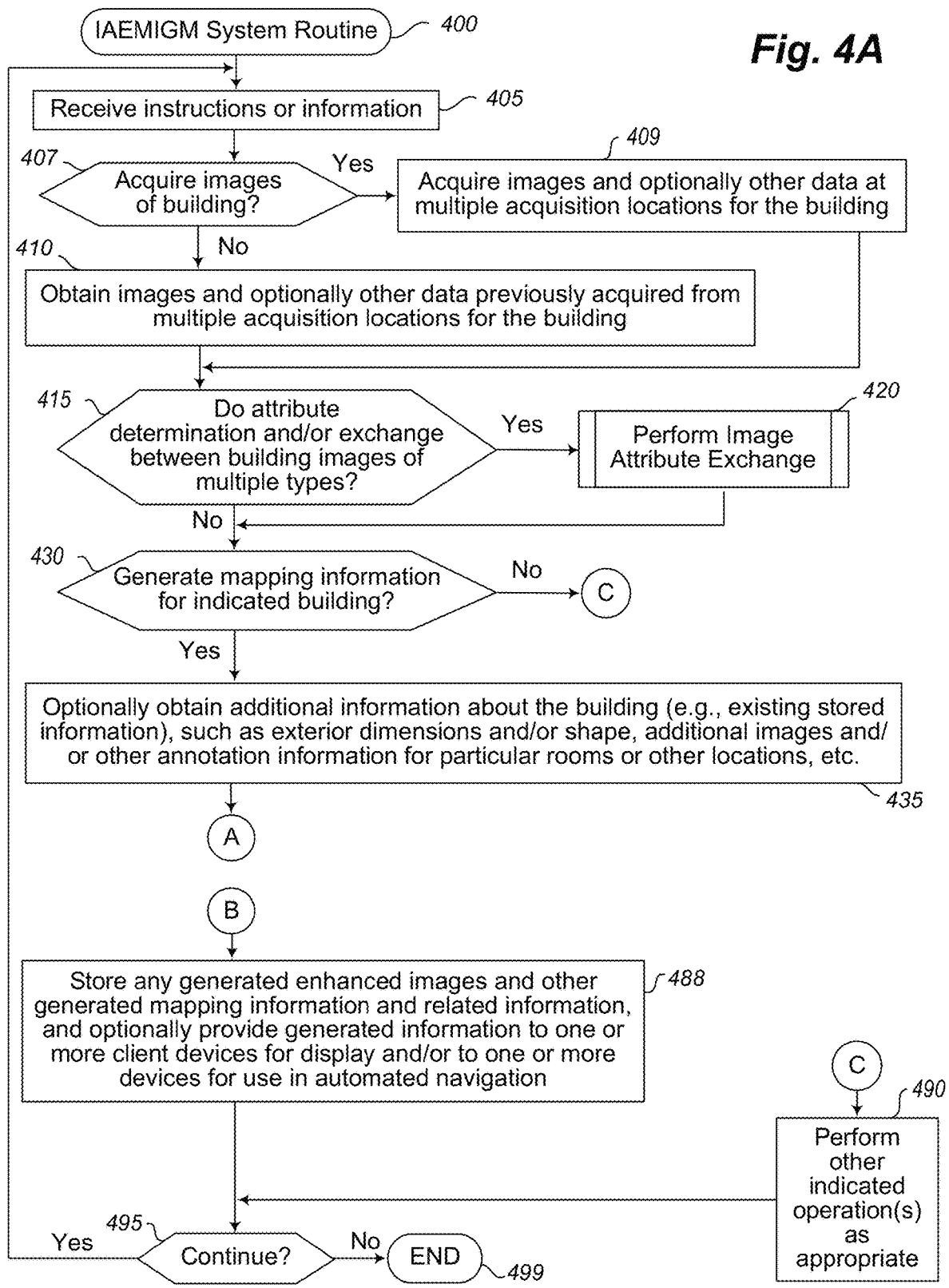

FIGS. 4A-4B illustrate an example embodiment of a flow diagram for an Image Attribute Exchange and Mapping Information Generation Manager (IAEMIGM) System routine 400. The routine may be performed by, for example, execution of the IAEMIGM system 160 of FIG. 1A, the IAEMIGM system 340 of FIG. 3, and/or an IAEMIGM system as described with respect to FIGS. 2D-2J and elsewhere herein, such as to generate enhanced images and/or other mapping-related information (e.g., linked acquisition locations and associated images, at least a partial floor plan, etc.) for a defined area based at least in part on images of multiple types of the area. In the example of FIGS. 4A-4B, the generated mapping information includes enhanced images, linked acquisition locations and associated images, and at least a partial 2D floor plan and 3D computer model of a building, such as a house, but in other embodiments, other types of mapping information may be determined and generated for other types of buildings and used in other manners, as discussed elsewhere herein.

The illustrated embodiment of the routine begins at block 405, where information or instructions are received.

Figure 5:
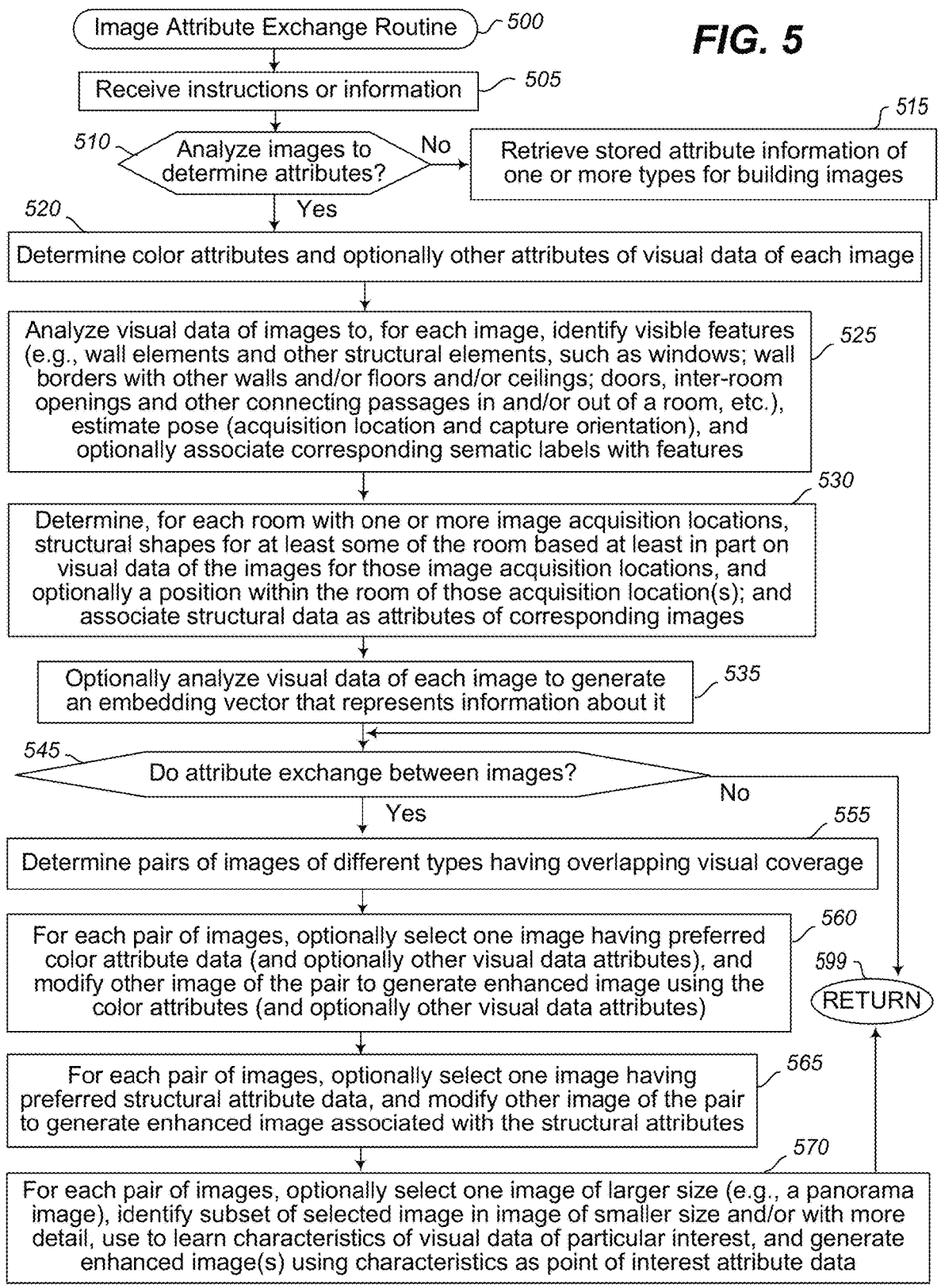
FIG. 5 illustrates an example embodiment of a flow diagram for an Image Attribute Exchange routine in accordance with an embodiment of the present disclosure.

The routine continues to block 407 to determine whether the instructions received in block 405 indicate to currently acquire images of multiple types and optionally other related data at multiple acquisition locations for an indicated building, and if so the routine continues to perform block 409 to do so (optionally waiting for one or more users or devices to move throughout the building and acquire the images and optionally additional information at multiple acquisition locations in multiple rooms of the building, as discussed in greater detail elsewhere herein, with FIG. 7 providing one example embodiment of an AIC system routine for performing at least some such image acquisition), and otherwise continues to block 410 to obtain previously acquired images of multiple types and optionally other associated data for multiple acquisition locations for the building. After blocks 409 or 410, the routine continues to block 415 to determine if the instructions or information received in block 405 indicate to perform attribute determination and/or exchange for building images of multiple types (including to generate one or more enhanced images based on such an attribute data exchange), and if so continues to perform block 420 to do so, with FIG. 5 illustrating one example of a routine for performing such activities.

After block 420, or if it is instead determined in block 415 that the instructions or other information received in block 405 are not to do an attribute determination or exchange, the routine continues instead to block 430 to determine whether the instructions received in block 405 indicate to generate other types of mapping information for an indicated building, and if so the routine continues to perform blocks 435-488 to do so, and otherwise continues to block 480. In particular, in block 435, the routine optionally obtains additional information for the building in addition to the images from blocks 409 or 410, optionally along with metadata information related to image acquisition and/or movement between the acquisition locations, such as may in some situations have been supplied in block 405 along with the corresponding instructions. Such additional information may, for example, be based on acquired annotation information and/or information from one or more external sources (e.g., online databases, information provided by one or more end-users, etc.) and/or information from analysis of acquired images (e.g., initial images and/or additional images, such as for additional images captured at locations different from acquisition locations of the initial images)—such additional obtained information may include, for example, exterior dimensions and/or shape of the building, information about built-in features (e.g., a kitchen island), information about installed fixtures and/or appliances (e.g., kitchen appliances, bathroom items, etc.); information about visual appearance information for building interior locations (e.g., color and/or material type and/or texture for installed items such as floor coverings or wall coverings or surface coverings), information about views from particular windows or other building locations, other information about areas external to the building (e.g., other associated buildings or structures, such as sheds, garages, pools, decks, patios, walkways, gardens, etc.; a type of an external space; items present in an external space; etc.).

After block 435, the routine continues to block 445 to obtain room structural shape data generated from images of the building (e.g., as part of 420), or to otherwise determine such room structural data. For example, for each room inside the building with one or more acquisition locations and associated acquired images, a room shape of the room from data in the image(s) taken inside the room, and optionally a specified position within the room of its acquisition location(s), is determined such as in an automated manner. The operations of block 445 may further include using visual data in the images and/or the acquisition metadata for them to determine, for each room in the building, any connecting passages in or out of the room (e.g., in an automated manner), and any wall elements in the room and their positions (e.g., in an automated manner), such as for windows, inter-wall borders, etc. The operations of block 445 further include using some or all of the other information determined in block 445 to determine estimated room shapes of the rooms. The routine then continues to block 455, where it uses the determined room shapes to create an initial 2D floor plan, such as by connecting inter-room passages in their respective rooms, by optionally positioning room shapes around determined acquisition location positions of the images (e.g., if the acquisition location positions are inter-connected), and by optionally applying one or more constraints or optimizations. Such a floor plan may include, for example, relative position and shape information for the various rooms without providing any actual dimension information for the individual rooms or building as a whole, and may further include multiple linked or associated sub-maps (e.g., to reflect different stories, levels, sections, etc.) of the building. The routine further associates positions of the doors, wall openings and other identified wall elements on the floor plan.

After block 455, the routine optionally performs one or more steps 460-470 to determine and associate additional information with the floor plan. In block 460, the routine optionally estimates the dimensions of some or all of the rooms, such as from analysis of images and/or their acquisition metadata or from overall dimension information obtained for the exterior of the building, and associates the estimated dimensions with the floor plan—it will be appreciated that if sufficiently detailed dimension information were available, architectural drawings, blue prints, etc. may be generated from the floor plan. After block 460, the routine continues to block 465 to optionally associate further information with the floor plan (e.g., with particular rooms or other locations within the building), such as additional existing images with specified positions and/or annotation information. In block 470, the routine further estimates heights of walls in some or all rooms, such as from analysis of images and optionally sizes of known objects in the images, as well as height information about a camera when the images were acquired, and further uses such information to generate a 3D computer model floor plan of the building, with the 2D and 3D floor plans being associated with each other. While not illustrated here, any of the information determined with respect to block 445-470 may similarly be associated with corresponding generated enhanced images (e.g., enhanced images generated in block 420). Additional details are included elsewhere herein regarding example embodiments for the operations of blocks 435-470. In addition, it will be appreciated that while blocks 435-470 are illustrated as separate operations in this example, in some embodiments a single analysis of the images may be performed to acquire or determine multiple types of information, such as those discussed with respect to some or all of blocks 435-470.

After block 470, the routine continues to block 488 to store the generated mapping information and optionally other generated information, and to optionally further use the generated mapping information, such as to provide generated mapping-related information to one or more recipients (e.g., to provide that generated information to one or more other devices for use in automating navigation of those devices and/or associated vehicles or other entities).

If it is instead determined in block 430 that the information or instructions received in block 405 are not to generate mapping information for an indicated building, the routine continues instead to block 490 to optionally perform one or more other indicated operations as appropriate. Such other operations may include, for example, receiving and responding to requests for previously generated computer models and/or floor plans and/or generated enhanced images and/or other generated mapping-related information (e.g., requests for such information to provide it to one or more other devices for use in automated navigation; requests for such information for display on one or more client devices, such as for such information matching one or more specified search criteria; etc.), obtaining and storing information about buildings for use in later operations (e.g., information about dimensions, numbers or types of rooms, total square footage, adjacent or nearby other buildings, adjacent or nearby vegetation, exterior images, overhead images, street-level images, etc.), etc.

After blocks 488 or 490, the routine continues to block 495 to determine whether to continue, such as until an explicit indication to terminate is received, or instead only if an explicit indication to continue is received. If it is determined to continue, the routine returns to block 405 to wait for and receive additional instructions or information, and otherwise continues to block 499 and ends.

FIG. 5 illustrates an example embodiment of a flow diagram for an IAEMIGM Image Attribute Exchange component routine 500. The routine may be performed by, for example, execution of a component of the IAEMIGM system 160 of FIG. 1A, of the IAEMIGM system 340 of FIG. 3, and/or of an IAEMIGM system as described with respect to FIGS. 2D-2J and elsewhere herein, such as to determine and exchange attribute data between images of multiple types for a building in order to generate corresponding enhanced images—in at least some embodiments, the routine may be invoked at block 420 of routine 400 of FIGS. 4A-4B and return to that location when completed. While the illustrated embodiment of the routine 500 generates particular types of enhanced images using particular types of attribute data shared between particular types of images that are paired together for a particular building, it will be appreciated that other embodiments of the routine may operate in other manners, including to use other types of attribute data and/or image types, and/or to use groups of more than two matched images, and further including to do so with respect to multiple buildings (e.g., multiple related buildings, such as on a single property; multiple separate buildings for comparison; etc.).

The illustrated embodiment of the routine 500 begins at block 505, where instructions or other information is received, such as with respect to a particular building and/or with respect to a particular set of images of multiple types acquired for a particular building. The routine then continues to block 510, where it determines whether the instructions or other information received in block 505 indicate to analyze images with respect to a particular building to determine attribute information for them, and if so continues to perform blocks 520-535 to determine corresponding attribute information, and otherwise continues to block 515 to retrieve or otherwise obtain stored attribute information of one or more types for such building images. In block 520, the routine determines color attributes and optionally other visual attributes of visual data of each image. In block 525, the routine then analyzes the visual data of the images to, for each image, determine structural data for information visible in the image, including for features that correspond to wall elements and other structural elements, as well as to estimate pose for each image (both an acquisition location and a capture orientation), and to optionally further determine and associate corresponding semantic labels with identified features. In block 530, the routine then associates the images together by room in the building, and determines, for each room having one or more image acquisition locations (or otherwise having visual coverage of at least some of the room in the images), structural shapes for at least some of the room based at least in part on the visual data of those images, and optionally further determines a position within the room of those acquisition locations (e.g., relative to the positions of the structural shapes) and/or further determines a corresponding room type semantic label for some or all rooms, and to associate the determined structural data and other information from blocks 530 and 535 as attributes of the corresponding images. In block 535, the routine then optionally analyzes the visual data of each image to generate an embedding vector that represents information about it, such as for use in comparing image embedding vectors to determine similar images.

After blocks 515 or 535, the routine continues to block 545, where it determines whether the instructions or other information received in block 505 indicate to perform an attribute exchange between images, such as with respect to attribute data retrieved in block 515 or determined in blocks 520-535. If not, the routine continues to block 599 and returns (including providing any determined and generated information from the routine), and otherwise proceeds to blocks 555-570 to perform the attribute exchange. In particular, in block 555, the routine determines pairs of images of different types having overlapping visual coverage, and in block 560, optionally selects one image in each pair having preferred color attribute data and optionally other visual data attributes (e.g., a perspective photo image) and modifies the other image of the pair (e.g., a panorama image) to generate an enhanced image using those color attributes and optionally other visual data attributes. In block 565, the routine then, for each pair of images, optionally selects one image having preferred structural attribute data (e.g., a panorama image) and modifies the other image of the pair (e.g., a perspective photo image) to generate a corresponding enhanced image that is associated with the structural attribute data (including in at least some embodiments and situations to adapt the structural data to the local coordinate system of that other image of the pair). In block 570, the routine then, for each pair of images, optionally selects one image of larger size or that otherwise has the most visual coverage (e.g., a panorama image), obtains information about identified characteristics of visual data of particular interest (e.g., analyzes the other image of the pair, such as a perspective photo, and/other images to learn the characteristics), and uses the identified characteristics to generate one or more enhanced images from the selected image that each corresponds to a subset and represents an enhanced image of particular interest. After block 570, the routine returns to block 599, including providing any determined and generated information from the routine.

FIG. 6 illustrates an example embodiment of a flow diagram for a Building Information Viewer system routine 600. The routine may be performed by, for example, execution of a building information viewer client computing device 175 and its software system(s) (not shown) of FIG. 1A, the Building Information Viewer system 345 and/or a client computing device 390 of FIG. 3, and/or a mapping information viewer or presentation system as described elsewhere herein, such as to select information for one or more buildings based on user-specific criteria (e.g., one or more generated enhanced images for a building; one or more groups of inter-connected linked images each representing some or all of a building; one or more building 2D floor plans and/or other related mapping information, such as a 3D computer model or a 2.5D computer model; additional information associated with particular locations in the floor plan(s) or other mapping information, such as additional images and/or other types of data acquired in buildings; etc.), and to receive and display corresponding building information to an end-user. In the example of FIG. 6, the presented mapping information is at least in part for the interior of a building (such as a house), but in other embodiments, other types of mapping information may be presented for other types of buildings or environments and used in other manners, as discussed elsewhere herein.

The illustrated embodiment of the routine begins at block 605, where instructions or information are received. After block 605, the routine continues to block 650, where it determines whether the instructions or other information received in block 605 indicate to identify one or more target buildings whose information is to be presented based at least in part on user-specific criteria, and if not continues to block 660 to obtain an indication of a target building to use from the end-user (e.g., based on a current user selection, such as from a displayed list or other user selection mechanism; based on information received in block 605; etc.). Otherwise, the routine continues to block 655, where it obtains indications of one or more search criteria to use (e.g., one or more initial buildings to use for which to identify similar target buildings, such as from current user selections and/or from previous user selections or other previous user activities and/or as indicated in the information or instructions received in block 605; one or more explicit search terms; etc.). The routine then obtains information about one or more corresponding target buildings, such as by requesting the information from the IAEMIGM system and/or an associated storage system, and selects a best match target building to initially further use if information about multiple target buildings is returned (e.g., the returned other building with the highest similarity rating to one or more initial buildings or for one or more specified search criteria, or using another selection technique indicated in the instructions or other information received in block 605 or otherwise previously specified, such as a preference for the end-user). In some embodiments and situations, one or more target buildings may be selected based on both one or more other buildings and one or more specified criteria.

After blocks 655 or 660, the routine continues to block 670 to determine whether the instructions or other information received in block 605 are to display one or more generated enhanced images, such as with respect to the best match target building from block 655 or other indicated target building in block 660, and if so continues to block 675 to obtain one or more indications of one or more corresponding enhanced images (e.g., some or all enhanced images associated with the target building), and to display or otherwise provide information about the enhanced image(s) to one or more users (e.g., provides information about multiple available enhanced images, and displays one or more particular such enhanced images when selected or otherwise indicated by a user). While not illustrated in this example embodiment, in some embodiments an enhanced image that is displayed may include one or more user-selectable controls corresponding to available associated information, and if so the routine may further perform additional processing in a manner similar to that discussed with respect to blocks 615-622 to enable the user to further interact with and receive additional associated information.

After block 675, or if it was instead determined in block 670 that the instructions or other information received in block 605 are not to display one or more generated enhanced images, the routine continues to block 610 to determine whether the instructions or other information received in block 605 are to display or otherwise present other types of information about a target building (e.g., using a floor plan and/or a group of inter-connected linked images that includes information about the interior of the target building), such as the best match target building from block 655 or other indicated target building in block 660, and if not continues to block 690. Otherwise, the routine proceeds to block 612 to retrieve the other building information for the target building (optionally including indications of associated or linked information for the building interior and/or a surrounding location, such as with additional images taken within or around the building), and selects an initial view of the retrieved information (e.g., a view of the floor plan, of at least some of the 3D computer model, an image from the group of inter-connected linked images, a visualization view of multiple linked images, etc.). In block 615, the routine then displays or otherwise presents the current view of the retrieved information, and waits in block 617 for a user selection. After a user selection in block 617, if it is determined in block 620 that the user selection corresponds to the current target building location (e.g., to change the current view of the displayed mapping information for that target building), the routine continues to block 622 to update the current view in accordance with the user selection, and then returns to block 615 to update the displayed or otherwise presented information accordingly. The user selection and corresponding updating of the current view may include, for example, displaying or otherwise presenting a piece of associated linked information that the user selects (e.g., a particular image associated with a displayed visual indication of a determined acquisition location), changing how the current view is displayed (e.g., zooming in or out; rotating information if appropriate; selecting a new portion of the floor plan and/or 3D computer model to be displayed or otherwise presented, such as with some or all of the new portion not being previously visible, or instead with the new portion being a subset of the previously visible information; selecting a different image from a group of inter-connected linked images to be displayed or otherwise presented, such as to display an initial subset view of that image; etc.). In other embodiments and situations, the updating of the current view in accordance with the user selection may include interacting with and retrieving information from another system, such as from the IAEMIGM system.

If it is instead determined in block 610 that the instructions or other information received in block 605 are not to present information representing a building interior, the routine continues instead to block 690 to perform any other indicated operations as appropriate, such as any housekeeping tasks, to configure parameters to be used in various operations of the system (e.g., based at least in part on information specified by a user of the system, such as a user of a mobile device who captures one or more building interiors, an operator user of the AIC system, etc.), to obtain and store other information about users of the routine (e.g., presentation and/or search preferences of a current user), to respond to requests for generated and stored information, etc.

Following block 690, or if it is determined in block 620 that the user selection does not correspond to the current target building location, the routine proceeds to block 695 to determine whether to continue, such as until an explicit indication to terminate is received, or instead only if an explicit indication to continue is received. If it is determined to continue (including in situations in which the user made a selection in block 617 related to a new target building location to present), the routine returns to block 605 to await additional instructions or information (or to continue on past block 605 and 650 to blocks 670 or 610 if the user made a selection in block 617 related to a new building location to present), and if not proceeds to step 699 and ends. In the illustrated embodiment, the routine in block 655 selects a best match target building to use if multiple target building candidates were returned to that block—in at least some embodiments, a queue of other such returned target buildings that are not first selected as best matches may further be saved and subsequently used (e.g., for the user to consecutively display or otherwise present information for multiple such other buildings), such as with the user selection in block 617 optionally indicating to select and use a next returned other building from such a queue, and/or information about multiple buildings made be displayed together (e.g., simultaneously or in succession, such as to enable comparison of information for the multiple buildings).

FIG. 7 illustrates an example flow diagram of an embodiment of an Automated Image Capture (AIC) System routine 700. The routine may be performed by, for example, the AIC system application 368 of FIG. 3, an AIC system application 162 of FIG. 1A, and/or an AIC system as otherwise described with respect to FIGS. 2A-2C and elsewhere herein, such as to capture images of one or more types at acquisition locations within buildings or other structures, such as for use in subsequent generation of related floor plans and/or other mapping information. While portions of the example routine 700 are discussed with respect to acquiring particular types of images at particular acquisition locations in particular manners, it will be appreciated that this or a similar routine may be used to acquire video or other types of data (e.g., audio), whether instead of or in addition to such images. In addition, while the illustrated embodiment acquires and uses information from the interior of a target building, it will be appreciated that other embodiments may perform similar techniques for other types of data, including for non-building structures and/or for information external to one or more target buildings of interest. Furthermore, in some embodiments, some of the routine may be executed on a mobile device used by a user to acquire image information while other of the routine may be executed on one or more other computing devices (e.g., by a server computing system remote from such a mobile device and/or by one or more other computing devices at a location of the mobile device, such as in a distributed peer-to-peer manner using local inter-connections at that location).

The illustrated embodiment of the routine begins at block 705, where instructions or information are received. At block 710, the routine determines whether the received instructions or information indicate to acquire data representing a building interior, and if not continues to block 790. Otherwise, the routine proceeds to block 712 to receive an indication (e.g., from a user of a mobile image acquisition device) to begin the image acquisition process at a first acquisition location. After block 712, the routine proceeds to block 715 to capture image information (e.g., one or more perspective photo images and/or panorama images, such as using different capture orientations) at the acquisition location in the interior of the target building of interest. The routine 700 may also optionally capture additional information, such as annotation and/or other information from a user regarding the acquisition location and/or the surrounding environment for a captured image, IMU data and/or other image acquisition metadata (e.g., with respect to motion of the computing device during the image capture), etc. While not illustrated in the example embodiment, the routine may further in some embodiments determine and provide one or more corrective guidance cues to the user regarding the image capture, such as corresponding to motion of the mobile device, quality of the sensor data and/or visual data being captured, associated lighting/environmental conditions, advisability of capturing one or more additional images from the acquisition location at different capture orientations, and any other suitable aspects of capturing one or more images.

After block 715 is completed, the routine continues to block 720 to determine if there are more acquisition locations at which to acquire images, such as based on corresponding information provided by the user of the mobile device. If so, the routine continues to block 722 to optionally initiate the capture of linking information (such as acceleration data, additional visual data, etc.) during movement of the mobile device along a travel path away from the current acquisition location and towards a next acquisition location within the building interior. As described elsewhere herein, the captured linking information may include additional sensor data recorded during such movement (e.g., from one or more IMU, or inertial measurement units, on the mobile device or otherwise carried by the user, and/or additional image or video information). Initiating the capture of such linking information may be performed in response to an explicit indication from a user of the mobile device or based on one or more automated analyses of information recorded from the mobile device. In addition, the routine may further optionally monitor the motion of the mobile device in some embodiments during movement to the next acquisition location, and determine and provide one or more corrective guidance cues to the user regarding the motion of the mobile device, quality of the sensor data and/or video information being captured, associated lighting/environmental conditions, advisability of capturing a next acquisition location, and any other suitable aspects of capturing the linking information. Similarly, the routine may optionally obtain annotation and/or other information from the user regarding the travel path, such as for later use in presentation of information regarding that travel path or a resulting inter-panorama connection link. In block 724, the routine determines that the mobile device has arrived at the next acquisition location (e.g., based on an indication from the user, based on the forward movement of the user stopping for at least a predefined amount of time, etc.), for use as the new current acquisition location, and returns to block 715 in order to perform the acquisition location image acquisition activities for the new current acquisition location.

If it is instead determined in block 720 that there are not any more acquisition locations at which to acquire image information for the current building or other structure, the routine proceeds to block 781 to optionally analyze the acquisition location information for the building or other structure, such as to identify possible additional coverage (and/or other information) to acquire within the building interior. For example, the AIC system may provide one or more notifications to the user regarding the information acquired during capture of images for the multiple acquisition locations and optionally corresponding linking information, such as if it determines that one or more pieces or parts of the recorded information are of insufficient or undesirable quality, or do not appear to provide complete coverage of the building. After block 781, the routine continues to block 783 to optionally preprocess the acquired images before their subsequent use for generating related mapping information, such as to use a specific format and/or to be of a defined type that presents information in a specific manner (e.g., using a perspective linear planar format, etc.). After block 783, the routine continues to block 788 to store the images and any associated generated or obtained information for later use. FIGS. 4A-4B illustrate one example of a routine for generating mapping-related information for a building from such captured image information.

If it is instead determined in block 710 that the instructions or other information recited in block 705 are not to acquire images and other data representing a building interior, the routine continues instead to block 790 to perform any other indicated operations as appropriate, such as any housekeeping tasks, to configure parameters to be used in various operations of the system (e.g., based at least in part on information specified by a user of the system, such as a user of a mobile device who captures one or more building interiors, an operator user of the AIC system, etc.), to respond to requests for generated and stored information (e.g., to identify one or more captured images that match one or more specified search criteria, etc.), to obtain and store other information about users of the system, etc.

Following blocks 788 or 790, the routine proceeds to block 795 to determine whether to continue, such as until an explicit indication to terminate is received, or instead only if an explicit indication to continue is received. If it is determined to continue, the routine returns to block 705 to await additional instructions or information, and if not proceeds to step 799 and ends.

Aspects of the present disclosure are described herein with reference to flowchart illustrations and/or block diagrams of methods, apparatus (systems/devices), and computer program products according to embodiments of the present disclosure. It will be appreciated that each block the flowchart illustrations and/or block diagrams, and combinations of such blocks, can be implemented by computer-readable program instructions. It will be further appreciated that in some implementations the functionality provided by the routines discussed above may be provided in alternative ways, such as being split among more routines or consolidated into fewer routines. Similarly, in some implementations illustrated routines may provide more or less functionality than is described, such as when other illustrated routines instead lack or include such functionality respectively, or when the amount of functionality that is provided is altered. In addition, while various operations may be illustrated as being performed in a particular manner (e.g., in serial or in parallel, or synchronous or asynchronous) and/or in a particular order, in other implementations the operations may be performed in other orders and in other manners. Any data structures discussed above may also be structured in different manners, such as by having a single data structure split into multiple data structures and/or by having multiple data structures consolidated into a single data structure. Similarly, in some implementations illustrated data structures may store more or less information than is described, such as when other illustrated data structures instead lack or include such information respectively, or when the amount or types of information that is stored is altered.

From the foregoing it will be appreciated that, although specific embodiments have been described herein for purposes of illustration, various modifications may be made without deviating from the spirit and scope of the invention. Accordingly, the invention is not limited except as by corresponding claims and the elements recited by those claims. In addition, while certain aspects of the invention may be presented in certain claim forms at certain times, the inventors contemplate the various aspects of the invention in any available claim form. For example, while only some aspects of the invention may be recited as being embodied in a computer-readable medium at particular times, other aspects may likewise be so embodied.

What is claimed is:

1. A computer-implemented method comprising:
obtaining, by one or more computing systems, a plurality of images of multiple types taken at a plurality of acquisition locations associated with a house, wherein the plurality of images of multiple types includes multiple panorama images in equirectangular format and include multiple photos in perspective format, and wherein the plurality of acquisition locations includes, for each of multiple rooms of the house, at least one acquisition location in that room;
determining, by the one or more computing systems and for each of the panorama images, structural attributes of one of the multiple rooms based at least in part on analysis of first visual data of that panorama image, and further using determined structural attributes to generate at least partial room shapes for the multiple rooms;
determining, by the one or more computing systems and for each of the perspective photos, chroma attributes for at least a portion of one of the multiple rooms based at least in part on second visual data of that perspective photo;
determining, by the one or more computing systems, multiple pairs of images, wherein each pair of images includes one of the multiple perspective photos and one of the multiple panorama images that have shared visible features for one of the multiple rooms in the first visual data of that one panorama image and the second visual data of that one perspective photo;
generating, by the one or more computing systems and for each of the multiple pairs of images, a first enhanced panorama image by modifying the panorama image of that pair to use the determined chroma attributes for the perspective photo of that pair, and a second enhanced perspective photo by modifying the perspective photo of that pair to associate the determined structural attributes for the panorama image of that pair with the second enhanced perspective photo;
generating, by the one or more computing systems, mapping information for the house based at least in part on visual data of the plurality of images, including using the generated first enhanced panorama image and the generated second enhanced perspective photo for each of at least some of the multiple pairs of images as part of generating at least a partial floor plan for the house; and
presenting, by the one or more computing systems, at least some of the generated mapping information for the house, including presenting at least one generated first enhanced panorama image and at least one generated second enhanced perspective photo.

2. The computer-implemented method of claim 1 wherein each of the panorama images includes 360 degrees of visual coverage around a vertical axis, and wherein the determining of the multiple pairs of images further includes:
generating, by the one or more computing systems, a plurality of sub-images from the multiple panorama images, including, for each of the panorama images, generating multiple sub-images that each includes a distinct subset of the visual data of that panorama image and is in a perspective format;
generating, by the one or more computing systems and for each of the plurality of sub-images, one or more first global features that describe visual data of that sub-image as a whole, and multiple first local features that describe individual portions of the visual data of that sub-image;
generating, by the one or more computing systems and for each of the multiple photos, one or more second global features that describe the visual data of that photo as a whole, and multiple second local features that describe individual portions of the visual data of that photo;
determining, by the one or more computing systems and for each of the multiple photos, a group of the plurality of sub-images having first global features that match the second global features of that photo, and selecting one sub-image from the determined group whose multiple first local features best match the multiple second local features of that photo;
generating, by the one or more computing systems and for each of the multiple photos, one of the pairs of images that includes that photo and includes the panorama image from which the selected one sub-image for that photo is generated; and
aligning, by the one or more computing systems and for each of the multiple pairs of images, the first visual data of the one panorama image for that pair of images and the second visual data of the one perspective photo for that pair of images to share a common coordinate system,
and wherein the generating of the first enhanced panorama image and he second enhanced perspective photo for each of the multiple pairs of images includes using the aligned first visual data of the one panorama image for that pair of images and the second visual data of the one perspective photo for that pair of images.

3. The computer-implemented method of claim 1 further comprising:
analyzing, by the one or more computing systems and for each of at least some of the multiple pairs of images, a subset of the panorama image of that pair that is visible in the perspective photo of that pair to determine characteristics associated with the subset of the panorama image, and combining characteristics determined from the at least some pairs of images to identify image characteristics associated with areas of the house that are of interest;
generating, by the one or more computing systems and for each of one or more additional panorama images that are not part of the at least some pairs of images, an additional image of interest by using the identified image characteristics to select a subset of that additional panorama image to include in that additional image of interest; and
presenting, by the one or more computing systems, at least one generated additional image of interest.

4. A computer-implemented method comprising:

obtaining, by one or more computing systems, a plurality of images of multiple types taken at a plurality of acquisition locations associated with a building, wherein the plurality of images includes multiple perspective photos and multiple panorama images, and wherein the plurality of acquisition locations includes, for each of multiple rooms of the building, at least one acquisition location in that room;

determining, by the one or more computing systems, multiple pairs of images from the plurality of images, wherein each pair of images includes one of the multiple perspective photos and one of the multiple panorama images that have overlapping visual coverage for at least one of the multiple rooms;

generating, by the one or more computing systems and for each of the multiple pairs of images, an enhanced image by modifying a first image of the pair to use data associated with a second image of the pair, including selecting at least one type of attribute that is associated with the second image of the pair and adding data for the selected at least one type of attribute to the modified first image;

generating, by the one or more computing systems and using at least one generated enhanced image, mapping information for the building based at least in part on visual data of the plurality of images; and presenting, by the one or more computing systems, at least some of the generated mapping information for the building.

5. The computer-implemented method of claim 4 wherein the first image of one of the pairs of images is the one panorama image for the one pair and the second image of the one pair of images is the one perspective photo for the one pair, wherein the method further comprises determining chroma attributes for the one perspective photo of the one pair, and wherein the generating of the enhanced image for the one pair includes generating an enhanced panorama image by modifying the one panorama image for the one pair to use the determined chroma attributes in place of other chroma attributes for the panorama image for the one pair.

6. The computer-implemented method of claim 5 further comprising:

determining, by the one or more computing systems, at least one of a structural shape visible in the one panorama image for the one pair and a structural wall feature visible in the one panorama image for the one pair;

determining, by the one or more computing systems, one or more positions in the one panorama image of the at least one of the structural shape or the structural wall feature; and generating, by the one or more computing systems, an enhanced perspective photo for the one pair by modifying the one perspective photo for the one pair to associate the at least one of the structural shape or the structural wall feature at one or more other positions in visual data of the modified one perspective photo of the at least one of the structural shape or the structural wall feature, and wherein the generating of the mapping information for the building further uses the generated enhanced panorama image and the generated enhanced perspective photo.

7. The computer-implemented method of claim 4 wherein the first image of one of the pairs of images is the one perspective photo for the one pair and the second image of the one pair of images is the one panorama image for the one pair, wherein the method further comprises determining at least one of a structural shape visible in the one panorama image for the one pair and a structural wall feature visible in the one panorama image for the one pair, and determining one or more positions in the one panorama image of the at least one of the structural shape or the structural wall feature, and wherein the generating of the enhanced image for the one pair includes generating an enhanced perspective photo by modifying the one perspective photo for the one pair to associate the at least one of the structural shape or the structural wall feature at one or more other positions in visual data of the modified one perspective photo of the at least one of the structural shape or the structural wall feature.

8. The computer-implemented method of claim 4 wherein the first image of one of the pairs of images is the one panorama image for the one pair and the second image of the one pair of images is the one perspective photo for the one pair, wherein the method further comprises:

analyzing, by the one or more computing systems and for each of at least some of the multiple pairs of images other than the one pair, a subset of the panorama image of that pair that is visible in the perspective photo of that pair to determine characteristics associated with the subset of the panorama image; and combining, by the one or more computing systems, characteristics determined from the at least some pairs of images to identify image characteristics associated with some areas, and wherein the generating of the enhanced image for the one pair includes using the identified image characteristics and visual data of the perspective photo of the one pair to select a subset of the panorama image of the one pair to use as the enhanced image for the one pair.

9. The computer-implemented method of claim 4 wherein each of the panorama images includes 360 degrees of visual coverage around a vertical axis, and wherein the determining of the multiple pairs of images further includes:

generating, by the one or more computing systems, a plurality of sub-images from the multiple panorama images, including, for each of the panorama images, generating multiple sub-images that each includes a distinct subset of the visual data of that panorama image and is in a perspective format;

generating, by the one or more computing systems and for each of the plurality of sub-images, one or more first global features that describe visual data of that sub-image as a whole, and multiple first local features that describe individual portions of the visual data of that sub-image;

generating, by the one or more computing systems and for each of the multiple perspective photos, one or more second global features that describe the visual data of that perspective photo as a whole, and multiple second local features that describe individual portions of the visual data of that perspective photo;

determining, by the one or more computing systems and for each of at least some of the multiple perspective photos, a group of the plurality of sub-images having first global features that match the second global features of that perspective photo, and selecting one sub-image from the determined group whose multiple first local features match the multiple second local features of that perspective photo; and generating, by the one or more computing systems and for each of the at least some perspective photos, one of the pairs of images that includes that perspective photo and includes the panorama image from which the selected one sub-image for that photo is generated.

10. The computer-implemented method of claim 4 wherein the provided at least some generated mapping information is the at least one generated enhanced image, and wherein the presenting of the at least some generated mapping information by the one or more computing systems includes transmitting, by the one or more computing systems and over one or more computer networks, the at least some generated mapping information to a client computing device for display on the client computing device to one or more users.

11. The computer-implemented method of claim 4 wherein the multiple perspective photos are each in a perspective format and have an angle of view less than 90 degrees, wherein the multiple panorama images are each in an equirectangular format and have an angle of view of at least 180 degrees, wherein the plurality of acquisition locations include one or more acquisition locations external to the building, wherein the determining of the multiple pairs of images includes analyzing visual data of the plurality of images to identify matching visual features in the one perspective photo and the one panorama image of each of the multiple pairs, and wherein the generated mapping information includes at least a partial floor plan for the building that is based on visual data of the plurality of images.

12. A system, comprising:
one or more hardware processors of one or more computing systems; and
one or more memories with stored instructions that, when executed by at least one of the one or more hardware processors, cause the one or more computing systems to perform automated operations including at least:
obtaining a plurality of images of multiple types taken at a plurality of acquisition locations associated with a building, wherein the plurality of acquisition locations includes, for each of multiple rooms of the building, at least one acquisition location in that room;
determining multiple pairs of images from the plurality of images, wherein each pair of images includes a first image of a first type of the multiple types and a second image of a distinct second type of the multiple types, and wherein the first and second images of each pair have overlapping visual coverage of at least one room of the multiple rooms;
generating, for each of the multiple pairs of images, an enhanced image by modifying the first image of the pair to use data associated with the second image of the pair, including selecting at least one type of attribute that is associated with the second image of the pair and adding data for the selected at least one type of attribute in association with the modified first image; and
providing at least some generated mapping information for the building for display, wherein the at least some generated mapping information is based at least in part on at least one generated enhanced image.

13. The system of claim 12 wherein the first type of the plurality of images includes photos in a perspective format and having an angle of view less than 90 degrees, wherein the second type of the plurality of images includes panorama images in an equirectangular format and having an angle of view of at least 180 degrees, and wherein the stored instructions include software instructions that, when executed by the at least one hardware processor, cause the one or more computing systems to perform automated operations including at least generating the mapping information for the building based at least in part on visual data of the plurality of images and including using at least one generated enhanced image.

14. The system of claim 12 wherein the provided at least some generated mapping information is the at least one generated enhanced images.

15. The system of claim 12 wherein the first image of one of the pairs of images is a panorama image and the second image of the one pair of images is a perspective photo, wherein the automated operations further include determining chroma attributes for the perspective photo of the one pair, and wherein the generating of the enhanced image for the one pair includes generating an enhanced panorama image by modifying the panorama image for the one pair to use the determined chroma attributes.

16. The system of claim 15 wherein the modifying of the panorama image for the one pair to use the determined chroma attributes further includes retaining, in the modified panorama image, luminance attributes of the panorama image for the one pair.

17. The system of claim 12 wherein the first image of one of the pairs of images is a perspective photo and the second image of the one pair of images is a panorama image, wherein the automated operations further include determining one or more structural shapes visible in the panorama image and one or more positions in the panorama image of the one or more structural shapes, and wherein the generating of the enhanced image for the one pair includes generating an enhanced perspective photo by modifying the perspective photo to associate at least one of the one or more structural shapes at one or more other positions in visual data of the modified perspective photo of the at least one structural shapes.

18. The system of claim 12 wherein the first image of one of the pairs of images is a perspective photo and the second image of the one pair of images is a panorama image, wherein the automated operations further include determining one or more structural wall features visible in the panorama image for the one pair and one or more positions in the panorama image of the one or more structural wall features, and wherein the generating of the enhanced image for the one pair includes generating an enhanced perspective photo by modifying the perspective photo to associate at least one of the one or more structural wall features at one or more other positions in visual data of the modified perspective photo of the at least one structural wall features.

19. The system of claim 12 wherein the first image of one of the pairs of images is a panorama image and the second image of the one pair of images is a perspective photo, wherein the automated operations further include:
analyzing, for each of at least some of the multiple pairs of images other than the one pair, a subset of a panorama image of that pair that is visible in a perspective photo of that pair to determine characteristics associated with the subset of that panorama image; and
combining characteristics determined from the at least some pairs of images to identify image characteristics associated with some areas of the building,
and wherein the generating of the enhanced image for the one pair includes using the identified image characteristics and visual data of the perspective photo of the one pair to select a subset of the panorama image of the one pair to use as the enhanced image for the one pair.

20. The system of claim 19 wherein the determined characteristics are associated with subsets of the building that at least one of have visual data of one or more defined areas of the building or have visual data with details of one or more defined subject areas of interest or have visual data matching one or more defined types of characteristics.

21. The system of claim 12 wherein the generating of the enhanced image for one of the pairs of images further includes selecting one or more attributes from a group including at least light balance and saturation and sharpness and style, and adding data for each of the selected one or more attributes from the second image of the pair to the modified first image.

22. The system of claim 12 wherein the generating of the enhanced image for one of the pairs of images further includes selecting one or more attributes from a group including at least user annotations and semantic labels, and adding data for each of the selected one or more attributes from the second image of the pair in association with the modified first image.

23. The system of claim 12 wherein the multiple types of images include at least one of first and second types that include daytime and nighttime versions of at least some common areas associated with the building, or first and second types that include visual data and non-visual data of at least some common areas associated with the building, or first and second types that include versions acquired at different time periods of at least some common areas associated with the building, and wherein the generating of the enhanced image for at least one pair of the multiple pairs includes exchanging data between at least one of the daytime and nighttime versions, or the visual data and the non-visual data, or the versions acquired at different time periods.

24. The system of claim 12 wherein one of the multiple types is a panorama image in equirectangular format and another of the multiple types is a perspective photo in perspective format, and wherein the determining of the multiple pairs of images further includes:
  generating a plurality of sub-images from multiple panorama images of the plurality of images, including, for each of the panorama images, generating multiple sub-images that each includes a distinct subset of the visual data of that panorama image and is in a perspective format;
  generating, for each of the plurality of sub-images, one or more first global features that describe visual data of that sub-image as a whole, and multiple first local features that describe individual portions of the visual data of that sub-image;
  generating, for each of multiple perspective photos of the plurality of images, one or more second global features that describe the visual data of that perspective photo as a whole, and multiple second local features that describe individual portions of the visual data of that perspective photo;
  determining, for each of at least some of the multiple perspective photos, a group of the plurality of sub-images having first global features that match the second global features of that perspective photo, and selecting one sub-image from the determined group whose multiple first local features match the multiple second local features of that perspective photo; and
  generating, for each of the at least some perspective photos, one of the pairs of images that includes that perspective photo and includes the panorama image from which the selected one sub-image for that photo is generated.

25. The system of claim 12 wherein the generating of the enhanced image for one of the pairs of images further includes adding data for one or more depth attributes from the second image of the one pair in association with the modified first image.

26. The system of claim 12 wherein the generating of the enhanced image for one of the pairs of images further includes adding data for one or more location attributes from the second image of the one pair in association with the modified first image.

27. The system of claim 12 wherein the determining of one of the pairs of images further includes using data for one or more depth attributes from at least one of the first image or the second image of the pair.

28. The system of claim 12 wherein the determining of one of the pairs of images further includes using data for one or more location attributes from at least one of the first image or the second image of the pair.

29. The system of claim 12 wherein the automated operations further include at least one of:
  performing the generating of the enhanced image for one of the multiple pairs of images by identifying one or more additional second images of the second type that each has overlapping visual coverage with the first image of the one pair, and by combining data for the selected at least one type of attribute from the second image of the one pair and the one or more additional second images, and wherein the adding of the data in association with the modified first image of the one pair uses the combined data; or
  performing the generating of the enhanced image for one of the multiple pairs of images by using a noise profile for the second image of the one pair to augment one or more portions of the modified first image for the one pair; or
  performing generating of the at least some mapping information by, for one of the multiple pairs of images, associating the second image of the one pair with one or more positions on the modified first image for the one pair as a user-selectable point of interest; or
  performing generating of the at least some mapping information by generating at least a partial floor plan for the building using visual data of the plurality of images, and by, for one of the multiple pairs of images, associating at least one of the first image of the one pair or the second image of the one pair with one or more positions on the at least partial floor plan as a user-selectable point of interest; or
  updating, after the providing of the at least some generated mapping information, the generated mapping information based on one or more additional acquired images at one or more additional acquisition locations associated with the building, including to generate one or more additional enhanced images by exchanging attribute data between images of one or more additional pairs of images that each includes at least one of the additional acquired images; or
  performing generating of the at least some mapping information by generating, for one of the multiple pairs of images, an additional enhanced image having visual data combined from the first image of the one pair and from the second image of the one pair; or
  performing generating of the at least some mapping information by generating, for one of the multiple pairs of images, an additional enhanced image by using one or more machine learning models and visual data from the first image of the one pair and from the second image of the one pair to provide an increase in apparent resolution for the additional enhanced image.

30. The system of claim 12 further comprising a client computing device of a user, wherein the plurality of acquisition locations include one or more acquisition locations external to the building, wherein the automated operations include generating the mapping information for the building by using visual data of the plurality of images to generate at least a partial floor plan for the building, wherein the providing of the at least some generated mapping information for the building includes transmitting the at least some generated mapping information for the building over one or more computer networks to the client computing device, and wherein the automated operations further include receiving by the client computing device and displaying on the client computing device the provided at least some generated mapping information, and transmitting, by the client computing device and to the one or more computing systems, information from an interaction of the user with a user-selectable control on the client computing device to cause a modification of information displayed on the client computing device for the building.

31. A non-transitory computer-readable medium having stored contents that cause one or more computing systems to perform automated operations, the automated operations including at least:
obtaining, by the one or more computing systems, a plurality of images of multiple types taken at a plurality of acquisition locations associated with a building, wherein the plurality of images of multiple types includes multiple perspective photos and multiple panorama images, and wherein the plurality of acquisition locations includes, for each of multiple rooms of the building, at least one acquisition location in that room;
generating, by the one or more computing systems and for each of multiple pairs of images each including one of the multiple perspective photos and one of the multiple panorama images having overlapping visual coverage for at least one of the multiple rooms, enhanced images by exchanging attribute data between the one perspective photo and the one panorama image of that pair, by:
generating, by the one or more computing systems, an enhanced perspective photo by modifying the one perspective photo of that pair to use data for a first type of attribute from the one panorama image of that pair; and
generating, by the one or more computing systems, an enhanced panorama image by modifying the one panorama image of that pair to use data for a second type of attribute from the one perspective photo of that pair, wherein the first and second types of attributes are distinct; and
providing, by the one or more computing systems, at least some generated mapping information for the building for display, wherein the at least some generated mapping information is based at least in part on at least some of the generated enhanced images.

32. The non-transitory computer-readable medium of claim 31 wherein the stored contents include software instructions that, when executed by the one or more computing systems, cause the one or more computing systems to perform further automated operations including at least generating the mapping information for the building based at least in part on visual data of the plurality of images and including using the at least some generated enhanced images, wherein the at least some generated enhanced images include one or more generated enhanced perspective photos and include one or more generated enhanced panorama images.

33. The non-transitory computer-readable medium of claim 31 wherein the provided at least some generated mapping information is one or more of the at least some generated enhanced images.

34. The non-transitory computer-readable medium of claim 31 wherein the first type of the plurality of images includes the multiple perspective photos that are each in a perspective format and have an angle of view less than 90 degrees, wherein the second type of the plurality of images includes the multiple panorama images that are each in an equirectangular format and have an angle of view of at least 180 degrees, and wherein the automated operations further include determining, by the one or more computing systems, the multiple pairs of images, including analyzing visual data of the plurality of images to identify matching visual features in the one perspective photo and the one panorama image of each of the multiple pairs.

35. The non-transitory computer-readable medium of claim 31 wherein the plurality of acquisition locations include one or more acquisition locations external to the building, wherein the automated operations include generating the mapping information for the building by using visual data of the plurality of images to generate at least a partial floor plan for the building, wherein the providing of the at least some generated mapping information for the building includes transmitting the at least some generated mapping information for the building over one or more computer networks to a client computing device of a user, and wherein the automated operations further include receiving by the client computing device and displaying on the client computing device the provided at least some generated mapping information, and transmitting, by the client computing device and to the one or more computing systems, information from an interaction of the user with a user-selectable control on the client computing device to cause a modification of information displayed on the client computing device for the building.

* * * * *

UNITED STATES PATENT AND TRADEMARK OFFICE
CERTIFICATE OF CORRECTION

| | | |
|---|---|---|
| PATENT NO. | : 11,842,464 B2 | Page 1 of 1 |
| APPLICATION NO. | : 17/482325 | |
| DATED | : December 12, 2023 | |
| INVENTOR(S) | : Naji Khosravan et al. | |

It is certified that error appears in the above-identified patent and that said Letters Patent is hereby corrected as shown below:

In the Claims

Column 40, Line 43, Claim 2:
"orama image and he second enhanced perspective" should read --orama image and the second enhanced perspective--.

Signed and Sealed this
Twenty-third Day of January, 2024

*Katherine Kelly Vidal*

Katherine Kelly Vidal
*Director of the United States Patent and Trademark Office*